US012560861B2

(12) United States Patent
Shimizu et al.

(10) Patent No.: US 12,560,861 B2
(45) **Date of Patent: *Feb. 24, 2026**

(54) METHOD OF MANUFACTURING CHEMICAL FLUID FOR MANUFACTURING ELECTRONIC MATERIAL, PATTERN FORMING METHOD, METHOD OF MANUFACTURING SEMICONDUCTOR DEVICE, CHEMICAL FLUID FOR MANUFACTURING ELECTRONIC MATERIAL, CONTAINER, AND QUALITY INSPECTION METHOD

(71) Applicant: FUJIFILM Corporation, Tokyo (JP)

(72) Inventors: Tetsuya Shimizu, Shizuoka (JP); Tsukasa Yamanaka, Shizuoka (JP); Yukihisa Kawada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/839,432

(22) Filed: Jun. 13, 2022

(65) Prior Publication Data

US 2022/0317563 A1 Oct. 6, 2022

Related U.S. Application Data

(63) Continuation of application No. 16/129,826, filed on Sep. 13, 2018, now Pat. No. 11,429,018, which is a continuation of application No. PCT/JP2017/012440, filed on Mar. 27, 2017.

(30) Foreign Application Priority Data

Mar. 31, 2016 (JP) ................................. 2016-072917
Mar. 8, 2017 (JP) ................................. 2017-044273

(51) Int. Cl.

| | |
|---|---|
| ***G03F 7/32*** | (2006.01) |
| ***G03F 1/68*** | (2012.01) |
| ***G03F 1/86*** | (2012.01) |
| ***G03F 7/00*** | (2006.01) |
| ***G03F 7/039*** | (2006.01) |
| ***G03F 7/11*** | (2006.01) |
| ***G03F 7/16*** | (2006.01) |
| ***G03F 7/38*** | (2006.01) |
| ***G03F 7/40*** | (2006.01) |
| ***H01J 49/10*** | (2006.01) |

(52) U.S. Cl.

CPC .................. *G03F 1/68* (2013.01); *G03F 1/86* (2013.01); *G03F 7/0012* (2013.01); *G03F 7/0397* (2013.01); *G03F 7/11* (2013.01); *G03F 7/16* (2013.01); *G03F 7/32* (2013.01); *G03F 7/325* (2013.01); *G03F 7/38* (2013.01); *G03F 7/40* (2013.01); *H01J 49/105* (2013.01)

(58) Field of Classification Search

CPC ............. G03F 7/325; G03F 7/32; G03F 7/327

See application file for complete search history.

(56) References Cited

U.S. PATENT DOCUMENTS

| | | | | |
|---|---|---|---|---|
| 9,339,766 | B2 | 5/2016 | Takahashi et al. | |
| 9,748,360 | B2 | 8/2017 | Hagiwara et al. | |
| 10,603,696 | B2 | 3/2020 | Ogihara et al. | |
| 11,429,018 | B2 * | 8/2022 | Shimizu .................... | G03F 7/38 |
| 2006/0014098 | A1 | 1/2006 | Hada et al. | |
| 2006/0264528 | A1 | 11/2006 | Wada | |
| 2007/0265590 | A1 | 11/2007 | Sakaguchi | |
| 2009/0286178 | A1 | 11/2009 | Muroi et al. | |
| 2010/0190106 | A1 | 7/2010 | Tsubaki | |
| 2010/0233629 | A1 | 9/2010 | Wada | |
| 2011/0094872 | A1 | 4/2011 | Zhan et al. | |
| 2013/0174868 | A1 | 7/2013 | Muraoka et al. | |
| 2015/0166941 | A1 | 6/2015 | Sassa et al. | |
| 2015/0218068 | A1 | 8/2015 | Singh | |
| 2015/0227049 | A1 | 8/2015 | Yamanaka et al. | |
| 2016/0116839 | A1 | 4/2016 | Meyers et al. | |
| 2016/0314991 | A1 | 10/2016 | Ogihara et al. | |
| 2018/0364571 | A1 | 12/2018 | Nishio et al. | |
| 2019/0025703 | A1 | 1/2019 | Shimizu et al. | |

FOREIGN PATENT DOCUMENTS

| | | |
|---|---|---|
| CN | 1726435 | 1/2006 |
| CN | 102898275 | 1/2013 |
| CN | 103189965 | 7/2013 |
| CN | 105390449 | 3/2016 |
| EP | 1574901 | 9/2005 |
| JP | H10153554 | 6/1998 |
| JP | H11236660 | 8/1999 |

(Continued)

OTHER PUBLICATIONS

"Office Action of China Counterpart Application" with English translation thereof, issued on Jun. 1, 2022, p. 1-p. 18.

"International Search Report (Form PCT/ISA/210) of PCT/JP2017/012440," mailed on Jun. 27, 2017, with English translation thereof, pp. 1-5.

"Written Opinion of the International Searching Authority (Form PCT/ISA/237) of PCT/JP2017/012440," mailed on Jun. 27, 2017, with English translation thereof, pp. 1-14.

Park, Hyeon-Yeol, "Pollution analysis technology and application in the semiconductor manufacturing process," Air purification technology, vol. 19, Dec. 2006, with concise explanation of relevance from English translation of Opinion on Cancellation Application of Korea Counterpart Application, pp. 1-21.

(Continued)

*Primary Examiner* — Daborah Chacko-Davis
(74) *Attorney, Agent, or Firm* — JCIPRNET

(57) ABSTRACT

A container for storing a chemical fluid for manufacturing an electronic material, in which after an inspection solution charges the container and stored at 25° C. for 30 days, a sum of a concentration of particulate metal including an iron atom, a concentration of particulate metal including a copper atom, and a concentration of particulate metal including a zinc atom which are measured by a Single Particle ICP-MASS method in the inspection solution is 100 ppt or less.

12 Claims, 1 Drawing Sheet

(56) References Cited

FOREIGN PATENT DOCUMENTS

| | | |
|---|---|---|
| JP | 2000005546 | 1/2000 |
| JP | 2002005799 | 1/2002 |
| JP | 2003251118 | 9/2003 |
| JP | 2004195427 | 7/2004 |
| JP | 2005266766 | 9/2005 |
| JP | 2006257078 | 9/2006 |
| JP | 2006330098 | 12/2006 |
| JP | 2007325915 | 12/2007 |
| JP | 2010039146 | 2/2010 |
| JP | 2010164958 | 7/2010 |
| JP | 2012062300 | 3/2012 |
| JP | 2013023441 | 2/2013 |
| JP | 2013218308 | 10/2013 |
| JP | 2013235957 | 11/2013 |
| JP | 5611276 | 10/2014 |
| JP | 2015007807 | 1/2015 |
| JP | 2015064494 | 4/2015 |
| JP | 2016073922 | 5/2016 |
| JP | 2016206500 | 12/2016 |
| KR | 20130105499 | 9/2013 |
| KR | 20130139945 | 12/2013 |
| KR | 20150063128 | 6/2015 |
| KR | 20180126556 | 11/2018 |
| TW | 200720858 | 6/2007 |
| TW | 201307270 | 2/2013 |
| TW | 201412976 | 4/2014 |
| TW | 201423289 | 6/2014 |
| TW | 201602172 | 1/2016 |
| WO | 2008153110 | 12/2008 |
| WO | 2012043496 | 4/2012 |
| WO | 2015122920 | 8/2015 |
| WO | 2016024541 | 2/2016 |

OTHER PUBLICATIONS

Perkinelmer, Inc., "Application Note: Determination of Impurities in Semiconductor-Grade TMAH with the NexION 300S/350S ICP-MS," 2014, pp. 1-4.

Chady Stephan et al., "Analysis of Iron Nanoparticles in Organic Solvents Used in the Semiconductor Industry Using Single Particle ICP-MS in Reaction Mode" , PerkinElmer, 2015, pp. 1-5.

Sungyun Lee et al., "Nanoparticle Size Detection Limits by Single Particle ICP-MS for 40 Elements", Environmental Science & Technology, vol. 48, Aug. 2014, pp. 10291-10300.

Kenneth Ong, "Determination of Impurities in Organic Solvents used in the Semiconductor Industry with the NexION 300S/350S ICP-MS," Application Note ICP Mass Spectrometry, 2012-2014, pp. 1-5, Available at: https://resources.perkinelmer.com/lab-solutions/resources/docs/APP_010279_01NexION300S-Impurities-SemiconIPAPGMEA.pdf.

"Notice of Decision of Japan Counterpart Application" with English translation thereof, issued on Oct. 11, 2022, p. 1-p. 76.

Office Action of Japan Counterpart Application, with English translation thereof, issued on Sep. 10, 2019, pp. 1-8.

"Office Action of Korea Counterpart Application," with English translation thereof, issued on Nov. 20, 2019, p. 1-p. 14.

"Office Action of Counterpart U.S. Appl. No. 16/129,826", issued on Apr. 2, 2020, pp. 1-17.

"Office Action of Taiwan Counterpart Application", issued on Jul. 7, 2020, with English translation thereof, p. 1-p. 23.

"Office Action of Counterpart U.S. Appl. No. 16/129,826", issued on Sep. 25, 2020, pp. 1-11.

"Office Action of China Counterpart Application," issued on Jan. 5, 2021, with English translation thereof, p. 1-p. 19.

"Opinions of a third party of Taiwan Counterpart Application(No. 106110683.)", issued on Nov. 23, 2020, with English translation thereof, p. 1-p. 76.

"Patent Cancellation Application of Korea Counterpart Application (Patent No. 2116252)", issued on Dec. 4, 2020, with English translation thereof, p. 1-p. 85.

Office Action of Korea Counterpart Application, with English translation thereof, issued on Apr. 1, 2021, pp. 1-28.

"Notice of Reason for Cancellation of Japan Counterpart Application", issued on Jun. 30, 2021, with English translation thereof, pp. 1-21.

"Written Opposition to Grant of Patent (with Notice of Sending of Opposition) of Japan Counterpart Application", issued on Feb. 10, 2021, with English translation thereof, pp. 1-99.

"Office Action of Counterpart U.S. Appl. No. 16/129,826", issued on Jul. 9, 2021, pp. 1-13.

"Opinion on Cancellation Application of Korea Counterpart Application," with English translation, issued on Sep. 9, 2019, p. 1-p. 81.

Office Action of China Counterpart Application, with English translation thereof, issued on Sep. 18, 2021, pp. 1-21.

Office Action of Taiwan Counterpart Application, with English translation thereof, issued on Nov. 12, 2021, pp. 1-35.

Office Action of Korean Counterpart Application, with English translation thereof, issued on Dec. 29, 2021, pp. 1-67.

"Office Action of Japan Counterpart Application" with English translation thereof, issued on Apr. 1, 2022, p. 1-p. 89.

"Office Action of Taiwan Counterpart Application", issued on Sep. 19, 2022, with English translation thereof, p. 1-p. 18.

"Notice of Dispatch of Written Argument of Japan Counterpart Application", issued on Apr. 7, 2023, with English translation thereof, p. 1-p. 10.

"Decision of Opposition of Japan Counterpart Application", issued on Apr. 7, 2023, with English translation thereof, p. 1-p. 207.

"Office Action of Taiwan Counterpart Application", issued on Jul. 16, 2024, with English translation thereof, pp. 1-14.

"Office Action of Taiwan Counterpart Application", issued on Jul. 16, 2024, with partial English translation thereof, p. 1-p. 11.

"Office Action of Taiwan Counterpart Application", issued on Mar. 28, 2025, with English translation thereof, pp. 1-39.

"Reexamination Notification of China Counterpart Application", issued on Jul. 7, 2025, with English translation thereof, p. 1-p. 23.

"Reexamination Decision of China Counterpart Application", issued on Oct. 30, 2025, with English translation thereof, pp. 1-31.

* cited by examiner

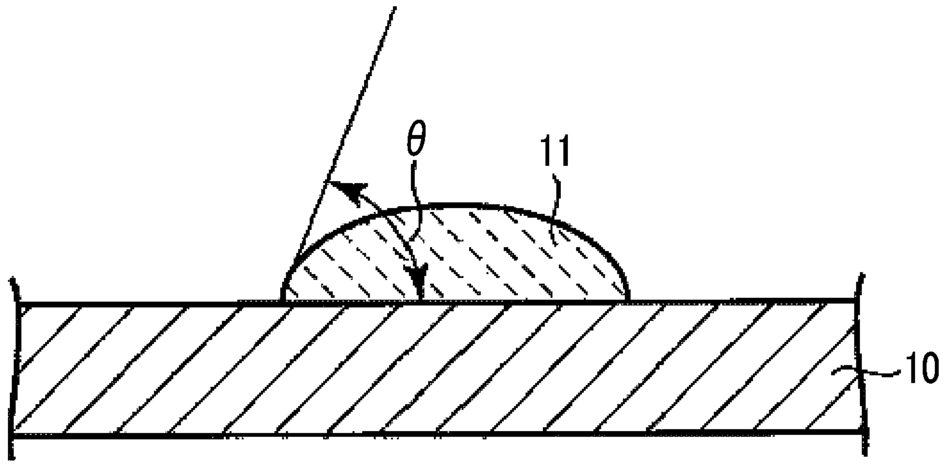
θ
11
10

METHOD OF MANUFACTURING CHEMICAL FLUID FOR MANUFACTURING ELECTRONIC MATERIAL, PATTERN FORMING METHOD, METHOD OF MANUFACTURING SEMICONDUCTOR DEVICE, CHEMICAL FLUID FOR MANUFACTURING ELECTRONIC MATERIAL, CONTAINER, AND QUALITY INSPECTION METHOD

CROSS-REFERENCE TO RELATED APPLICATIONS

This application is a Continuation of U.S. application Ser. No. 16/129,826 filed on Sep. 13, 2018, which is a Continuation of PCT International Application No. PCT/JP2017/12440, filed on Mar. 27, 2017, which claims priority under 35 U.S.C. § 119(a) to Japanese Patent Application No. 2016-072917, filed on Mar. 31, 2016 and Japanese Patent Application No. 2017-044273, filed on Mar. 8, 2017. Each of the above application(s) is hereby expressly incorporated by reference, in its entirety, into the present application.

BACKGROUND OF THE INVENTION

1. Field of the Invention

The present invention relates to a method of manufacturing a chemical fluid for manufacturing an electronic material, a pattern forming method, a method of manufacturing a semiconductor device, a chemical fluid for manufacturing an electronic material, a container, and a quality inspection method.

2. Description of the Related Art

In the related art, various configurations are suggested as a positive tone pattern forming method using an alkali developer and a positive resist composition used therein (for example, refer to JP2006-257078A, JP2005-266766A, and JP2006-330098A). In addition to this, recently, a negative tone pattern forming method using an organic developer and a negative resist composition used therein of which a major use is to form a fine contact hole or a trench pattern that may not be achieved in a positive resist composition are developed (for example, refer to JP2007-325915A, WO2008-153110A, JP2010-039146A, JP2010-164958A).

The resist composition or the developer used in the positive or negative tone pattern forming method is generally used after fine particles in the resist composition or the developer are removed by a filter (for example, JP2000-005546A and JP2004-195427A).

SUMMARY OF THE INVENTION

In the manufacturing of the semiconductor devices, the need for refinement (for example, nodes of 30 nm or lower) increases.

It is known that contamination of unintentional metal impurities into a chemical fluid for manufacturing an electronic material used for manufacturing a semiconductor device causes performance deterioration of a semiconductor device, and thus in the chemical fluid for manufacturing the electronic material having a node of up to about 20 nm, control of a metal impurity concentration of about several tens of ppb is required.

In the field of semiconductor materials, inventions prescribing metal concentrations in various materials are known, and as a method for measuring the metal concentration, a standard inductively coupled plasma mass spectrometry (ICP-MASS method) is widely used.

A metal impurity concentration of several tens of ppb can be understood as a simple summation of contaminations respectively from manufacturing raw materials and manufacturing process to be controlled. By setting the metal impurity concentration to about several tens of ppb, the required quality is satisfied in many cases.

However, in recent years, the need for further refinement of semiconductor devices (for example, node of 10 nm or lower) rapidly increases.

It becomes difficult to simply apply the analysis method (typically the ICP-MASS method) in the related art which is used for the control of the metal impurity concentration of about several tens of ppb to the control of the metal impurity concentration at a ppt level and a ppq level such that the metal impurity concentration is reduced in response to the requirement for refinement of the node of 10 nm or lower, because the detection level required for the metal impurity concentration is close to or greater than the detection limit of the metal impurity by the ICP-MASS method.

According to the study of the present inventors, even in a case of a chemical fluid for manufacturing an electronic material in which the metal impurity concentration is reduced to the ppt level, it has been found that the required quality is not necessarily satisfied with respect to a fine pattern having a node of 10 nm or lower. In other words, in the manufacturing of the fine pattern having a node of 10 nm or lower, the correlation between the metal impurity concentration of the chemical fluid for manufacturing an electronic material and the obtained quality of the chemical fluid for manufacturing an electronic material tends to decrease. Accordingly, it has been found that it becomes difficult to efficiently manufacture a high-quality chemical fluid for manufacturing an electronic material that can withstand the formation of fine patterns having a node of 10 nm or lower by relying on the analysis method in the related art.

The present invention has been conceived in view of the circumstances, and objects thereof are to provide a method of manufacturing a chemical fluid for manufacturing an electronic material that can highly efficiently manufacture a high-quality chemical fluid for manufacturing an electronic material even in the forming of an ultrafine pattern (for example, having a node of 10 nm or lower), a pattern forming method and a method of manufacturing a semiconductor device using the same, a high-quality chemical fluid for manufacturing an electronic material even in the forming of the ultrafine pattern and a container, and a quality inspection method particularly in the forming of the ultrafine pattern.

The present inventors diligently conducted research to find that there is a correlation between the concentration of particulate metal including a metal atom (particularly, an iron atom, a copper atom, and a zinc atom) measured by a single particle inductively coupled plasma mass spectrometry (SP ICP-MASS method) in the chemical fluid for manufacturing an electronic material and the quality of the chemical fluid for manufacturing an electronic material obtained in the forming of the ultrafine pattern (for example, having a node of 10 nm or lower) and find that a high-quality chemical fluid for manufacturing an electronic material can be obtained in the forming of the ultrafine pattern by targeting the particulate metal including the metal atom in the chemical fluid for manufacturing an electronic material and reducing the concentration thereof.

In view of the above findings, the present inventors have found that a method of reducing the particulate metal can be appropriately selected according to the concentration of the particulate metal, and the chemical fluid for manufacturing an electronic material can be efficiently manufactured, and complete the present invention.

A method for determining whether an element in a liquid sample is present in a dissolved manner or without being dissolved using the ICP-MASS method is disclosed (see JP1998-153554A (JP-H10-153554A)). However, only the possibility of form determination is disclosed, an actual measurement result is not provided, and the measurement application range is hardly disclosed. The measurement of the metal concentration at the ppt level with respect to the chemical fluid for manufacturing a semiconductor using the present measuring method is not disclosed or suggested.

A method of applying the method of quantitating nanoparticles in a liquid to which ICP-MASS method is applied to a method of evaluating removal particle performance with a filter is disclosed (see JP5611276B). However, the method is an invention having an object of improving accuracy of the measurement of a gold nanoparticle, and the measurement of the metal concentration at a ppt level with respect to the chemical fluid for manufacturing a semiconductor is not disclosed or suggested.

The present invention has the following configurations, and the above objects of the present invention are achieved by the configurations.

[1] A method of manufacturing a chemical fluid for manufacturing an electronic material, comprising: selecting a method of reducing particulate metal in the chemical fluid according to a concentration of particulate metal including an iron atom, a concentration of particulate metal including a copper atom, and a concentration of particulate metal including a zinc atom which are measured by a Single Particle ICP-MASS method in the chemical fluid and reducing at least one of the concentration of particulate metal including an iron atom, the concentration of particulate metal including a copper atom, or the concentration of particulate metal including a zinc atom by using the selected reducing method.

[2] The method of manufacturing a chemical fluid for manufacturing an electronic material according to [1], in which a sum of the concentration of particulate metal including an iron atom, the concentration of particulate metal including a copper atom, and the concentration of particulate metal including a zinc atom in the chemical fluid is caused to be 100 ppt or less by using the reducing method.

[3] The method of manufacturing a chemical fluid for manufacturing an electronic material according to [1] or [2], in which the reducing method is a method of filtrating the chemical fluid by using one or more selected from the group consisting of a polyethylene filter, a polypropylene filter, a fluororesin filter, a polyamide resin filter, and a polysulfone resin filter.

[4] The method of manufacturing a chemical fluid for manufacturing an electronic material according to [3], in which the reducing method is a method of filtrating the chemical fluid by using a fluororesin filter or a polyamide resin filter.

[5] The method of manufacturing a chemical fluid for manufacturing an electronic material according to [3], in which the reducing method is a method of filtrating the chemical fluid by using one or more selected from the group consisting of a polyethylene filter, a polypropylene filter, a fluororesin filter, a polyamide resin filter, and a polysulfone resin filter and further filtrating the filtrated chemical fluid by using one or more filters which are selected from the group but are different from the selected one or more filters.

[6] The method of manufacturing a chemical fluid for manufacturing an electronic material according to any one of [1] to [5], in which the chemical fluid for manufacturing an electronic material is a chemical fluid for manufacturing a semiconductor device.

[7] The method of manufacturing a chemical fluid for manufacturing an electronic material according to any one of [1] to [6], in which the chemical fluid for manufacturing an electronic material is an actinic ray-sensitive or radiation-sensitive resin composition containing a solvent, a solvent for an actinic ray-sensitive or radiation-sensitive resin composition, a developer, a rinsing solution, a pre-wet liquid, a washing solution, an etching solution, a peeling solution, or a top coat solvent.

[8] A pattern forming method comprising: (1) forming an actinic ray-sensitive or radiation-sensitive film with an actinic ray-sensitive or radiation-sensitive resin composition containing a solvent;

(2) exposing the actinic ray-sensitive or radiation-sensitive film; and (4) developing the exposed actinic ray-sensitive or radiation-sensitive film by using a developer, in which at least one of the actinic ray-sensitive or radiation-sensitive resin composition of (1) or the developer of (4) is a chemical fluid for manufacturing an electronic material obtained by the method of manufacturing a chemical fluid for manufacturing an electronic material according to [7].

[9] A pattern forming method comprising: (1) forming an actinic ray-sensitive or radiation-sensitive film with an actinic ray-sensitive or radiation-sensitive resin composition containing a solvent;

(2) exposing the actinic ray-sensitive or radiation-sensitive film;

(4) developing the exposed actinic ray-sensitive or radiation-sensitive film by using a developer; and (5) washing the developed actinic ray-sensitive or radiation-sensitive film by using a rinsing solution, in which at least one of the actinic ray-sensitive or radiation-sensitive resin composition of (1), the developer of (4), or the rinsing solution of (5) is a chemical fluid for manufacturing an electronic material obtained by the method of manufacturing a chemical fluid for manufacturing an electronic material according to [7].

[10] A method of manufacturing a semiconductor device comprising: the pattern forming method according to [8] or [9].

[11] A chemical fluid for manufacturing an electronic material, in which a sum of a concentration of particulate metal including an iron atom, a concentration of particulate metal including a copper atom, and a concentration of particulate metal including a zinc atom which are measured by a Single Particle ICP-MASS method is 100 ppt or less.

[12] The chemical fluid for manufacturing an electronic material according to [11], in which, in a case where the sum of the concentration of particulate metal including an iron atom, the concentration of particulate metal including a copper atom, and the concentration of particulate metal including a zinc atom which are measured by a Single Particle ICP-MASS method is set as ΣMp, and a sum of a concentration of ionic metal including an iron atom, a concentration of ionic metal including a copper atom, and a concentration of ionic metal including a zinc atom which are measured by a Single Particle ICP-MASS method and an ICP-MASS method is set as ΣMi, ΣMp and ΣMi satisfies the following expression.

$$\Sigma Mp \le \Sigma Mi \le 100 \text{ ppt}$$

[13] A container for storing a chemical fluid for manufacturing an electronic material, in which after an inspection solution charges the container and stored at 25° C. for 30 days, a sum of a concentration of particulate metal including an iron atom, a concentration of particulate metal including a copper atom, and a concentration of particulate metal including a zinc atom which are measured by a Single Particle ICP-MASS method in the inspection solution is 100 ppt or less.

[14] The container according to [13], in which the inspection solution is pure water, the chemical fluid for manufacturing an electronic material to be stored in the container, or a mixed solution obtained by mixing a portion or a plurality of raw materials constituting the chemical fluid for manufacturing an electronic material to be stored in the container.

[15] The chemical fluid for manufacturing an electronic material according to [11] or [12], which is stored in the container according to [13] or [14].

[16] A quality inspection method, comprising: inspecting a quality of a chemical fluid for manufacturing an electronic material, a member for manufacturing an electronic material, or an electronic material manufacturing device based on a concentration of particulate metal including a metal atom which is measured by a Single Particle ICP-MASS method in the chemical fluid for manufacturing an electronic material or an inspection solution that is in contact with the member for manufacturing an electronic material or the electronic material manufacturing device.

According to the present invention, it is possible to provide a method of manufacturing a chemical fluid for manufacturing an electronic material that can highly efficiently manufacture a high-quality chemical fluid for manufacturing an electronic material even in the forming of an ultrafine pattern (for example, having a node of 10 nm or lower), a pattern forming method and a method of manufacturing a semiconductor device using the same, a high-quality chemical fluid for manufacturing an electronic material even in the forming of the ultrafine pattern and a container, and a quality inspection method particularly in the forming of the ultrafine pattern.

BRIEF DESCRIPTION OF THE DRAWING

FIG. 1 is a conceptual view for describing a contact angle.

DESCRIPTION OF THE PREFERRED EMBODIMENTS

Hereinafter, a suitable aspect of the present invention is specifically described.

With respect to an expression of a group and an atomic group in the present specification, in a case where substitution or unsubstitution is not indicated, both of a group not having a substituent and a group having a substituent are included. For example, an "alkyl group" that does not indicate substitution or unsubstitution includes not only an alkyl group (unsubstituted alkyl group) not having a substituent but also an alkyl group (substituted alkyl group) having a substituent.

An "actinic ray" or a "radiation" in the present specification, for example, means a bright line spectrum of a mercury lamp, or a particle beam such as a far ultraviolet ray represented by an excimer laser, an extreme ultraviolet ray (EUV ray), an X-ray, an electron beam (EB), and an ion beam. "Light" in the present specification means an actinic ray or a radiation.

Unless described otherwise, the "exposure" in the present specification include not only exposure to a bright line spectrum of a mercury lamp, a far ultraviolet ray represented by an excimer laser, an extreme ultraviolet ray (EUV ray), and an X ray but also drawing by a particle ray such as an electron beam and an ion beam.

In the present specification, "(meth)acrylate" means "at least one of acrylate or methacrylate". "(Meth)acrylic acid" means "at least one of acrylic acid or methacrylic acid".

In the present specification, the weight-average molecular weight (Mw) and a dispersion degree (molecular weight distribution) are standard polystyrene equivalent values obtained from gel permeation chromatography (GPC) under the following conditions.

Column type: TSK gel Multipore HXL-M (manufactured by Tosoh Corporation), 7.8 mmID×30.0 cm Development solvent: tetrahydrofuran (THF)

Column temperature: 40° C.

Flow rate: 1 ml/min

Sample injection volume: 10 μl

Name of device: HLC-8120 (manufactured by Tosoh Corporation)

In the present specification, the numerical range expressed by using "to" means a range including numerical values described before and after "to" as a lower limit value and an upper limit value.

In the present specification, "ppt" and "ppb" mean "mass ppt" and "mass ppb", respectively.

The method of manufacturing a chemical fluid for manufacturing an electronic material of the present invention is a method of manufacturing a chemical fluid for manufacturing an electronic material by selecting a method of reducing particulate metal in the chemical fluid depending on the concentration of particulate metal including an iron atom, the concentration of particulate metal including a copper atom, and the concentration of particulate metal including a zinc atom which are measured by a Single Particle ICP-MASS method in the chemical fluid and reducing at least one of the concentration of particulate metal including an iron atom, the concentration of particulate metal including a copper atom, or the concentration of particulate metal including a zinc atom by using the selected reducing method.

As described above, since the method of reducing particulate metal can be appropriately selected depending on the measured concentration of the particulate metal, it is possible to highly efficiently manufacture a high-quality chemical fluid for manufacturing an electronic material in the forming of the ultrafine pattern (for example, having a node of 10 nm or lower).

In the present specification, the composition before performing the treatment of reducing the particulate metal may be simply referred to as a chemical fluid. A composition subjected to the reducing treatment depending on the concentration of the particulate metal measured according to the Single Particle ICP-MASS method in this chemical fluid may be referred to as a chemical fluid for manufacturing an electronic material.

Here, a device used in the Single Particle ICP-MASS method (single particle inductively coupled plasma mass spectrometry) (hereinafter, simply referred to as "SP ICP-MS") is the same as the device used in the general ICP- MASS method (inductively coupled plasma mass spectrometry) (hereinafter simply referred to as "ICP-MS"), and only data analysis differs. Data analysis as SP ICP-MS can be performed by commercially available software.

In ICP-MS, the concentration of a component including a metal atom as a measurement target is measured regardless of the presence form thereof, while in SP ICP-MS, the concentration of particulate metal including a metal atom as a measurement target is measured.

The presence form of the component including a metal atom is generally a form of particulate metal or a form of ionic metal. Accordingly, from the concentration (Mt) of a component including a metal atom measured by using ICP-MS and the concentration (Mp) of particulate metal including a metal atom measured by using SP ICP-MS, based on the following expression, the concentration (Mi) of ionic metal including a metal atom can be obtained.

$$Mi=Mt-Mp$$

The method of measuring Mt and Mp is not limited, and for example, Mt and Mp can be respectively measured by ICP-MS and SP ICP-MS employing a device below and conditions below.

Device: NexION350S manufactured by Perkin Elmer, Inc.

Standard substance: 10,000 particles/ml of a pure water dispersion liquid of gold particles having a median diameter of 50 nm Time Resolution: 50 microseconds Data analysis software (for ICP-MS): Syngistix for ICP-MS software Data Analysis Software (for SP ICP-MS): Syngistix Nano Application Module only for Nanoparticle Analysis "SP-ICP-MS"

The concentration of particulate metal including an iron atom, the concentration of particulate metal including a copper atom, and the concentration of particulate metal including a zinc atom in the chemical fluid (chemical fluid for manufacturing an electronic material) can be measured by SP ICP-MS above, respectively.

Suitable examples of the method of reducing of particulate metal in the chemical fluid include distillation of the chemical fluid.

An inside portion of a distillation device used in the distillation is preferably lined. An inside portion of a condenser is also preferably lined.

In the case of performing a liquid feeding step to at least one of before or after the distillation step, it is preferable that a portion (for example, an inner wall of the pipe or an inside portion of a pump) in contact with the chemical fluid in the liquid feeding step is lined as much as possible. Particularly, in the step of feeding a distillate obtained in the distillation step, it is preferable that an inner wall of a flow path used for liquid feeding is lined.

The lining in the present specification is rust preventing and/or metal elution preventing treatments The lining is applied to an inorganic material such as metals, an organic material such as a polymer, an inorganic-organic hybrid material, and the like.

Examples of the metals subjected to rust preventing and/or metal elution preventing treatments include carbon steel, alloy steel, nickel-chrome steel, nickel-chrome-molybdenum steel, chrome steel, chrome-molybdenum steel, and manganese steel.

It is preferable to apply a coating technique, as the rust preventing and/or metal elution preventing treatments.

Examples of the coating technique include metal coating (various kinds of plating, electrolytic polishing, or the like), inorganic coating (various chemical conversion, glass, concrete, ceramics, and the like), and organic coating (rust preventing oil, paint, rubber, and plastics).

As a preferable coating technique, surface treatments with rust preventing oil, a rust preventing agent, a corrosion inhibitor, a chelate compound, strippable plastic, and a lining agent are included.

Among them, lining with various chromic acid salts, a nitric acid salt, a silicic acid salt, a phosphoric acid salt, carboxylic acids such as oleic acid, dimer acid, and naphthenic acid, a corrosion inhibitor such as carboxylic acid metal soap, a sulfonic acid salt, an amine salt, and esters (glycerin ester and phosphate ester of higher fatty acid), a chelate compound such as ethylenediamine tetraacetic acid, gluconic acid, nitrilotriacetic acid, hydroxyethyl ethylenediamine triacetic acid, and diethylenetriaminepentaacetic acid, and a fluorine-containing resin is preferable. A phosphoric acid salt treatment and lining with a fluorine-containing resin are particularly preferable.

Compared with a direct coating treatment, though rust is not directly prevented, the "pre-treatment" before the rust preventing treatment is preferably employed as a treatment method for extending the rust prevention period by a coating treatment.

As a specific example of the pre-treatment, treatments for removing various corrosion factors such as chloride or sulfate which exist on metal surfaces by washing or polishing are preferably included.

Examples of the fluorine-containing resin used for the lining include a tetrafluoroethylene resin (PTFE), an ethylene tetrafluoride/perfluoroalkyl vinyl ether copolymer (PFA), an ethylene tetrafluoride-hexafluoropropylene copolymer resin (FEP), an ethylene tetrafluoride-ethylene copolymer resin (ETFE), a trifluorochloroethylene-ethylene copolymer resin (ECTFE), a vinylidene fluoride resin (PVDF), a trifluorochloroethylene copolymer resin (PCTFE), and a fluorinated vinyl resin (PVF).

Particularly preferable examples of the fluorine-containing resin include a tetrafluoroethylene resin, an ethylene tetrafluoride/perfluoroalkyl vinyl ether copolymer, and an ethylene tetrafluoride-hexafluoropropylene copolymer resin.

As the distillation step, well-known methods widely used in the chemical industry can be applied. In a case where the chemical fluid for manufacturing an electronic material is butyl acetate, examples thereof include methods disclosed in JP4259815B and JP4059685B.

Suitable examples of the method of reducing particulate metal in the chemical fluid include filtration using a filter. As the filter pore diameter, a filter having a pore size of 20 nm or less is preferably used. In view of improving the removal efficiency of impurities, the pore size is preferably 10 nm or less, more preferably 5 nm or less, and even more preferably 3 nm or less.

Suitable examples of the filter include one or more selected from the group consisting of a polyethylene filter, a polypropylene filter, a fluororesin filter, a polyamide resin filter, and a polysulfone resin filter.

The filter is preferably a fluororesin filter or a polyamide resin filter. In view of excellent metal ion removal efficiency, it is preferable to use a polyamide resin filter.

The filter may be a composite material obtained by combining these resin filters and ion exchange media. The filter may be further combined with a material that adsorbs a metal ion. Though a material that adsorbs a metal ion is not particularly limited, it is preferable that the surface of one or more resins selected from the group consisting of polyethylene, polypropylene, a fluorine resin, a polyamide resin, and a polysulfone resin, cellulose, and diatomaceous earth is modified with an acid group.

As the filter, the ion exchange media, and the material that adsorbs a metal ion, those which are washed in advance with an organic solvent may be used.

In the filtration step using a filter, a plurality of types of filters may be connected in series or in parallel. In a case where the plurality of types of filters are used, filters with different pore diameters and/or different materials may be combined. In addition, a variety of materials may be used in filtration a plurality of times, and the step of the filtration the plurality of times may be a circulating filtration step. It is preferable to appropriately adjust a flow-through flow rate of the filter and the pressures on an upstream side and a downstream side of the filter to be optimum filtration conditions.

In a case where a plurality of filters are used in combination, it is preferable that a filter pore diameter of a filter used in a subsequent step is smaller than a pore diameter of a filter used in a previous step.

The reducing method in a case of positively reducing the concentration of particulate metal including an iron atom is preferably a filtration method using one or more selected from the group consisting of a polyethylene filter, a polypropylene filter, a fluororesin filter, a polyamide resin filter, and a polysulfone resin filter, more preferably a filtration method using a fluororesin filter or a polyamide resin filter, and particularly preferably a filtration method using a polyamide resin filter.

The reducing method in a case of positively reducing a concentration of particulate metal including a copper atom is preferably a filtration method using one or more selected from the group consisting of a polyethylene filter, a polypropylene filter, a fluororesin filter, a polyamide resin filter, and a polysulfone resin filter, more preferably a filtration method using a fluororesin filter or a polyamide resin filter, and particularly preferably a filtration method using a polyamide resin filter.

The reducing method in a case of positively reducing a concentration of particulate metal including a zinc atom is preferably a filtration method using one or more selected from the group consisting of a polyethylene filter, a polypropylene filter, a fluororesin filter, a polyamide resin filter, and a polysulfone resin filter, more preferably a filtration method using a fluororesin filter or a polyamide resin filter, and particularly preferably a filtration method using a polyamide resin filter.

As the polyethylene filter and the polypropylene filter, well-known filters can be employed.

Examples of the fluororesin filter include a perfluoro resin filter such as a tetrafluoroethylene resin (PTFE), an ethylene tetrafluoride/perfluoroalkyl vinyl ether copolymer (PFA), an ethylene tetrafluoride-hexafluoropropylene copolymer resin (FEP), an ethylene tetrafluoride-ethylene copolymer resin (ETFE), a trifluorochloroethylene-ethylene copolymer resin (ECTFE), a vinylidene fluoride resin (PVDF), a trifluorochloroethylene copolymer resin (PCTFE), and a fluorinated vinyl resin (PVF).

Examples of the polyamide resin filter include a nylon filter.

Examples of the polysulfone resin filter include a polysulfone filter, and a polyethersulfone filter.

It is preferable that, the reducing method is a method (hereinafter simply referred to as a "multistage filtration method") in which the chemical fluid is filtrated by using one or more filters selected from the group consisting of a polyethylene filter, a polypropylene filter, a fluororesin filter, a polyamide resin filter, and a polysulfone resin filter, and the filtrated chemical fluid is further filtrated by using one or more filters which are selected from the above group but are different from the above selected one or more filters.

It is preferable that the reducing method is a method in which the chemical fluid is filtrated by using one or more filters selected from the group consisting of a polyethylene filter, a polypropylene filter, and a fluororesin filter, and the filtrated chemical fluid is further filtrated by using one or more filters which are selected from the above group but are different from the selected one or more filters.

Here, the expression "different" in the expression "one or more filters which are different from the selected one or more filters" typically means at least one of a material or a pore size of a filter is different.

Particularly, in a case where a filter selected in one filtration step is a combination of two or more kinds of filters, the expression "one or more filters which are selected from the above group but are different from the selected one or more filters" means a filter that is not completely identical to the previously selected "one or more filters" in a combination of types of the filters. For example, in a case where a filter in a first filtration step is a filter obtained by combining a polyethylene filter and a polypropylene filter and a filter in a second filtration step is a polyethylene filter, the filter in the second filtration step corresponds to "one or more filters which are selected from the above group but are different from the selected one or more filters".

In contrast, for example, even in a case where a filter in a first filtration step is a polyethylene filter and a filter in a second filtration step is a filter obtained by combining a polyethylene filter and a polypropylene filter, the filter in the second filtration step corresponds to "one or more filters which are selected from the above group but are different from the selected one or more filters".

A preferable combination of filters is not particularly limited, but examples thereof include a combination of a polyamide resin filter and a filter using another material, for example, a polyethylene filter.

The reducing method preferably includes a combination of a method of distilling a chemical fluid and a method of filtrating a chemical fluid with a filter.

Examples of the reducing method include a method of bringing a chemical fluid and an adsorbent into contact with each other.

As the adsorbent, well-known adsorbents may be used, and for example, an inorganic adsorbent such as silica gel and zeolite and an organic adsorbent such as activated carbon may be used.

In addition, a moisture adjusting step such as a dehydration step may be provided.

The reducing method may be a combination of a method of filtrating a chemical fluid with a filter and a method of bringing a chemical fluid and an adsorbent into contact with each other. Examples of the reducing method include a method of bringing a chemical fluid and an ion exchange resin into contact with each other.

In the method of manufacturing a chemical fluid for manufacturing an electronic material of the present invention, a sum of the concentration of particulate metal including an iron atom, the concentration of particulate metal including a copper atom, and the concentration of particulate metal including a zinc atom in the chemical fluid which are measured by a single particle ICP-MASS method by using the above reducing method is preferably 100 ppt or less, more preferably 50 ppt or less, and even more preferably 10 ppt or less. Accordingly, also in the forming of the ultrafine pattern (for example, having a node of 10 nm or lower), a high-quality chemical fluid for manufacturing an electronic material can be manufactured.

Particularly, suitable examples of the method of greatly reducing a sum of the concentration of particulate metal including an iron atom, the concentration of particulate metal including a copper atom, and the concentration of particulate metal including a zinc atom include the multistage filtration method described above. In the multistage filtration method, as described above, it is most preferable that a filter before using is sufficiently washed.

As described above, the present inventors have found that the correlation between the concentration of the particulate metal including a metal atom (particularly, an iron atom, a copper atom, and a zinc atom) measured by SP ICP-MS and the quality of the chemical fluid for manufacturing an electronic material required for forming a ultrafine pattern (for example, having a node of 10 nm or lower) and also have found that the above multistage filtration method is powerful in reducing the sum of the concentration of the particulate metal including an iron atom, the concentration of the particulate metal including a copper atom, and the concentration of the particulate metal including a zinc atom. Accordingly, since the above knowledge relating to the powerful method can be immediately applied to the method of manufacturing the chemical fluid for manufacturing an electronic material, in the forming of the ultrafine pattern (for example, having a node of 10 nm or lower), a high-quality chemical fluid for manufacturing an electronic material can be manufactured without performing various impurity reducing methods. That is, the method of manufacturing the chemical fluid for manufacturing an electronic material of the present invention is to highly efficiently manufacture the high-quality chemical fluid for manufacturing an electronic material.

The present invention relates to the chemical fluid for manufacturing an electronic material in which the sum of the concentration of particulate metal including an iron atom, the concentration of particulate metal including a copper atom, and the concentration of particulate metal including a zinc atom which are measured by the Single Particle ICP-MASS method is 100 ppt or less.

In the chemical fluid for manufacturing an electronic material of the present invention, the sum of the concentration of the particulate metal is preferably 50 ppt or less and more preferably 10 ppt or less.

In the method of the manufacturing the chemical fluid for manufacturing an electronic material of the present invention and the chemical fluid for manufacturing an electronic material of the present invention, it is preferable that the sum of the concentrations of the particulate metal is as less as possible, but the sum is typically 0.01 ppt or more.

In the chemical fluid for manufacturing an electronic material, in a case where the sum of the concentration of particulate metal including an iron atom, the concentration of particulate metal including a copper atom, and the concentration of particulate metal including a zinc atom which are measured by the Single Particle ICP-MASS method is set as ΣMp and the sum of the concentration of ionic metal including an iron atom, the concentration of ionic metal including a copper atom, and the concentration of ionic metal including a zinc atom which are measured by the Single Particle ICP-MASS method and the ICP-MASS method is set as ΣMi, it is preferable that ΣMp and ΣMi satisfy the following expression.

$$\Sigma Mp \leq \Sigma Mi \leq 100 \text{ ppt}$$

Here, as described above, the concentration ($Mi_{Fe}$) of ionic metal including an iron atom, the concentration ($Mi_{cu}$) of ionic metal including a copper atom and the concentration ($Mi_{zn}$) of ionic metal including a zinc atom can be obtained by respectively subtracting the concentration ($Mp_{Fe}$) of particulate metal including an iron atom, the concentration ($Mp_{cu}$) of particulate metal including a copper atom, and the concentration ($Mp_{zn}$) of particulate metal including a zinc atom which are measured by using SP ICP-MS from the concentration ($Mt_{Fe}$) of a component including an iron atom, the concentration ($Mt_{cu}$) of a component including a copper atom, and the concentration ($Mt_{zn}$) of a component including a zinc atom which are measured by using ICP-MS.

In order to highly efficiently obtain the chemical fluid for manufacturing an electronic material in which the sum of the concentration of particulate metal including an iron atom, the concentration of particulate metal including a copper atom, and the concentration of particulate metal including a zinc atom is 100 ppt or less, it is preferable to select a chemical fluid of which a metal content is less, as a chemical fluid to be a raw material in the method of manufacturing the chemical fluid for manufacturing an electronic material of the present invention. Examples of the method of obtaining such a chemical fluid include a method such as performing distillation under a condition in which contamination is suppressed as much as possible by lining the inside of a device with TEFLON (registered trademark).

In order to highly efficiently obtain the chemical fluid for manufacturing an electronic material in which the sum of the concentrations of the particulate metal is 100 ppt or less, in this manufacturing step, it is preferable to prevent contamination of particulate metal including a metal atom to the chemical fluid for manufacturing an electronic material.

In this purpose, the present invention relates to a quality inspection method inspecting the quality of the chemical fluid for manufacturing an electronic material, a member for manufacturing an electronic material, or an electronic material manufacturing device in the chemical fluid for manufacturing an electronic material or in an inspection solution that is in contact with the member for manufacturing an electronic material or the electronic material manufacturing device based on the concentrations of the particulate metal including a metal atom which are measured by the Single Particle ICP-MASS method.

In the quality inspection method of the present invention, the concentrations of the particulate metal including a metal atom which are measured by the Single Particle ICP-MASS method in the chemical fluid for manufacturing an electronic material can be measured according to the above method.

The quality standard in the quality inspection method is not particularly limited, the concentrations of the particulate metal including metal atoms that become a quality inspection target are preferably the concentration of particulate metal including an iron atom, the concentration of particulate metal including a copper atom, and the concentration of particulate metal including a zinc atom, and suitable examples thereof include an example in which whether the sum of the concentration of particulate metal including an iron atom, the concentration of particulate metal including a copper atom, and the concentration of particulate metal including a zinc atom is 100 ppt or less in order to highly efficiently manufacture the high-quality chemical fluid for manufacturing an electronic material in the forming of the ultrafine pattern (for example, having a node of 10 nm or lower) is set as a quality standard.

In the quality inspection method of the present invention, examples of the method of measuring the concentration of particulate metal including a metal atom which is measured by the Single Particle ICP-MASS method in the inspection solution that is in contact with the member for manufacturing an electronic material or the electronic material manufacturing device are provided below.

(Measuring of Inspection Solution that is in Contact with Member for Manufacturing Electronic Material)

The inspection solution (for example, ultrapure water and organic solvent) in which the concentration (for example, the sum of the concentration of particulate metal including an iron atom, the concentration of particulate metal including a copper atom, and the concentration of particulate metal including a zinc atom) of particulate metal including a metal atom which is measured by the Single Particle ICP-MASS method is 100 ppt or less charges a container which is very clear such that the concentration of particulate metal including the metal atom after being charged with the inspection solution becomes 100 ppt or less. Thereafter, the quality inspection is performed by measuring the concentration of particulate metal including a metal atom in the inspection solution after the member as the quality inspection target is immersed in the container by the SP ICP-MS method.

The determination standard such as a volume ratio and a contact area of the inspection solution and the member, an immersion method, a storage temperature, immersion time, an inspection target metal species, a particle size, and a metal concentration can be appropriately determined according to the use, the shape, and/or the composition of the member material, or the like. Filtration may be performed in order to remove the members, if necessary. As an example of a quality inspection method, in a case where the member such as a plate material and a film material is inspected, about 10 cc of inspection solution per 1 $cm^2$ of the surface area of the member is prepared, and the member is immersed in the inspection solution at 25° C. for one week. Thereafter, the concentration of particulate metal including a metal atom in the inspection solution after immersion is measured by using the SP ICP-MS method.

(Measuring Inspection Solution that is in Contact with Electronic Material Manufacturing Device)

The inspection solution (for example, ultrapure water and organic solvent) in which the concentration (for example, the sum of the concentration of particulate metal including an iron atom, the concentration of particulate metal including a copper atom, and the concentration of particulate metal including a zinc atom) of particulate metal including a metal atom which is measured by the Single Particle ICP-MASS method is 100 ppt or less is passed through the electronic material manufacturing device at a predetermined temperature and flow rate and is collected in a jetting portion, a sampling port, or the like. The collected inspection solution is collected to a container which is very clear such that the concentration of particulate metal including a metal atom in the liquid even after a liquid which is the same kind of the inspection solution is charged is 100 ppt or less. Thereafter, the quality inspection is performed by measuring the concentration of particulate metal including metal atoms in the inspection solution collected in the container by the SP ICP-MS method. As determination standard of the quality inspection, for example, the concentration (for example, the sum of the concentration of particulate metal including an iron atom, the concentration of particulate metal including a copper atom, and the concentration of particulate metal including a zinc atom) of particulate metal including a specific metal atom is used.

Based on the measurement result of the inspection solution, appropriately, the member for manufacturing an electronic material or the electronic material manufacturing device may be washed, or the employment thereof may be delayed.

The chemical fluid for manufacturing an electronic material obtained by the method of manufacturing the chemical fluid for manufacturing an electronic material of the present invention is generally stored in a container such as a tank, a tank lorry, a container, a tote container, a drum can, a resin container, and a glass container corresponding to the cleanliness and/or properties of the chemical fluid. In view of forming of the high-quality ultrafine pattern (for example, having a node of 10 nm or lower), the container storing the chemical fluid for manufacturing an electronic material is preferably a container that hardly increases the concentration of the particulate metal including a metal atom in the chemical fluid for manufacturing an electronic material.

Accordingly, the present invention relates to a container that stores the chemical fluid for manufacturing an electronic material, in which the inspection solution is charged in the container at 25° C. for 30 days, and the sum of the concentration of particulate metal including an iron atom, the concentration of particulate metal including a copper atom, and the concentration of particulate metal including a zinc atom which are measured by the Single Particle ICP-MASS method in the inspection solution after storing is 100 ppt or less.

Here, the inspection solution is preferably pure water, the chemical fluid for manufacturing an electronic material stored in the container, a portion of a raw material constituting the chemical fluid for manufacturing an electronic material stored in the container, or a mixed solution obtained by mixing or a plurality thereof.

In the container of the present invention, the sum of the concentration of the particulate metal is preferably 50 ppt or less and more preferably 10 ppt or less. It is preferable that the sum of the concentrations of the particulate metal is as less as possible, but the sum is typically 0.01 ppt or more.

According to an aspect, the container of the present invention include a holding portion in which the chemical fluid for manufacturing an electronic material is held and a seal portion that seals this holding portion.

According to an aspect of the present invention, at least a portion of an inner wall of a holding portion that is in contact with the chemical fluid for manufacturing an electronic material is preferably formed from a material containing at least one selected from polyethylene, polypropylene, polytetrafluoroethylene, and perfluoroalkoxyalkane according to depending on types, properties, cleanliness, or the like of the held chemical fluid for manufacturing an electronic material. Here, the expression "at least a portion", for example, means that the lining used on the inner wall of the holding portion, a lining layer, a laminate layer, a sealing material used in a joint portion, a lid, an observation window, and the like may be formed of other materials.

In an aspect of the present invention, it is preferable that at least a portion of the inner wall of the holding portion that is in contact with the chemical fluid for manufacturing an electronic material is formed of a material containing at least one selected from stainless steel, hastelloy, inconel, and monel, depending on the type, the properties, the cleanliness, or the like of the held chemical fluid for manufacturing an electronic material. Here, the expression "at least a portion", for example, means that the lining used on the inner wall of the holding portion, a lining layer, a laminate layer, a sealing material used in a joint portion, a lid, an observation window, and the like may be formed of other materials.

It is preferable that the surface of stainless steel, hastelloy, inconel, or monel described above is subjected to an electrolytic polishing treatment. It is preferable that conditions of electrolytic polishing and other buffing treatments or the like are set under a condition that hardly increases the concentration of the particulate metal including a metal atom in the chemical fluid for manufacturing an electronic material.

In an aspect of the present invention, it is preferable that at least a portion of the inner wall of the holding portion that is in contact with the chemical fluid for manufacturing an electronic material is formed of a material containing at least one selected from highly clean glass and quartz glass, depending on the type, the properties, the cleanliness, or the like of the held chemical fluid for manufacturing an electronic material. Here, the expression "at least a portion", for example, means that the lining used on the inner wall of the holding portion, a lining layer, a laminate layer, a sealing material used in a joint portion, a lid, an observation window, and the like may be formed of other materials.

With respect to the container of the present invention, it is preferable that the inner wall of the holding portion with which at least the chemical fluid for manufacturing an electronic material is in contact is washed by using a washing solution before the chemical fluid for manufacturing an electronic material is stored.

The liquid used for washing is not particularly limited as long as impurities are sufficiently reduced.

As the washing solution, the chemical fluid for manufacturing an electronic material itself or a solution obtained by diluting the chemical fluid is preferable.

According to an aspect, with respect to the washing solution that can be used in a washing step before the chemical fluid for manufacturing an electronic material is stored, a contact angle to the inner wall at 23° C. is preferably 10° to 120°.

Here, the contact angle is an index relating to wettability to a certain liquid on the surface of a certain material and is represented by an angle θ formed by a tangent of a liquid 11 that is deposited to a material 10 in a circumferential edge portion with respect to the surface of the material 10 as illustrated in FIG. 1. As the contact angle θ is greater, the material 10 easily repels the liquid 11, and wettability to the liquid 11 is low. In contrast, as the contact angle θ is smaller, the material 10 hardly repels the liquid 11, and the wettability to the liquid 11 is high. The size of the contact angle θ depends on the size of the surface energy of the material 10, and as the surface energy of the material 10 is smaller, the contact angle θ becomes greater.

In the washing step of the inner wall of the holding portion before the chemical fluid for manufacturing an electronic material is stored, the contact angle to this inner wall is 10° or more, and the inner wall is washed with a washing solution with not good wettability, such that the washing solution remains in the container so as to suppress the washing solution or contaminants included in the washing solution from contaminating the chemical fluid for manufacturing an electronic material of the present invention which is charged after washing. By causing the contact angle to this inner wall to be 120° or less and washing the inner wall with the washing solution with not too poor wettability, it is possible to increase a removal rate of the contaminant remaining in a fine gap or the like of the holding portion.

The washing solution preferably includes at least one component contained in the chemical fluid for manufacturing an electronic material provided in the storing. The at least one component is preferably one or more components contained as a component in the chemical fluid for manufacturing an electronic material. While the demand for high purification of a chemical fluid for manufacturing an electronic material increases, the washing solution itself can be an impurity for a liquid product to be stored, but by using a washing solution containing a component same as the component included in the stored chemical fluid for manufacturing an electronic material, the generation of the impurities can be suppressed. According to an aspect of the present invention, the chemical fluid for manufacturing an electronic material of the present invention itself or a single substance of the raw material itself or a mixed chemical fluid of a plurality thereof may be used as the washing solution for washing. The main component in the present specification means a component that is intentionally contained in the chemical fluid and means that unintentional impurities are not included. Examples of the main component include an organic solvent used in the chemical fluid and an aqueous solvent.

Specific examples of the washing solution include ultrapure water, and isopropyl alcohol.

A washing method may be performed in the well-known method. For example, Examples 1 and 2 are provided as the washing method.

EXAMPLE 1

After 5 L of the washing solution charges a container with an inner volume of 20 L, the container is tightly sealed. Shaking stirring is performed for one minute such that the washing solution is spread over the entire surface of a liquid contact portion in the container evenly, and then the lid is opened to discharge the washing solution. Substitution is performed three times with ultrapure water so as to be sufficiently rinsed and ultrapure water is dried. The number of times and the time of washing with the washing solution and, if necessary, the number of times and the time of rinsing with ultrapure water afterwards may be determined depending on the required cleanliness.

EXAMPLE 2

The opening of the container is downward faced, and the washing solution is jetted from the opening through the jetting nozzle or the like to the inner surface of the container for washing. Washing or the like is appropriately performed such that the entire inner surface of the container is washed by using a diffusion nozzle, providing a plurality of nozzles, and operating the container and/or a washing nozzle. Washing time is determined depending on the required cleanliness.

According to an aspect, the container of the present invention is a container holding the chemical fluid for manufacturing an electronic material, and in this container, a proportion (hereinafter, referred to as a "void volume") of a void occupying the holding portion that holds the chemical fluid for manufacturing an electronic material is preferably 50 to 0.01 vol %. By causing an upper limit value of the void volume in the holding portion to be 50 vol % or less, it is possible to reduce the possibility that impurities in the gas occupying the void contaminate the chemical fluid for manufacturing an electronic material. According to an aspect, the void volume in the holding portion is more preferably 20 to 0.01 vol % and even more preferably 10 to 1 vol %.

According to an aspect, with respect to the container of the present invention, it is preferable that the void of the holding portion that holds the chemical fluid for manufacturing an electronic material is charged with ultrapure gas having fewer particles. As the gas, for example, gas having 10 particles/liter or less of the number of particles having a diameter of 0.5 μm or more is preferable, and gas having 1 particle/liter or less of the number of particles having a diameter of 0.5 μm or more is more preferable.

According to an aspect, it is preferable that the container of the present invention is charged with inert gas in the void of the holding portion that holds the chemical fluid for manufacturing an electronic material.

The present invention also relates to the chemical fluid for manufacturing an electronic material stored in the container of the present invention.

In a case where the method of manufacturing the chemical fluid for manufacturing an electronic material of the present invention includes a step (charging step) of causing the chemical fluid for manufacturing an electronic material to charge the container, it is preferable that the inner portion (inner wall of pipe, inner wall of charging nozzle, or the like) of the charging device is lined as much as possible. Suitable examples of the container include those described above, and it is more preferable that the surface that is in contact with the chemical fluid for manufacturing an electronic material is made of a resin other than the one or more resins selected from the group consisting of a polyethylene resin, a polypropylene resin, and a polyethylene-polypropylene resin.

In the method of manufacturing the chemical fluid for manufacturing an electronic material of the present invention, it is preferable that the chemical fluid for manufacturing an electronic material does not have a step of bringing into contact with the one or more resins selected from the group consisting of a polyethylene resin, a polypropylene resin, and a polyethylene-polypropylene resin.

Therefore, it is preferable that the seal portion that is used for a sealing purpose in the step of manufacturing the chemical fluid for manufacturing an electronic material is formed of a resin different from the one or more resins selected from the group consisting of a polyethylene resin, a polypropylene resin, and a polyethylene-polypropylene resin or metal subjected to rust preventing and/or metal elution preventing treatments.

Here, the seal portion means a member that can shield the holding portion from the outside air, and suitable examples thereof include packing and an O ring.

The resin that is different from the one or more resins selected from the group consisting of a polyethylene resin, a polypropylene resin, and a polyethylene-polypropylene resin is preferably a fluorine-containing resin, and specific examples and preferable examples thereof are as described above.

Moisture Adjusting Step

The moisture adjusting step is a step of adjusting a content of water contained in a substance to be purified. The method of adjusting the content of water is not particularly limited, but examples thereof include a method of adding water to the substance to be purified and a method of removing water in the substance to be purified.

The method of removing water is not particularly limited, and well-known dehydration method can be used.

Examples of the method of removing water include a dehydrating film, a water adsorbent insoluble in an organic solvent, aeration substitution using dry inert gas, and heating or vacuum heating.

In a case where the dehydrating film is used, film dehydration by pervaporation (PV) or vapor permeation (VP) can be performed. The dehydrating film is formed, for example, as a water permeable film module. As the dehydrating film, a film made of a polymer-based material such as a polyimide-based material, a cellulose-based material, or a polyvinyl alcohol-based material or an inorganic material such as zeolite can be used.

The water adsorbent is used by being added to the substance to be purified. Examples of the water adsorbent include zeolite, diphosphorus pentoxide, silica gel, calcium chloride, sodium sulfate, magnesium sulfate, anhydrous zinc chloride, fuming sulfuric acid, and soda lime.

In a case where zeolite (particularly, MOLECULAR SIEVE (trade name) manufactured by Union Showa K.K., and the like) is used in the dehydration treatment, olefins can also be removed.

The component adjusting step described above is preferably performed in a sealed state and in an inert gas atmosphere with a low possibility of contamination of water to a substance to be purified.

Each treatment is preferably performed in an inert gas atmosphere having a dew point temperature of −70° C. or less in order to suppress contamination of moisture as much as possible. This is because the moisture concentration in the gas phase is 2 mass ppm or less under an inert gas atmosphere of −70° C. or less, so that the possibility of the contamination of moisture in the organic solvent decrease.

In addition to each of the above steps, the method of manufacturing the chemical fluid for manufacturing an electronic material may contain, for example, an adsorption and purification step of a metal component using silicon carbide disclosed in WO2012/043496A.

Although not particularly limited, it is preferable to perform the above filtration step before each of the above steps, the effect of the present invention is more remarkably obtained accordingly, and thus this is referred to as pre-filtration in some cases.

It is preferable that, with respect to a device or a member relating to the manufacturing, a liquid contact inner portion with the chemical fluid is washed before manufacturing. As a liquid used for washing, an organic solvent having a small amount of impurities is preferable, and, for example, it is preferable to use a high grade product for semiconductor applications, an organic solvent obtained by further purifying the product, the chemical fluid for manufacturing an electronic material itself, or a solution obtained by diluting the chemical fluid for manufacturing an electronic material is preferable. It is preferable to start the manufacturing after washing such that the impurities included in the liquid to be washed or the manufactured chemical fluid for manufacturing an electronic material becomes in a desired amount or less.

(Clean Room)

It is preferable that all of the manufacturing of the chemical fluid for manufacturing an electronic material, the opening and/or washing of the container, the dealing including the holding of the solution, the treatment analysis, and the measurement are performed in a clean room. It is preferable that the clean room satisfies the 14644-1 clean room standard. It is preferable to satisfy one of International Organization for Standardization (ISO) class 1, ISO class 2, ISO class 3, and ISO class 4, it is more preferable to satisfy ISO class 1 or ISO class 2, and it is even more preferable to satisfy ISO class 1.

The chemical fluid for manufacturing an electronic material is preferably a chemical fluid for manufacturing a semiconductor device.

Examples of the chemical fluid for manufacturing an electronic material include an actinic ray-sensitive or radiation-sensitive resin composition containing a solvent, solvent for an actinic ray-sensitive or radiation-sensitive resin composition, a developer, a rinsing solution, a pre-wet liquid (liquid that is applied to a substrate before a functional layer such as a resist layer is formed on the substrate), a washing solution, an etching solution, a peeling solution, a top coat solvent (solvent contained in a coating solution for forming a protective layer in a case where a protective layer is formed on a functional layer), and an inspection solution used in the above quality inspection method.

The chemical fluid for manufacturing an electronic material includes not only a chemical fluid having an organic solvent as a main component but also a chemical fluid (an alkali developer, a hydrogen peroxide solution, or the like) having an aqueous solvent as a main component or a chemical fluid having a mixed solvent of an organic solvent and an aqueous solvent as a main component.

The chemical fluid for manufacturing an electronic material can be suitably used in other applications other than the manufacturing of a semiconductor, and can be used as a developer such as a polyimide-containing resist, a resist for a sensor, and a resist for a lens, and a rinsing solution.

The chemical fluid for manufacturing an electronic material not only can be used for manufacturing an electronic material but also can be used as a solvent for a medical application or a washing application. Particularly, the chemical fluid can be suitably used for washing a container, a pipe, a substrate (for example, a wafer and glass), and the like.

Specific examples and preferable examples of the actinic ray-sensitive or radiation-sensitive resin composition containing a solvent, a solvent for an actinic ray-sensitive or radiation-sensitive resin composition, a developer, and a rinsing solution are the same as examples described in the pattern forming method described below.

Specific examples of the pre-wet liquid include methyl 3-methoxypropionate (MMP), methyl amyl ketone (MAK), ethyl lactate (EL), propylene glycol monomethyl ether acetate (PGMEA), cyclohexanone, normal pentyl acetate, ethylene glycol, isopentyl acetate, butyl acetate, propylene glycol monomethyl ether (PGME), 1-octanone, 2-octanone, 1-nonanone, 2-nonanone, acetone, 4-heptanone, 1-hexanone, 2-hexanone, diisobutyl ketone, methyl cyclohexanone, phenyl acetone, methyl ethyl ketone, methyl isobutyl ketone, acetylacetone, acetonylacetone, ionone, diacetyl alcohol, acetyl carbinol, acetophenone, methyl naphthyl ketone, isophorone, propylene carbonate, methyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol, a glycol-based solvent such as ethylene glycol, diethylene glycol, and triethylene glycol, ethylene glycol monomethyl ether, propylene glycol monomethyl ether, ethylene glycol monoethyl ether, propylene glycol monoethyl ether, diethylene glycol monomethyl ether, triethylene glycol monoethyl ether, methoxymethyl butanol, dioxane, tetrahydrofuran, N-methyl-2-pyrrolidone, N,N-dimethylacetamide, N,N-dimethylformamide, hexamethylphosphoric triamide, 1,3-dimethyl-2-imidazolidinone, toluene, xylene, pentane, hexane, octane, and decane. MMP, MAK, EL, PGME, cyclohexanone, normal pentyl acetate, and ethylene glycol are preferable, MMP, MAK, EL, and PGME are more preferable, and MMP and MAK are even more preferable. The pre-wet solvents may be used singly or two or more kinds thereof may be used in combination.

Examples of the washing solution include an ammonia hydrogen peroxide solution-containing washing solution, a hydrofluoric acid-containing washing solution, a sulfated water mixture solution, and a phosphoric acid-containing washing solution. Examples thereof include a washing liquid for removing an etching residue or a resist polymer.

Specific examples of the etching solution include a mixed solution containing hydrofluoric acid, a mixed solution containing hydrofluoric acid and ammonium fluoride, a mixed solution containing hydrofluoric acid and nitric acid, and an alkaline etching solution.

Examples of the peeling solution include an alkaline solvent-based peeling solution, an alkaline aqueous peeling solution, an aqueous peeling solution containing hydrofluoric acid, and a hydrofluoric acid-containing solvent-based peeling solution.

Suitable examples of the top coat solvent include an alcohol-based solvent, an ether-based solvent, an ester-based solvent, a fluorine-based solvent, and a hydrocarbon-based solvent.

In view of coatability, the alcohol-based solvent is preferably monohydric alcohol and more preferably monohydric alcohol having 4 to 8 carbon atoms. As the monohydric alcohol having 4 to 8 carbon atoms, linear, branched, or cyclic alcohol can be used, but linear or branched alcohol is preferable. Examples of the alcohol-based solvent include alcohol such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycol such as ethylene glycol, propylene glycol, diethylene glycol, and triethylene glycol; glycol ether such as ethylene glycol monomethyl ether, propylene glycol monomethyl ether, diethylene glycol monomethyl ether, triethylene glycol monoethyl ether, and methoxymethylbutanol can be used. Among these, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

In view of temporal stability and coatability, as the alcohol-based solvent, secondary alcohol is preferable, and as a specific example, secondary alcohol among the above specific examples of the monohydric alcohol is more preferable.

In addition to the above glycol ether-based solvent, examples of the ether-based solvent include dioxane, tetrahydrofuran, isoamyl ether, diisoamyl ether. Among the ether-based solvents, an ether-based solvent having a branched structure is more preferable.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate. Among the ester-based solvents, an ester-based solvent having a branched structure is preferable.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, fluoroalcohol and fluorohydrocarbon-based solvents can be suitably used.

Examples of the hydrocarbon-based solvent include an aromatic hydrocarbon-based solvent such as toluene, xylene, and anisole; and an aliphatic hydrocarbon-based solvent such as n-heptane, n-nonane, n-octane, n-decane, 2-methylheptane, 3-methylheptane, 3,3-dimethylhexane, and 2,3,4-trimethylpentane.

The top coat solvents may be used singly or two or more kinds thereof may be used in a mixture.

Examples of the inspection solution include pure water and an organic solvent, but in the method of manufacturing an electronic material, a liquid that actually comes into contact with a member for manufacturing an electronic material or an electronic material manufacturing device is suitably used. Specific examples of the liquid are as described above with respect to liquids (specific examples of the actinic ray-sensitive or radiation-sensitive resin composition containing a solvent, a developer, and a rinsing solution) used in the pattern forming method described below, a pre-wet liquid, a washing solution, an etching solution, a peeling solution, and a top coat solvent.

The Pattern Forming Method of the Present Invention Includes (1) a step of forming an actinic ray-sensitive or radiation-sensitive film with an actinic ray-sensitive or radiation-sensitive resin composition containing a solvent;

(2) a step of exposing the actinic ray-sensitive or radiation-sensitive film; and (4) a step of developing the exposed actinic ray-sensitive or radiation-sensitive film by using a developer, and at least one of the actinic ray-sensitive or radiation-sensitive resin composition or the developer is a chemical fluid obtained by the method of manufacturing the chemical fluid for manufacturing an electronic material of the present invention.

The pattern forming method may be a positive tone pattern forming method or may be a negative tone pattern forming method.

Hereinafter, respective steps are described.

[Step (1): Film Forming Step]

In the step (1), an actinic ray-sensitive or radiation-sensitive film (resist film) is formed on a substrate by an actinic ray-sensitive or radiation-sensitive resin composition (resist composition).

First, members and materials used in the step (1) are described, and subsequently a sequence of the step (1) is described.

[Substrate]

The substrate is not particularly limited, and a substrate that is generally used in a step of manufacturing a semiconductor such as an IC, a step of manufacturing a circuit substrate of liquid crystal, a thermal head, or the like, and a lithography step of other photofabrication, such as an inorganic substrate such as silicon, $SiO_2$, or SiN, or an application-type inorganic substrate such as SOG, can be used. If necessary, an antireflection film may be formed between a resist film and a substrate. As the antireflection film, well-known organic and inorganic antireflection films can be appropriately used.

[Actinic Ray-Sensitive or Radiation-Sensitive Resin Composition (Resist Composition)]

The actinic ray-sensitive or radiation-sensitive resin composition (hereinafter, also referred to as a "resist composition" for convenience) used in the pattern forming method is described.

The resist composition may be a positive resist composition or may be a negative resist composition, and may be a resist composition for alkali development and a resist composition for developing an organic solvent.

The resist composition is typically a chemically amplified resist composition.

Hereinafter, respective components that can be contained in the actinic ray-sensitive or radiation-sensitive resin composition (resist composition) are described.

Resin (A)

The resist composition preferably contains the resin (A).

Typically, the resin (A) is a resin which is decomposed by the action of an acid and changes the solubility thereof in a developer, and is preferably a resin in which solubility in an alkali developer increases due to the action of an acid or solubility in a developer containing an organic solvent decreases due to the action of an acid. It is preferable that the resin has a group (hereinafter, referred to as an "acid-decomposable group") that is decomposed by an action of an acid and produces a polar group in a main chain, a side chain, or both of the main chain and the side chain of the resin.

The acid-decomposable group preferably has a structure in which a polar group is protected by a group that is decomposed by an action of an acid and is released.

Examples of the polar group include an acidic group such as a phenolic hydroxyl group, a carboxyl group, a fluorinated alcohol group, a sulfonic acid group, a sulfonamide group, a sulfonylimide group, an (alkylsulfonyl) (alkylcarbonyl) methylene group, an (alkylsulfonyl) (alkylcarbonyl) imide group, a bis(alkylcarbonyl) methylene group, a bis (alkylcarbonyl) imide group, a bis(alkylsulfonyl) methylene group, a bis(alkylsulfonyl) imide group, a tris(alkylcarbonyl) methylene group, and a tris(alkylsulfonyl) methylene group (a group dissociating in a 2.38 mass % tetramethylammonium hydroxide aqueous solution which is used in the related art as a developer for resist), and an alcoholic hydroxyl group.

Preferable examples of the polar group include a carboxyl group, a fluorinated alcohol group (preferably a hexafluoroisopropanol group), and a sulfonic acid group.

A group which is preferable as the acid-decomposable group is a group in which a hydrogen atom of the polar group is substituted with a group that is released due to an action of an acid.

Examples of the group that is released due to an action of an acid include $-C(R_{36})(R_{37})(R_{38})$, $-C(R_{36})(R_{37})(R_{39})$, $-C(R_{01})(R_{02})(OR_{39})$, $-C(R_{01})(R_{02})-C(=O)-O-C(R_{36})(R_{37})(R_{38})$, or $-CH(R_{36})(Ar)$.

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other, so as to form a ring.

$R_{01}$ and $R_{02}$ each independently represent a hydrogen atom, an alkyl group, a cycloalkyl group, an aryl group, an aralkyl group, or an alkenyl group.

Ar represents an aryl group.

The alkyl group as $R_{36}$ to $R_{39}$, $R_{01}$, or $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

A cycloalkyl group as $R_{36}$ to $R_{39}$, $R_{01}$, or $R_{02}$ may be a monocyclic cycloalkyl group and may be a polycyclic cycloalkyl group. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and cyclooctyl group. The polycyclic cycloalkyl group is preferably a cycloalkyl group having 6 to 20 carbon atoms, and examples thereof include an adamantyl group, a norbornyl group, an isobornyl group, a camphanyl group, a dicyclopentyl group, an α-pinanyl group, a tricyclodecanyl group, a tetracyclododecyl group, and an androstanyl group. A portion of the carbon atoms in the cycloalkyl group may be substituted with a hetero atom such as an oxygen atom.

The aryl group as $R_{36}$ to $R_{39}$, $R_{01}$, $R_{02}$, or Ar is preferably an aryl group having 6 to 10 carbon atoms, and examples thereof include a phenyl group, a naphthyl group, and an anthryl group.

The aralkyl group as $R_{36}$ to $R_{39}$, $R_{01}$, or $R_{02}$ is preferably an aralkyl group having 7 to 12 carbon atoms, and preferable examples thereof include a benzyl group, a phenethyl group, and a naphthylmethyl group.

The alkenyl group as $R_{36}$ to $R_{39}$, $R_{01}$, or $R_{02}$ is preferably an alkenyl group having 2 to 8 carbon atoms, and examples thereof include a vinyl group, an allyl group, a butenyl group, and a cyclohexenyl group.

The ring that may be formed by bonding $R_{36}$ and $R_{37}$ to each other may be monocyclic or polycyclic. The monocyclic type is preferably a cycloalkane structure having 3 to 8 carbon atoms, and examples thereof include a cyclopropane structure, a cyclobutane structure, a cyclopentane structure, a cyclohexane structure, a cycloheptane structure, and a cyclooctane structure. The polycyclic type is preferably a cycloalkane structure having 6 to 20 carbon atoms, and examples thereof include an adamantane structure, a norbornane structure, a dicyclopentane structure, a tricyclodecane structure, and a tetracyclododecane structure. A portion of the carbon atoms in the ring structure may be substituted with a hetero atom such as an oxygen atom.

Each of the above groups may have a substituent. Examples of the substituent include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. These substituents preferably have 8 or less carbon atoms.

The acid-decomposable group is preferably a cumyl ester group, an enol ester group, an acetal ester group, a tertiary alkyl ester group and the like and more preferably a tertiary alkyl ester group.

The resin (A) preferably has a repeating unit represented by Formula (AI) as a repeating unit having an acid-decomposable group.

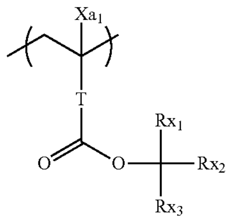

(AI)

In Formula (AI), $Xa_1$ represents a hydrogen atom or an alkyl group.

T represents a single bond or a divalent linking group.

$Rx_1$ to $Rx_3$ each independently represent a (linear or branched) alkyl group or a (monocyclic or polycyclic) cycloalkyl group.

Any two of $Rx_1$ to $Rx_3$ are bonded to form a (monocyclic or polycyclic) cycloalkyl group.

The alkyl group represented by $Xa_1$ may or may not have a substituent, and examples thereof include a methyl group or a group represented by $-CH_2-R_{11}$. $R_{11}$ represents a halogen atom (such as a fluorine atom), a hydroxyl group, or a monovalent organic group. Examples of the monovalent organic group include an alkyl group having 5 or less carbon atoms and an acyl group having 5 or less carbon atoms, and the monovalent organic group is preferably an alkyl group having 3 or less carbon atoms and more preferably a methyl group. According to an aspect, $Xa_1$ is preferably a hydrogen atom, a methyl group, a trifluoromethyl group, or a hydroxymethyl group.

Examples of the divalent linking group of T include an alkylene group, a —COO-Rt-group, and an —O-Rt-group. In the formula, Rt represents an alkylene group or a cycloalkylene group.

T preferably represents a single bond or a —COO-Rt-group. Rt is preferably an alkylene group having 1 to 5 carbon atoms and more preferably a $-CH_2-$ group, a $-(CH_2)_2-$ group, and a $-(CH_2)_3-$ group.

The alkyl group of $Rx_1$ to $Rx_3$ is preferably a group having 1 to 4 carbon atoms such as a methyl group, an ethyl group, an n-propyl group, an isopropyl group, an n-butyl group, an isobutyl group, and a t-butyl group.

The cycloalkyl group of $Rx_1$ to $Rx_3$ is preferably a monocyclic cycloalkyl group such as a cyclopentyl group and a cyclohexyl group, a polycyclic cycloalkyl group such as a norbornyl group, a tetracyclodecanyl group, a tetracyclododecanyl group, and an adamantyl group.

The cycloalkyl group formed by bonding any two of $Rx_1$ to $Rx_3$ is preferably a monocyclic cycloalkyl group such as a cyclopentyl group and a cyclohexyl group and a polycyclic cycloalkyl group such as a norbornyl group, a tetracyclodecanyl group, a tetracyclododecanyl group, and an adamantyl group. The monocyclic cycloalkyl group having 5 to 6 carbon atoms is particularly preferable.

With respect to the cycloalkyl group formed by bonding any two of $Rx_1$ to $Rx_3$, for example, one of the methylene groups constituting the ring may be substituted with a hetero atom such as an oxygen atom or a group having a hetero atom such as a carbonyl group.

It is preferable that the repeating unit represented by Formula (AI), for example, is an aspect in which $Rx_1$ is a methyl group or an ethyl group, and in which and $Rx_2$ and $Rx_3$ are bonded to each other to form the above cycloalkyl group.

Each of the above groups may have a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and a group having 8 or less carbon atoms is preferable.

Preferable specific examples of the repeating unit having an acid-decomposable group are provided below, but the present invention is not limited thereto.

In the specific examples, Rx represents a hydrogen atom, $CH_3$, $CF_3$, or $CH_2OH$. Rxa and Rxb each represent an alkyl group having 1 to 4 carbon atoms. Z represents a substituent including a polar group, and in a case where there are a plurality of Z's, Z's each independently represent a substituent including a polar group. p represents an integer of 0 or more. Examples of the substituent including a polar group represented by Z include a linear or branched alkyl group having a hydroxyl group, a cyano group, an amine group, an alkylamide group, or a sulfonamide group, and a cycloalkyl group, and the substituent is preferably an alkyl group having a hydroxyl group. The branched alkyl group is particularly preferably an isopropyl group.

1

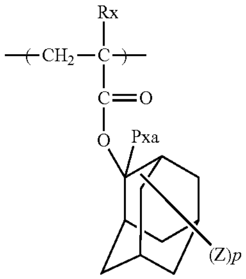

2

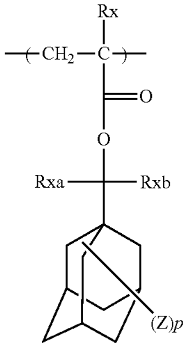

3

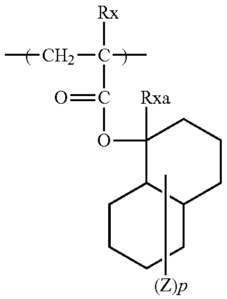

-continued

4

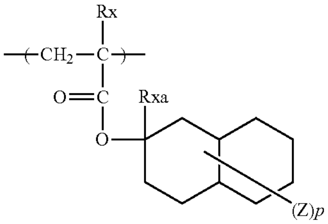

5

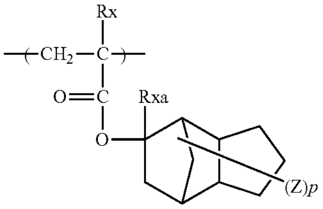

6

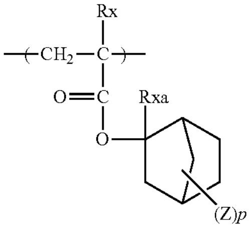

7

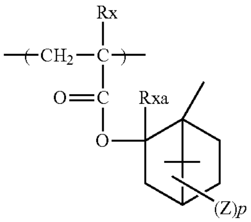

8

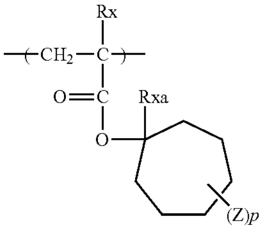

9

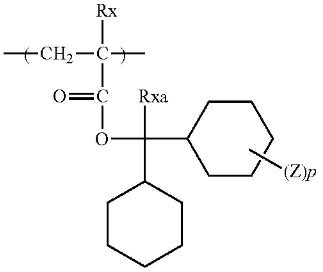

10

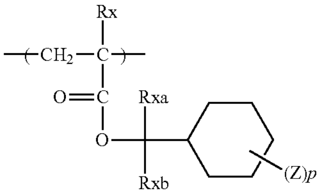

-continued

11

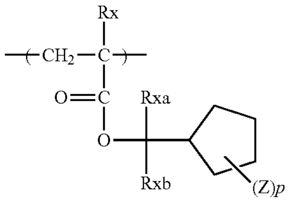

12

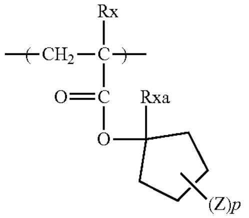

13

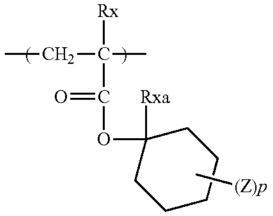

14

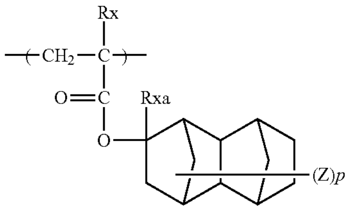

15

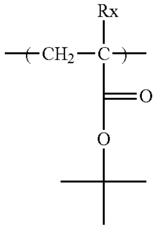

The resin (A) is more preferably a resin having, for example, at least any one of a repeating unit represented by Formula (I) and a repeating unit represented by Formula (II), as a repeating unit represented by Formula (AI).

(I)

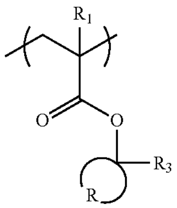

-continued (II)

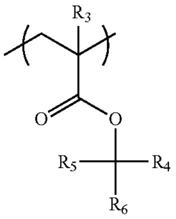

In Formulae (I) and (II), $R_1$ and $R_3$ each independently represent a hydrogen atom, a methyl group that may have a substituent, or a group represented by —$CH_2$—$R_{11}$. $R_{11}$ represents a monovalent organic group.

$R_2$, $R_4$, $R_5$, and $R_6$ each independently an alkyl group or a cycloalkyl group.

R represents an atomic group required for forming an alicyclic structure together with a carbon atom to which $R_2$ is bonded.

$R_1$ and $R_3$ each preferably represent a hydrogen atom, a methyl group, a trifluoromethyl group, or a hydroxymethyl group. Specific examples and preferable examples of the monovalent organic group in Ru are the same as those described in $Xa_1$ of Formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having 1 to 10 carbon atoms, and even more preferably an alkyl group having 1 to 5 carbon atoms, and examples thereof include a methyl group and an ethyl group.

R represents an atomic group required for forming an alicyclic structure together with a carbon atom. The alicyclic structure formed by R together with the carbon atom is preferably a monocyclic alicyclic structure, and the number of carbon atoms is preferably 3 to 7 and more preferably 5 or 6.

$R_3$ is preferably a hydrogen atom or a methyl group and more preferably a methyl group.

An alkyl group in $R_4$, $R_5$, and $R_6$ may be linear or branched and may have a substituent. The alkyl group is preferably an alkyl group having 1 to 4 carbon atoms and more preferably a methyl group, an ethyl group, an n-propyl group, an isopropyl group, an n-butyl group, an isobutyl group, and a t-butyl group.

The cycloalkyl group in $R_4$, $R_5$, and $R_6$ may be monocyclic or polycyclic and may have a substituent. The cycloalkyl group is preferably a monocyclic cycloalkyl group such as a cyclopentyl group and a cyclohexyl group and a polycyclic cycloalkyl group such as a norbornyl group, a tetracyclodecanyl group, a tetracyclododecanyl group, and an adamantyl group.

Examples of the substituent that may be included in each of the above groups include the same group as described above as the substituents that may be included in each of the above groups in Formula (AI).

The resin (A) is more preferably a resin including a repeating unit represented by Formula (I) and a repeating unit represented by Formula (II), as the repeating unit represented by Formula (AI).

According to another aspect, the resin (A) is more preferably a resin including at least two repeating units represented by Formula (I) as the repeating unit represented by Formula (AI).

The content of the sum of the repeating units having acid-decomposable groups is preferably 20 to 90 mol %, more preferably 25 to 85 mol %, and even more preferably 30 to 80 mol % with respect to the total repeating units in the resin (A).

According to an aspect, the resin (A) preferably contains a repeating unit having a cyclic carbonic acid ester structure. This cyclic carbonic acid ester structure is a structure having a ring including a bond represented by —O—C(═O)—O— as the atomic group constituting the ring. A ring including a bond represented by —O—C(═O)—O—as the atomic group constituting the ring is preferably a 5-membered to 7-membered ring and most preferably a 5-membered ring. The ring may be fused with another ring to form a fused ring.

The resin (A) may contain a repeating unit having a lactone structure or a sultone (cyclic sulfonic acid ester) structure.

As the lactone group or the sultone group, any group having a lactone structure or a sultone structure can be used, but a lactone structure or a sultone structure of 5-membered to 7-membered ring is preferable, and it is more preferable that another ring structure is fused to a lactone structure or a sultone structure of 5-membered to 7-membered ring in a form of forming a bicycle structure or a spiro structure. It is even more preferable that any one of Formulae (LC1-1) to (LC1-17), (SL1-1), and (SL1-2) has a repeating unit having a lactone structure or a sultone structure. A lactone structure or a sultone structure is directly bonded to a main chain. As the lactone structure or the sultone structure, (LC1-1), (LC1-4), (LC1-5), and (LC1-8) are preferable, and (LC1-4) is more preferable. By using the lactone structure or the sultone structure is used, line width roughness (LWR) and development defects are improved.

LC1-1

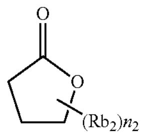

LC1-2

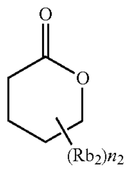

LC1-3

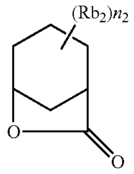

LC1-4

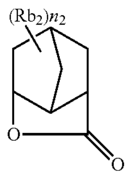

-continued

LC1-5

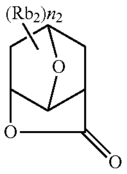

LC1-6

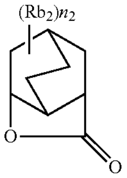

LC1-7

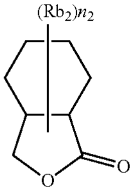

LC1-8

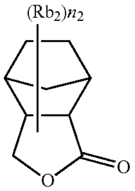

LC1-9

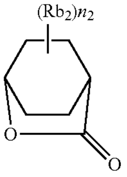

LC1-10

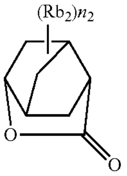

LC1-11

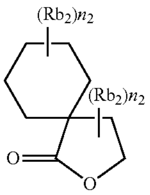

LC1-12

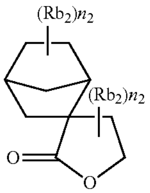

-continued

LC1-13

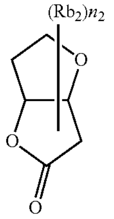

LC1-14

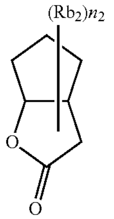

LC1-15

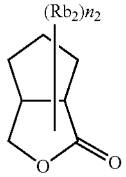

LC1-16

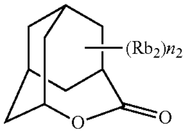

LC1-17

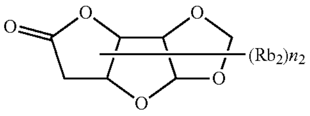

SL1-1

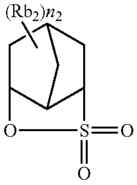

SL1-2

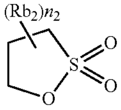

The lactone structure portion or the sultone structure portion may or may not have a substituent ($Rb_2$). Preferable examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. An alkyl group having 1 to 4 carbon atoms, a cyano group, and an acid-decomposable group are more preferable. $n_2$ represents an integer of 0 to 4. In a case where $n_2$ is 2 or more, the plurality of substituent's ($Rb_2$) which are present may be identical to or different from each other, and the plurality of substituent ($Rb_2$) which are present may be bonded to each other to form a ring.

In the repeating unit having a lactone structure or a sultone structure, an optical isomer is usually present, but any optical isomer may be used. One optical isomer may be used singly, or a plurality of optical isomers may be used in a mixture. In a case where one kind of optical isomer is mainly used, the optical purity (ee) thereof is preferably 90% or more and more preferably 95% or more.

The resin (A) may have one type of repeating unit having a lactone structure or a sultone structure or may have two or more types thereof.

In a case where a plurality of kinds of repeating units having a lactone structure or a sultone structure are contained, the content thereof in total is preferably 15 to 60 mol %, more preferably 20 to 50 mol %, and even more preferably 30 to 50 mol % with respect to the total repeating units in the resin (A).

The resin (A) preferably has a repeating unit having a hydroxyl group or a cyano group. As a result, the substrate adhesiveness and developer affinity are improved. The repeating unit having a hydroxyl group or a cyano group is preferably a repeating unit having an alicyclic hydrocarbon structure substituted with a hydroxyl group or a cyano group, and it is preferable not to have an acid-decomposable group. The alicyclic hydrocarbon structure in the alicyclic hydrocarbon structure substituted with a hydroxyl group or a cyano group is preferably an adamantyl group, a diamantyl group, or a norbornane group. As the alicyclic hydrocarbon structure substituted with a hydroxyl group or a cyano group, a structure represented by the following formula is preferable.

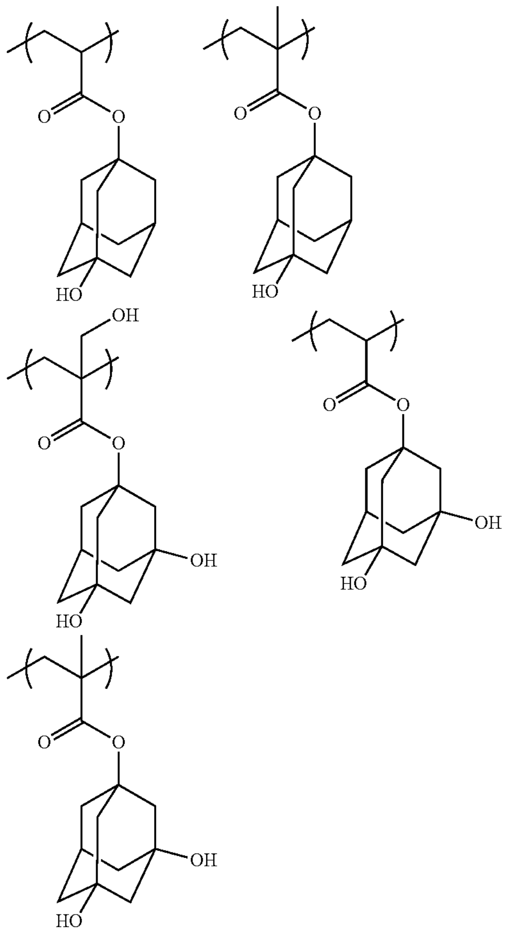

-continued

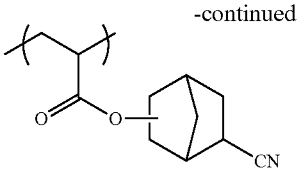

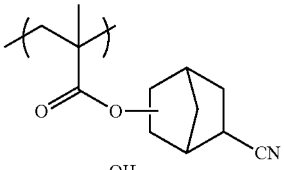

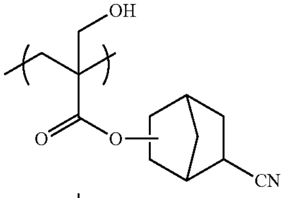

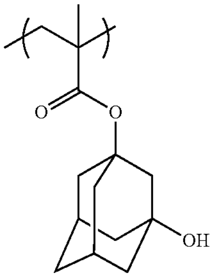

The content of the repeating unit having a hydroxyl group or a cyano group is preferably 5 to 40 mol %, more preferably 5 to 30 mol %, and even more preferably 10 to 25 mol % with respect to the total repeating unit in the resin (A).

Specific examples of the repeating unit having a hydroxyl group or a cyano group include repeating units disclosed in paragraph 0340 of US2012/0135348A, but the present invention is not limited thereto.

The resin (A) may have a repeating unit having an acid group. Examples of the acid group include a carboxyl group, a sulfonamide group, a sulfonylimide group, a bissulfonylamide group, and aliphatic alcohol (for example, hexafluoroisopropanol group) in which the α-position is substituted with an electron withdrawing group. The acid group is more preferably a carboxyl group. By containing a repeating unit having an acid group, resolving properties in a contact hole application are increased. As the repeating unit having an acid group, all of a repeating unit in which an acid group is directly bonded to the main chain of the resin like a repeating unit of acrylic acid or methacrylic acid, a repeating unit in which an acid group is bonded to the main chain of the resin via a linking group, and a repeating unit obtained by introducing a polymerization initiator having an acid group or a chain transfer agent to a terminal of a polymer chain at the time of polymerization are preferable, and the linking group may have a monocyclic or polycyclic hydrocarbon structure. A repeating unit of acrylic acid or methacrylic acid is particularly preferable.

The content of the repeating unit having an acid group is preferably 30 to 90 mol %, more preferably 35 to 85 mol %, and even more preferably 40 to 80 mol % with respect to the total repeating units in the resin (A).

Specific examples of the repeating unit having an acid group are provided below, but the present invention is not limited thereto.

In the specific example, Rx represents H, $CH_3$, $CH_2OH$, or $CF_3$.

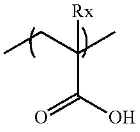

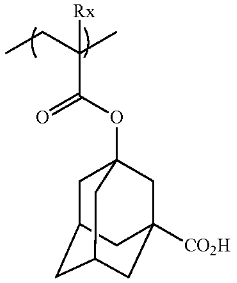

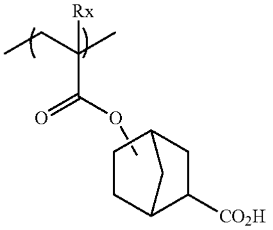

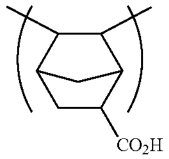

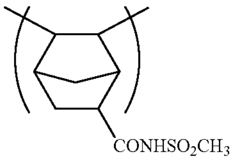

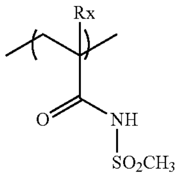

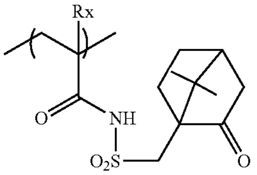

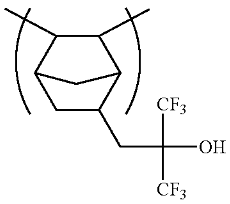

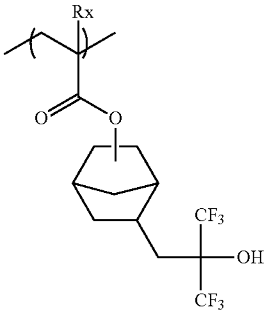

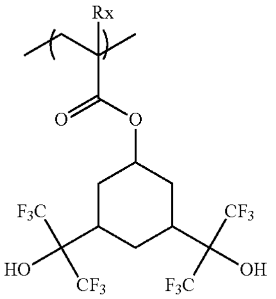

The resin (A) may further have a repeating unit having a cyclic hydrocarbon structure which does not have a polar group (for example, an acid group, a hydroxyl group, and a cyano group) and not exhibiting acid decomposable properties. Examples of the repeating unit include a repeating unit represented by Formula (IV).

(IV)

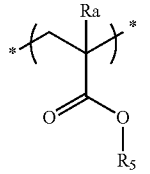

In Formula (IV), $R_5$ represents a hydrocarbon group having at least one cyclic structure and not having a polar group.

Ra represents a hydrogen atom, an alkyl group, or a $—CH_2—O—Ra_2$ group. In the formula, $Ra_2$ represents a hydrogen atom, an alkyl group, or an acyl group. $Ra_2$ is preferably a hydrogen atom, a methyl group, a hydroxymethyl group, or a trifluoromethyl group and particularly preferably a hydrogen atom or a methyl group.

The cyclic structure of $R_5$ includes a monocyclic hydrocarbon group and a polycyclic hydrocarbon group. Examples of the monocyclic hydrocarbon group include a cycloalkyl group having 3 to 12 carbon atoms such as a cyclopentyl group, a cyclohexyl group, a cycloheptyl group, and a cyclooctyl group, a cycloalkenyl having 3 to 12 carbon atoms such as a cyclohexenyl group, and a phenyl group. A preferable monocyclic hydrocarbon group is a monocyclic hydrocarbon group having 3 to 7 carbon atoms and more preferably a cyclopentyl group and a cyclohexyl group.

Examples of the polycyclic hydrocarbon group include a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinang, bornnan, norpinan, norbornane, and a bicyclo octane ring (bicyclo[2.2.2]octane ring and bicyclo[3.2.1] octane ring), a tricyclic hydrocarbon ring such as homobuledan, adamantane, tricyclo[5.2.1.$0^{2,6}$]decane, and a tricyclo[4.3.1.$1^{2,5}$]undecane ring, and a tetracyclic hydrocarbon ring such as tetracyclo[4.4.0.$1^{2,5}$0.$1^{7,10}$]dodecane and a perhydro-1,4-methano-5,8-methanonaphthalene ring. Examples of the crosslinked cyclic hydrocarbon ring include a fused cyclic hydrocarbon ring, for example, a fused ring obtained by fusing a plurality of 5-membered to 8-membered cycloalkane rings such as perhydronaphthalene (decalin), perhydroanthracene, perhydrophenanthrene, perhydroacenaphthene, perhydrofluorene, perhydroindene, and perhydrophenalene rings.

Preferable examples of the bridged cyclic hydrocarbon ring include a norbornyl group, an adamantyl group, a bicyclooctanyl group, and a tricyclo[5,2,1,$0^{2,6}$]decanyl group. More preferable examples of the crosslinked cyclic hydrocarbon ring include a norbornyl group and an adamantyl group.

These cyclic hydrocarbon structures may have a substituent, and preferable examples of the substituent include a halogen atom, an alkyl group, a hydroxyl group substituted with a hydrogen atom, and an amino group substituted with a hydrogen atom. Preferable examples of the halogen atom include bromine, chlorine, and fluorine atoms, and preferable examples of the alkyl groups include methyl, ethyl, butyl, and t-butyl groups. The above alkyl group may further have a substituent, and examples of the substituent that may be further provided include a halogen atom, an alkyl group, a hydroxyl group substituted with a hydrogen atom, and an amino group substituted with a hydrogen atom.

Examples of the group substituted with a hydrogen atom include an alkyl group, a cycloalkyl group, an aralkyl group, a substituted methyl group, a substituted ethyl group, an alkoxycarbonyl group, and an aralkyloxycarbonyl group. Preferable examples of the alkyl group include an alkyl group having 1 to 4 carbon atoms, preferable examples of the substituted methyl group include methoxymethyl, methoxythiomethyl, benzyloxymethyl, t-butoxymethyl, and a 2-methoxyethoxymethyl group, preferable examples of the substituted ethyl group include 1-ethoxyethyl and 1-methyl-1-methoxyethyl, preferable examples of the acyl groups include an aliphatic acyl group having 1 to 6 carbon atoms such as formyl, acetyl, propionyl, butyryl, isobutyryl, valeryl, and pivaloyl groups, and preferable examples of the alkoxycarbonyl group include an alkoxycarbonyl group having 1 to 4 carbon atoms.

The resin (A) may or may not contain a repeating unit having a cyclic hydrocarbon structure which does not have a polar group and not exhibiting acid decomposable properties, but in a case where the resin (A) contains the repeating unit, the content of this repeating unit preferably 1 to 40 mol % and more preferably 2 to 20 mol % with respect to the total repeating units in the resin (A).

Specific examples of the repeating unit having a cyclic hydrocarbon structure which does not have a polar group and not exhibiting acid decomposable properties are provided below, but the present invention is not limited thereto. In the formula, Ra represents H, $CH_3$, $CH_2OH$, or $CF_3$.

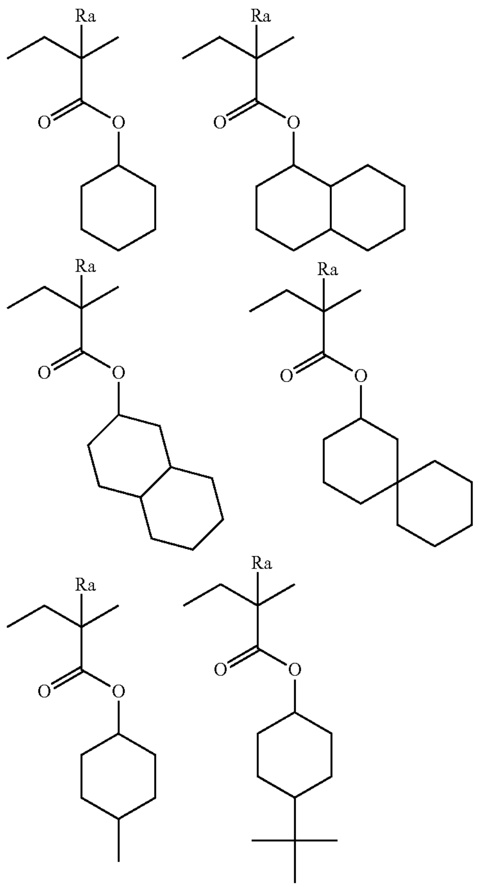

-continued

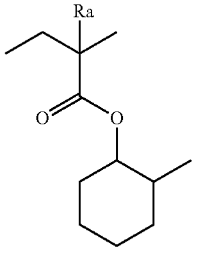
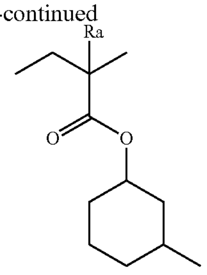
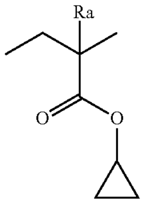
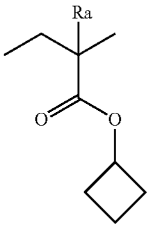
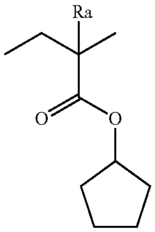
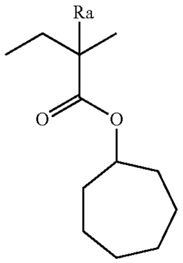
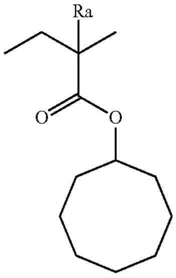
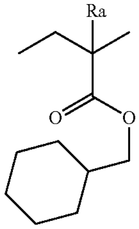
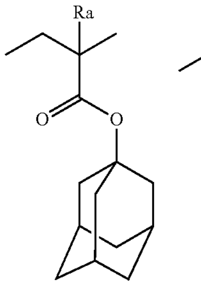
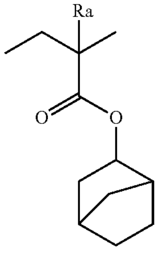
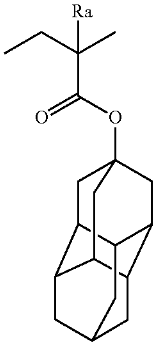
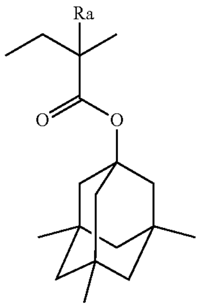
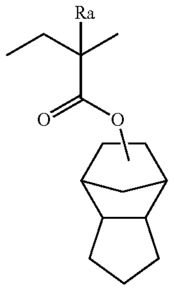

In addition to the above repeating structural unit, the resin (A) may have various repeating structural units for the purpose of adjusting properties such as dry etching resistance, suitability for standard developer, substrate adhesiveness, and resist profile, and general required properties of resist such as resolving power, heat resistance, and sensitivity. Examples of the repeating structural units include repeating structural units corresponding to the following monomers, but the repeating structural units are not limited thereto.

Accordingly, the performances required for the resin (A), particularly, (1) solubility in a coating solvent, (2) film formability (glass transition point), (3) alkali developability, (4) film thinning (selecting hydrophilic or hydrophobic properties and acid group), (5) adhesiveness to the substrate at the unexposed portion, (6) dry etching resistance, or the like can be finely adjusted.

Examples of the monomer include a compound having one addition polymerizable unsaturated bond selected from acrylic acid esters, methacrylic acid esters, acrylamides, methacrylamides, allyl compounds, vinyl ethers, and vinyl esters.

In addition, in a case of an addition polymerizable unsaturated compound copolymerizable with the monomer corresponding to the above various repeating structural units, the compound may be copolymerized.

In the resin (A), a content molar ratio of each repeating structural unit is appropriately set in order to adjust properties such as dry etching resistance or suitability for standard developer of the resist, substrate adhesiveness, and resist profile, and further general required performance of resist such as resolving power, heat resistance, and sensitivity.

In a case of the composition for the ArF exposure, in view of the transparency to the ArF rays, it is preferable that the resin (A) does not substantially have an aromatic ring (specifically, the ratio of the repeating unit having an aromatic group with respect to the total repeating unit of the resin is preferably 5 mol % or lower, more preferably 3 mol % or lower, and ideally 0 mol % by mol, that is, an aromatic group is not included), and the resin (A) preferably has a monocyclic or a polycyclic alicyclic hydrocarbon structure.

In the case where the resist film is irradiated with KrF excimer laser light, electron beams, X rays, or high energy light (such as EUV) having a wavelength of 50 nm or less, the resin (A) preferably includes a repeating unit having an aromatic hydrocarbon group and more preferably includes a repeating unit having a phenolic hydroxyl group. As the repeating unit having a phenolic hydroxyl group, repeating units provided below are particularly preferable.

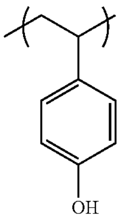
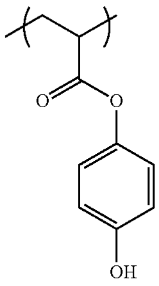
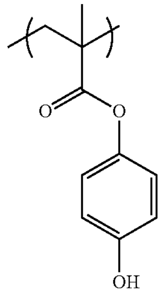

The form of the resin (A) may be any one of a random shape, a block shape, a comb shape, and a star shape. For example, the resin (A) can be synthesized by radical, cation, or anion polymerization of an unsaturated monomer corresponding to each structure. After the polymerization is performed by using an unsaturated monomer corresponding to a precursor of each structure, a polymer reaction is performed such that an objective resin can be obtained.

In a case where the resist composition includes a hydrophobic resin (D) described below, in view of the compatibility with the hydrophobic resin (D), it is preferable that the resin (A) does not contain a fluorine atom and a silicon atom (specifically, the proportion of the repeating unit having a fluorine atom or a silicon atom in the resin is preferably 5 mol % or less, more preferably 3 mol % or less, and ideally 0 mol %).

As the resin (A), it is preferable that all repeating units are configured with (meth)acrylate-based repeating units. In this case, all of the resins of which all the repeating units are methacrylate-based repeating units, of which all the repeating units are acrylate-based repeating units, or of which all the repeating units are methacrylate-based repeating units and acrylate-based repeating units can be used, but the resin of which acrylate-based repeating units are 50 mol % or lower with respect to all repeating units is preferable.

The resin (A) can be synthesized by a usual method (for example, radical polymerization). Examples of the general synthesis method include a batch polymerization method in which polymerization is performed by dissolving a monomer species and an initiator in a solvent and heating and a dropwise polymerization method in which a solution of a monomer species and an initiator is added dropwise to the heated solvent over 1 to 10 hours. Among these, the dropwise polymerization method is preferable. Examples of the reaction solvent include ethers such as tetrahydrofuran, 1,4-dioxane, and diisopropyl ether, ketones such as methyl ethyl ketone and methyl isobutyl ketone, an ester solvent such as ethyl acetate, an amide solvent such as dimethylformamide and dimethylacetamide, and further a solvent for dissolving the resist composition described below such as propylene glycol monomethyl ether acetate, propylene glycol monomethyl ether, and cyclohexanone. It is preferable to perform polymerization using the same solvent as the solvent used for the resist composition. As a result, generation of particles during storage can be suppressed.

The polymerization reaction is preferably performed in an inert gas atmosphere such as nitrogen or argon. Polymerization is initiated by using a commercially available radical initiator (azo-based initiator, peroxide, and the like) as a polymerization initiator. The radical initiator is preferably an azo-based initiator and more preferably an azo-based initiator having an ester group, a cyano group, and a carboxyl group. Examples of the preferable initiators include azobisisobutyronitrile, azobisdimethylvaleronitrile, and dimethyl 2,2'-azobis(2-methylpropionate). An initiator is added or an initiator is added in portions as desired, and after completion of the reaction, the initiator is charged in a solvent, and the desired polymer is collected by a method such as powder, solid collection, or the like. The concentration in the reaction is 5 to 50 mass % and preferably 10 to 30 mass %. The reaction temperature is generally 10° C. to 150° C., preferably 30° C. to 120° C., and even more preferably 60° C. to 100° C.

The weight-average molecular weight of the resin (A) is preferably 1,000 to 200,000, more preferably 2,000 to 20,000, even more preferably 3,000 to 15,000, and particularly preferably 3,000 to 11,000. In a case where the weight-average molecular weight is caused to be 1,000 to 200,000, it is possible to prevent deterioration of heat resistance and dry etching resistance and it is possible to prevent deterioration of developability and deterioration of film formability due to increase in viscosity.

The dispersion degree (molecular weight distribution) is generally in the range of 1.0 to 3.0, preferably in the range of 1.0 to 2.6, more preferably in the range of 1.0 to 2.0, and even more preferably in the range of 1.1 to 2.0. As the molecular weight distribution is smaller, a resolution and a resist shape are excellent, a sidewall of a resist pattern is smooth, and roughness properties are excellent.

A content proportion of the resin (A) in the total composition is preferably in the range of 30 to 99 mass % and more preferably in the range of 50 to 95 mass % with respect to the total solid content.

The resin (A) may be used singly, or two or more types thereof may be used in combination.

[2] Compound that Generates Acid by the Irradiation with an Actinic Ray or a Radiation The resist composition preferably contains a compound (B) (hereinafter, simply referred to as an "acid generating agent") that generates an acid by the irradiation with an actinic ray or a radiation.

The acid generating agent is preferably a compound that generates an organic acid by the irradiation with an actinic ray or a radiation.

As the acid generating agent, well-known compounds that generate acid by the irradiation with the actinic ray or the radiation that are used in a photoinitiator of photocationic polymerization, a photoinitiator of photoradical polymerization, a light-decoloring agent of coloring agents, a photochromic agent, micro resist, or the like, and the mixture thereof can be appropriately selected to be used. Examples thereof include compounds disclosed in paragraphs <0039> to <0103> of JP2010-61043A and compounds disclosed in paragraphs <0284> to <0389> of JP2013-4820A, but the present invention is not limited thereto.

Examples thereof include a diazonium salt compound, a phosphonium salt compound, a sulfonium salt compound, an iodonium salt compound, imidosulfonate, oxime sulfonate, diazodisulfone, disulfone, and o-nitrobenzyl sulfonate.

Though the present invention is not particularly limited, according to a suitable aspect, the acid generating agent is a sulfonium salt compound and preferably has a triphenylsulfonium cation structure.

Suitable examples of the acid generating agent include compounds that generate acid due to the irradiation with actinic rays or radiations represented by Formula (3).

(3)

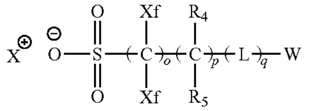

(Anion)

In Formula (3),

Xf's each independently represents a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and $R_4$'s and $R_5$'s in a case where a plurality thereof are present may be identical to or different from each other, respectively.

L represents a divalent linking group, and L's in a case where a plurality thereof are present may be identical to or different from each other.

W represents an organic group including a cyclic structure.

represents an integer of 1 to 3. p represents an integer of 0 to 10. q represents an integer of 0 to 10.

Xf represents a fluorine atom or an alkyl group substituted with at least one fluorine atom. The number of carbon atoms of this alkyl group is preferably 1 to 10 and more preferably 1 to 4. The alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. Particularly, it is preferable that both Xf's are fluorine atoms.

$R_4$ and $R_5$ each independently represent a hydrogen atom, a fluorine atom, alkyl group, or an alkyl group substituted with at least one fluorine atom, $R_4$'s and $R_5$'s in a case where a plurality thereof are present may be identical to or different from each other, respectively.

The alkyl groups as $R_4$ and $R_5$ each may have a substituent, and an alkyl group having 1 to 4 carbon atoms is preferable. $R_4$ and $R_5$ are preferably a hydrogen atom.

Specific examples and suitable aspects of the alkyl group substituted with at least one fluorine atom are the same as those of Xf in Formula (3).

L represents a divalent linking group, and L's in a case where a plurality of L's are present may be identical to or different from each other.

Examples of the divalent linking group include —COO— (—C(═O)—O—), —OCO—, —CONH—, —NHCO—, —CO—, —O—, —S—, —SO—, $—SO_2—$, an alkylene group (preferably having 1 to 6 carbon atoms), a cycloalkylene group (preferably having 3 to 10 carbon atoms), an alkenylene group (preferably having 2 to 6 carbon atoms), or a divalent linking group obtained by combining a plurality thereof. Among these, —COO—, —OCO—, —CONH—, —NHCO—, —CO—, —O—, $—SO_2—$, a —COO— alkylene group-, a —OCO— alkylene group-, a —CONH— alkylene group-, and a —NHCO— alkylene group- are preferable, and —COO—, —OCO—, —CONH—, $—SO_2—$, a —COO— alkylene group-, and a —OCO— alkylene group- are more preferable.

W represents an organic group including a cyclic structure. Among these, a cyclic organic group is preferable.

Examples of the cyclic organic group include an alicyclic group, an aryl group, and a heterocyclic group.

The alicyclic group may be monocyclic or polycyclic. Examples of the monocyclic alicyclic group include a monocyclic cycloalkyl group such as a cyclopentyl group, a cyclohexyl group, and a cyclooctyl group. Examples of the polycyclic alicyclic group include a polycyclic cycloalkyl group such as a norbornyl group, a tricyclodecanyl group, a tetracyclodecanyl group, a tetracyclododecanyl group, and an adamantyl group. Among these, an alicyclic group having a bulky structure having 7 or more carbon atoms such as a norbornyl group, a tricyclodecanyl group, a tetracyclodecanyl group, a tetracyclododecanyl group, and an adamantyl group is preferable, in view of suppressing diffusibility in the film in the PEB (heating after exposure) step and improvement of a Mask Error Enhancement Factor (MEEF).

The aryl group may be monocyclic or polycyclic. Examples of the aryl group include a phenyl group, a naphthyl group, a phenanthryl group, and an anthryl group. Among these, a naphthyl group having a relatively low light absorbance at 193 nm is preferable.

The heterocyclic group may be monocyclic or polycyclic, but polycyclic can further suppress diffusion of acid. The heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, a sultone ring, and a decahydroisoquinoline ring. The heterocyclic ring in the heterocyclic group is particularly preferably a furan ring, a thiophene ring, a pyridine ring, or a decahydroisoquinoline ring. Examples of the lactone ring and the sultone ring include a lactone structure and a sultone structure exemplified in the above resins.

The cyclic organic group may have a substituent. Examples of the substituent includes an alkyl group (may be any one of a linear group or a branched group and preferably having 1 to 12 carbon atoms), a cycloalkyl group (may be either any one of a monocyclic ring, a polycyclic ring, or a spiro ring and preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic acid ester group. Carbon constituting the cyclic organic group (carbon contributing to ring formation) may be carbonyl carbon.

o represents an integer of 1 to 3. p represents an integer of 0 to 10. q represents an integer of 0 to 10.

According to an aspect, it is preferable that, in Formula (3), o is an integer of 1 to 3, p is an integer from 1 to 10, and q is 0. Xf is preferably a fluorine atom, and both of $R_4$ and $R_5$ are preferably hydrogen atoms, and W is preferably a polycyclic hydrocarbon group. o is more preferably 1 or 2, and even more preferably 1. p is more preferably an integer of 1 to 3, more preferably 1 or 2, and particularly preferably 1. W is more preferably a polycyclic cycloalkyl group and even more preferably an adamantyl group or a diamantyl group.

(Cation)

In Formula (3), $X^+$ represents a cation.

$X^+$ is not particularly limited as long as it is a cation, but as a suitable aspect, for example, a cation (a moiety other than Z) in Formula (ZI) described below can be mentioned.

Suitable aspects of the acid generating agent include compounds represented by Formulae (ZI), (ZII), and (ZIII).

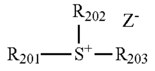

(ZI)

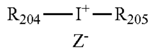

(ZII)

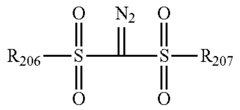

(ZIII)

In Formula (ZI), $R_{201}$, $R_{202}$, and $R_{203}$ each independently represent organic groups.

The number of carbon atoms of the organic group as $R_{201}$, $R_{202}$, and $R_{203}$ is generally 1 to 30 and preferably 1 to 20.

Any two of $R_{201}$ to $R_{203}$ may be bonded to each other to form a ring structure and may contain an oxygen atom, a sulfur atom, an ester bond, an amide bond, or a carbonyl group in the ring. Examples of the group obtained by bonding any two of $R_{201}$ to $R_{203}$ include an alkylene group (for example, a butylene group and a pentylene group).

In Formulae (ZII) and (ZIII), $R_{204}$ to $R_{207}$ each independently represent an organic group.

The organic groups of $R_{204}$ to $R_{207}$ each are preferably an aryl group, an alkyl group, or a cycloalkyl group. The aryl groups of $R_{204}$ to $R_{207}$ may be aryl groups each having a heterocyclic structure having an oxygen atom, a nitrogen atom, a sulfur atom, or the like. The alkyl group and cycloalkyl group of $R_{204}$ to $R_{207}$ each are preferably a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group). For example, the organic groups of $R_{204}$ to $R_{207}$ may have an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group, as a substituent.

$Z^-$ represents an anion, preferably represents an anion in Formula (3), that is, preferably represents the anion below.

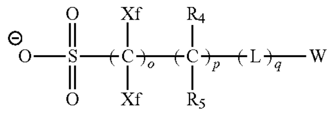

Xf, $R_4$, $R_5$, L, W, o, p, and q are identical to Xf, $R_4$, $R_5$, L, W, o, p, and q in Formula (3), respectively.

A plurality of Xf's, $R_4$ in a case where a plurality thereof are present, $R_5$ in a case where a plurality thereof are present, and L's in a case where a plurality thereof are present may be identical to or different from each other, respectively.

In the anion in Formula (3), examples of the combination of partial structures other than W include $SO_3^-$—$CF_2$—$CH_2$—OCO—, $SO_3^-$—$CF_2$—CHF—$CH_2$—OCO—, $SO_3^-$—$CF_2$—OCO—, $SO_3^-$—$CF_2$—$CF_2$—$CH_2$—, and $SO_3^-$—$CF_2$—$CH(CF_3)$—OCO—, as preferable combinations.

The acid generating agent (including a specific acid generating agent and the same is applied below.) may have an aspect of a low molecular weight compound or may have an aspect of being incorporated into a part of the polymer. The aspect of a low molecular weight compound and the aspect of being incorporated in a part of a polymer may be used in combination.

In a case where the acid generating agent is in the aspect of a low molecular weight compound, the molecular weight is preferably 3,000 or less, more preferably 2,000 or less, and even more preferably 1,000 or less.

In a case where the acid generating agent is in an aspect of being incorporated into a part of the polymer, the acid generating agent may be incorporated in a part of the resin (A) as described above or may be incorporated in a resin different from the resin (A).

The acid generating agents can be synthesized by well-known methods, and can be synthesized, for example, by a method disclosed in JP2007-161707A.

The acid generating agent may be used singly, or two or more types thereof may be used in combination.

The content (a sum thereof in a case where there are a plurality of kinds) of the acid generating agent in the composition is preferably 0.1 to 30 mass %, more preferably 0.5 to 25 mass %, even more preferably 3 to 20 mass %, and particularly preferably 3 to 15 mass % based on the total solid content of the composition.

Hydrophobic Resin

The resist composition may contain a hydrophobic resin (hereinafter, referred to as the "hydrophobic resin (D)" or simply as the "resin (D)"). It is preferable that the hydrophobic resin (D) is different from the resin (A).

It is preferable that the hydrophobic resin (D) is designed to be unevenly distributed on the interface as described above, but, differently from the surfactant, a hydrophilic group does not need to be included in the molecule and may not contribute to the even mixture of the polar/non-polar materials.

Examples of the effect of adding the hydrophobic resin include control a static and/or dynamic contact angle of a resist film surface against water, improvement of the immersion fluid conformability, and the suppression of outgas.

In view of the uneven distribution on the film surface, the hydrophobic resin (D) preferably includes any one or more types of a "fluorine atom", a "silicon atom", and a "$CH_3$ partial structure contained in a side chain portion of the resin" and more preferably includes two or more types thereof.

In a case where the hydrophobic resin (D) includes a fluorine atom and/or a silicon atom, the fluorine atom and/or the silicon atom in the hydrophobic resin (D) may be included in the main chain of the resin and may be included in the side chain.

In the case where the hydrophobic resin (D) includes a fluorine atom, the partial structure having a fluorine atom is preferably a resin having an alkyl group having a fluorine atom, a cycloalkyl group having a fluorine atom, or an aryl group having a fluorine atom.

The alkyl group (preferably having 1 to 10 carbon atoms and more preferably having 1 to 4 carbon atoms) having a fluorine atom is a linear or branched alkyl group in which at least one hydrogen atom is substituted with a fluorine atom and may further have a substituent other than the fluorine atom.

The cycloalkyl group having a fluorine atom and the aryl group having a fluorine atom are respectively a cycloalkyl group in which one hydrogen atom is substituted with a fluorine atom and an aryl group having a fluorine atom, and may further have a substituent in addition to the fluorine atom.

Preferable examples of the alkyl group having a fluorine atom, the cycloalkyl group having a fluorine atom, and the aryl group having a fluorine atom include groups represented by the Formulae (F2) to (F4), but the present invention is not limited thereto.

(F2)

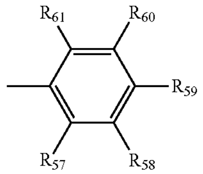

(F3)

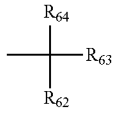

-continued (F4)

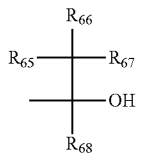

In Formulae (F2) to (F4), $R_{57}$ to $R_{68}$ each independently represent a hydrogen atom, a fluorine atom, or a (linear or branched) alkyl group. At least one of $R_{57}$, . . . , or $R_{61}$, at least one of $R_{62}$, . . . , or $R_{64}$, and at least one of $R_{65}$, . . . , or $R_{68}$ each independently represent a fluorine atom or an alkyl group in which at least one hydrogen atom is substituted with a fluorine atom (preferably having 1 to 4 carbon atoms).

All of $R_{57}$ to $R_{61}$ and $R_{65}$ to $R_{67}$ are preferably fluorine atoms. $R_{62}$, $R_{63}$, and $R_{68}$ are preferably an alkyl group (preferably having 1 to 4 carbon atoms) at least one hydrogen atom is substituted with a fluorine atom and more preferably a perfluoroalkyl group having 1 to 4 carbon atoms. $R_{62}$ and $R_{63}$ may be linked to each other to form a ring.

The hydrophobic resin (D) may contain a silicon atom. A partial structure having a silicon atom is preferably a resin having an alkylsilyl structure (preferably a trialkylsilyl group) or a cyclic siloxane structure.

Examples of the repeating units having a fluorine atom or a silicon atom include repeating units exemplified in [0519] of US2012/0251948A1.

As described above, it is also preferable that the hydrophobic resin (D) includes a $CH_3$ partial structure in the side chain moiety.

Here, the $CH_3$ partial structure of the side chain moiety in the hydrophobic resin (D) (hereinafter also simply referred to as a "side chain $CH_3$ partial structure") includes the $CH_3$ partial structure included in the ethyl group, the propyl group, or the like.

Meanwhile, a methyl group directly bonded to the main chain of the hydrophobic resin (D) (for example, an α-methyl group of a repeating unit having a methacrylic acid structure) is not included in the $CH_3$ partial structure in the present specification because contribution to uneven distribution on the surface of the hydrophobic resin (D) is small due to the influence of the main chain.

More specifically, this is a case where the hydrophobic resin (D) is a repeating unit derived from a monomer having a polymerizable site having a carbon-carbon double bond, such as a repeating unit represented by Formula (M), and in a case where $R_{11}$ to $R_{14}$ are $CH_3$ "itself", $CH_3$ is not included in the $CH_3$ partial structure of the side chain moiety.

Meanwhile, the $CH_3$ partial structure that is present from the C—C main chain via a certain atom corresponds to the $CH_3$ partial structure. For example, in a case where Ru is an ethyl group ($CH_2CH_3$), one $CH_3$ partial structure is provided.

(M)

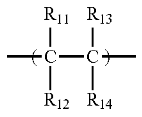

In Formula (M), $R_{11}$ to $R_{14}$ each independently represent a side chain moiety.

Examples of $R_{11}$ to $R_{14}$ of the side chain moiety include a hydrogen atom and a monovalent organic group.

Examples of the monovalent organic group of $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and these groups may further have a substituent.

The hydrophobic resin (D) is preferably a resin having a repeating unit having a $CH_3$ partial structure in a side chain moiety and more preferably has at least one repeating unit (x) of a repeating unit represented by Formula (II) and a repeating unit represented by Formula (III), as such a repeating unit.

Hereinafter, the repeating unit represented by Formula (II) will be described in detail.

(II)

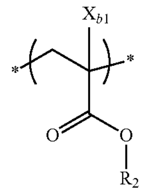

In Formula (II), $X_{b1}$ represents a hydrogen atom, an alkyl group, a cyano group, or a halogen atom, $R_2$ represents an organic group that has one or more $CH_3$ partial structures and that is stable to an acid. Here, more specifically, the organic group that is stable to acid is preferably an organic group not having an "acid-decomposable group" described for the resin (A).

The alkyl group of $X_{b1}$ is preferably a group having 1 to 4 carbon atoms, and examples thereof include a methyl group, an ethyl group, a propyl group, a hydroxymethyl group, or a trifluoromethyl group, but a methyl group is preferable.

$X_{b1}$ is more preferably a hydrogen atom or a methyl group.

Examples of $R_2$ include an alkyl group, a cycloalkyl group, an alkenyl group, a cycloalkenyl group, an aryl group, and an aralkyl group each having one or more $CH_3$ partial structures. The cycloalkyl group, the alkenyl group, the cycloalkenyl group, the aryl group, and the aralkyl group each may further have an alkyl group as a substituent.

$R_2$ is preferably an alkyl group or an alkyl-substituted cycloalkyl group each having one or more $CH_3$ partial structures.

The organic group as $R_2$ that has one or more $CH_3$ partial structures and that is stable to acid preferably has 2 to 10 $CH_3$ partial structures and more preferably 2 to 8 $CH_3$ partial structures.

Preferably specific examples of the repeating unit represented by Formula (II) are provided below. The present invention is not limited to this.

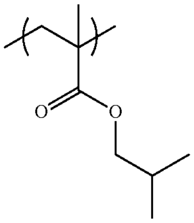
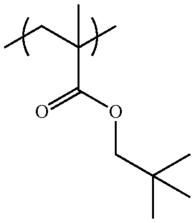
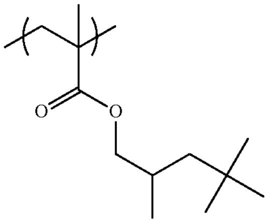
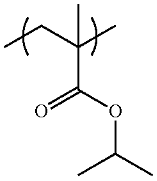
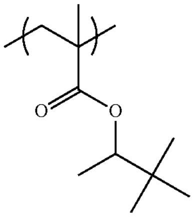
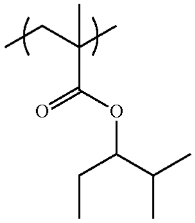
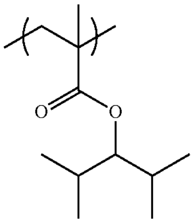
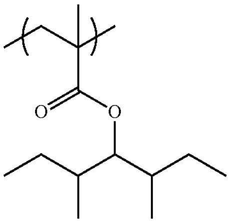
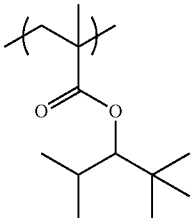
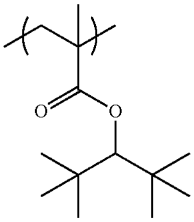
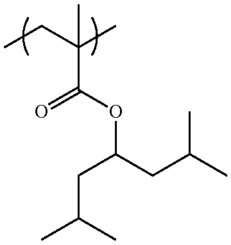
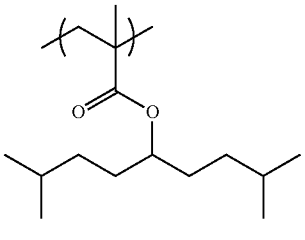
-continued
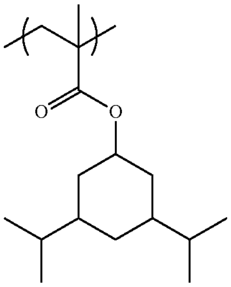
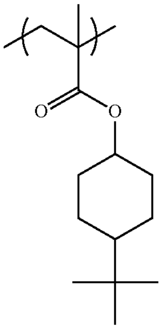
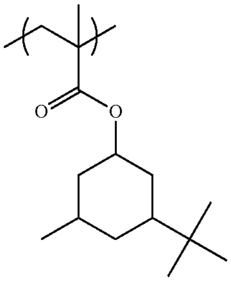
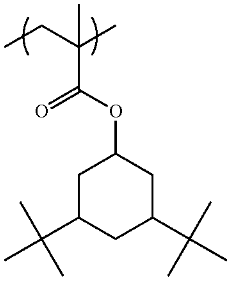
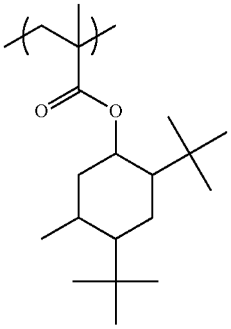
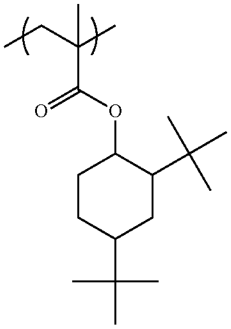
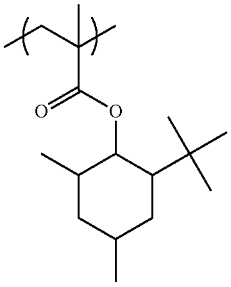
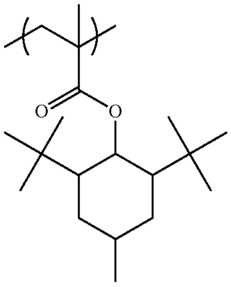
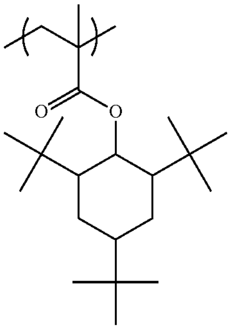
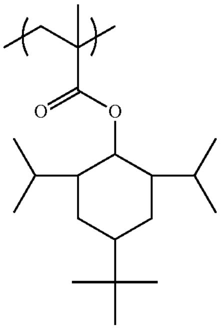

-continued

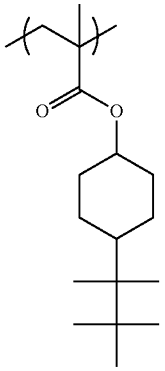

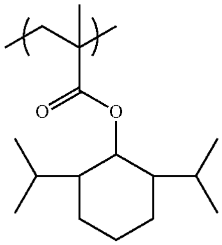

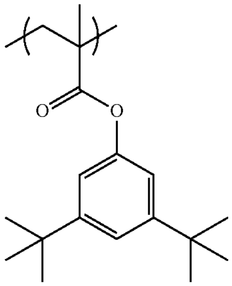

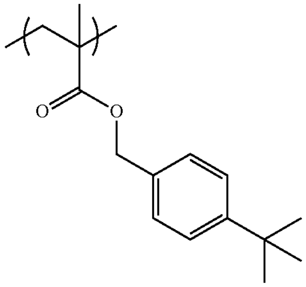

The repeating unit represented by Formula (II) is preferably a repeating unit that is stable to acid (non-acid-decomposable). Specifically, it is preferable that the repeating unit is a repeating unit not having a group that is decomposed due to an action of an acid and generates a polar group.

Hereinafter, the repeating unit represented by Formula (III) is described in detail.

(III)

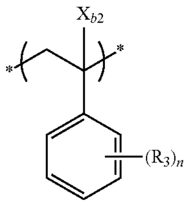

In Formula (III), $X_{b2}$ represents a hydrogen atom, an alkyl group, a cyano group, or a halogen atom, $R_3$ represents an organic group that has one or more $CH_3$ partial structures and that is stable to acid, and n is an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group.

$X_{b2}$ is preferably a hydrogen atom.

Since $R_3$ is an organic group that is stable to acid, more specifically, the organic group that does not have the "acid-decomposable group" described in the resin (A) is preferable.

Examples of $R_3$ include an alkyl group having one or more $CH_3$ partial structures.

The organic group as $R_3$ that has one or more $CH_3$ partial structures and that is stable to an acid preferably has 1 to 10 $CH_3$ partial structures, more preferably 1 to 8 $CH_3$ partial structures, and even more preferably 1 to 4 $CH_3$ partial structures.

n represents an integer of 1 to 5, more preferably an integer of 1 to 3, and even more preferably 1 or 2.

Preferable specific examples of the repeating unit represented by Formula (III) are provided below. The present invention is not limited thereto.

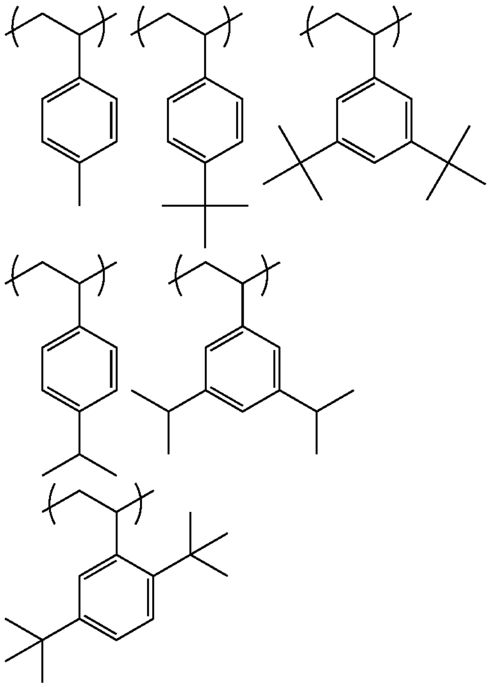

The repeating unit represented by Formula (III) is preferably a repeating unit that is stable to an acid (non-acid-decomposable). Specifically, it is preferable that the repeating unit is a repeating unit not having a group that is decomposed due to an action of an acid and generates a polar group.

In the case where the hydrophobic resin (D) contains a $CH_3$ partial structure in the side chain moiety and particularly does not have a fluorine atom and a silicon atom, the content of the at least one repeating unit (x) of the repeating unit represented by Formula (II) and the repeating unit represented by Formula (III) is preferably 90 mol % or more and more preferably 95 mol % or more with respect to the total repeating units of the hydrophobic resin (D). The content is generally 100 mol % or less with respect to the total repeating units of the hydrophobic resin (D).

In a case where the hydrophobic resin (D) contains 90 mol % or more of the at least one repeating unit (x) of the repeating unit represented by Formula (II) and the repeating unit represented by Formula (III) with respect to the total repeating units of the hydrophobic resin (D), it is possible to increase the surface free energy of the hydrophobic resin (D). As a result, the hydrophobic resin (D) is hardly unevenly distributed on the surface of the resist film, and a static and/or dynamic contact angle of the resist film against water is securely improved, so as to improve the immersion fluid conformability.

Even in a case where (i) a fluorine atom and/or a silicon atom is included or in a case where (ii) a $CH_3$ partial structure is included in a side chain moiety, the hydrophobic resin (D) may have at least one group selected from the group of (x) to (z) as below:

(x) an acid group;

(y) a group having a lactone structure, an acid anhydride group, or an acid imide group; and (z) a group that is decomposed by an action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl) (alkylcarbonyl) methylene group, an (alkylsulfonyl) (alkylcarbonyl) imide group, a bis(alkylcarbonyl) methylene group, a bis(alkylcarbonyl) imide group, a bis(alkylsulfonyl) methylene group, a bis(alkylsulfonyl) imide group, a tris(alkylcarbonyl) methylene group, and a tris(alkylsulfonyl) methylene group.

Preferable examples of the acid group include a fluorinated alcohol group (preferably hexafluoroisopropanol), a sulfonimide group, and a bis(alkylcarbonyl) methylene group.

Examples of the repeating unit having the acid group (x) include a repeating unit in which an acid group is directly bonded to a main chain of a resin such as a repeating unit of acrylic acid or methacrylic acid or a repeating unit in which an acid group is bonded to a main chain of a resin via a linking group. A polymerization initiator having an acid group or a chain transfer agent can be used at the time of polymerization to be introduced into a terminal of the polymer chain. All the cases are preferable. The repeating unit having the acid group (x) may have at least one of a fluorine atom or a silicon atom.

The content of the repeating unit having the acid group (x) is preferably 1 to 50 mol %, more preferably 3 to 35 mol %, and even more preferably 5 to 20 mol % with respect to the total repeating units in the hydrophobic resin (D).

Specific examples of the repeating unit having the acid group (x) are shown below, but the present invention is not limited thereto. In the formula, Rx represents a hydrogen atom, $CH_3$, $CF_3$, or $CH_2OH$.

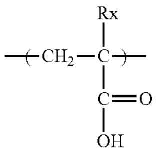

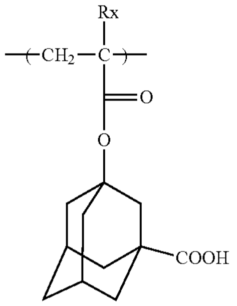

-continued

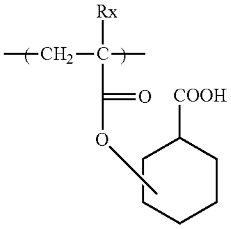

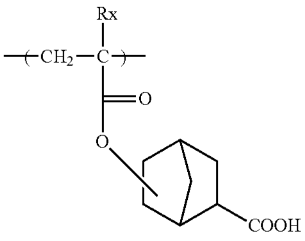

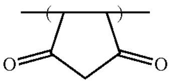

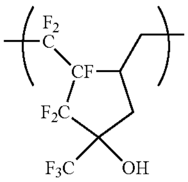

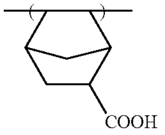

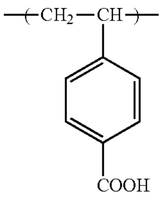

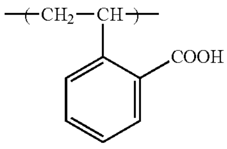

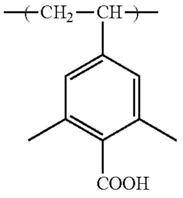

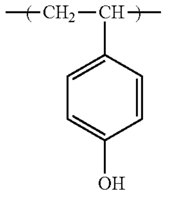

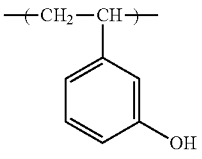

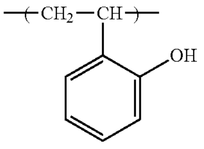

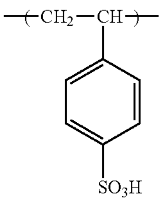

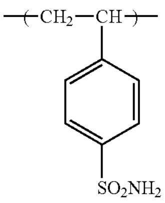

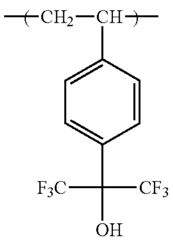

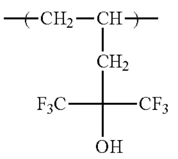

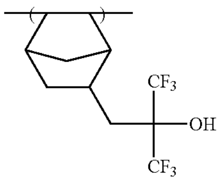

-continued

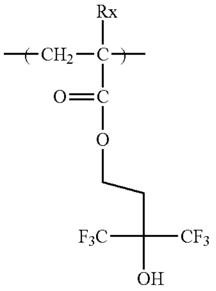

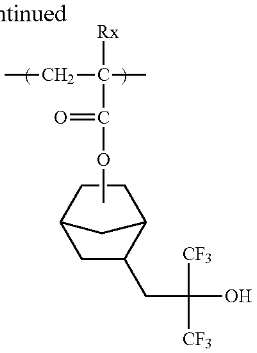

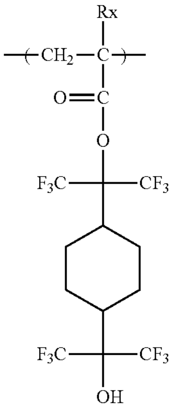

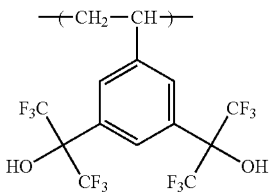

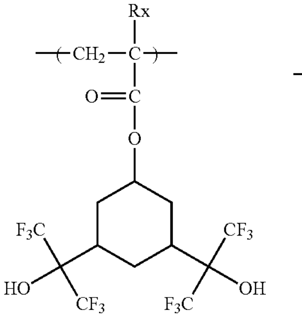

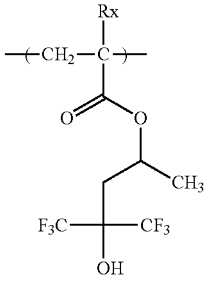

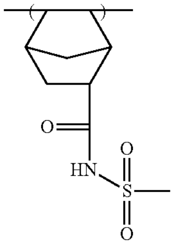

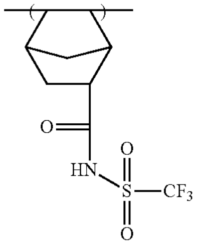

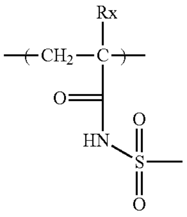

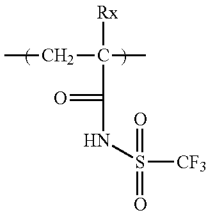

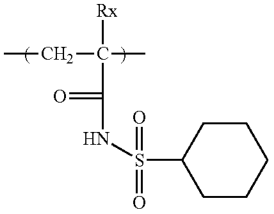

-continued

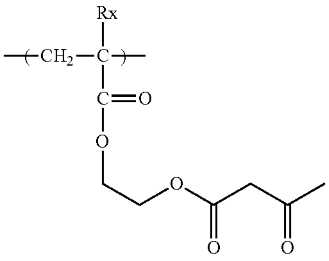

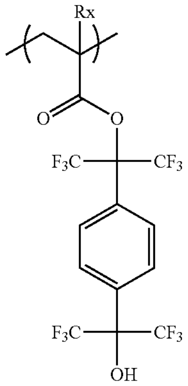

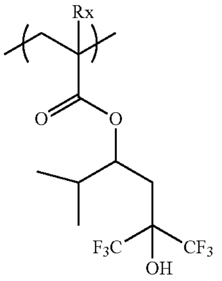

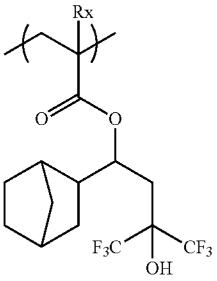

The group having a lactone structure, the acid anhydride group, or the acid imide group (y) are particularly preferably a group having a lactone structure.

For example, the repeating unit including these groups is a repeating unit in which this group is directly bonded to a main chain of a resin such as a repeating unit of acrylic acid ester and methacrylic acid ester. The repeating unit may be a repeating unit in which this group is bonded to a main chain of a resin via a linking group. This repeating unit may be introduced at a terminal of a resin by using a polymerization initiator or a chain transfer agent having this group at the time of polymerization.

Examples of the repeating unit having a group having a lactone structure include repeating units which are the same as the repeating units having a lactone structure described in the section of the resin (A) above.

The content of the repeating unit having the group having a lactone structure, the acid anhydride group, or the acid imide group (y) is preferably 1 to 100 mol %, more preferably 3 to 98 mol %, and still more preferably 5 to 95 mol % based on the total repeating units in the hydrophobic resin (D).

Examples of the repeating unit having the group (z) which is decomposed by the action of an acid in the hydrophobic resin (D) include repeating units which are the same as the repeating units having an acid-decomposable group as provided as the resin (A). The repeating unit having the group (z) which is decomposed by the action of an acid may have at least one of a fluorine atom or a silicon atom. In the hydrophobic resin (D), the content of the repeating unit having the group (z) which is decomposed due to the action of an acid is preferably 1 to 80 mol %, more preferably 10 to 80 mol %, and even more preferably 20 to 60 mol % with respect to the total repeating units in the resin (D).

The hydrophobic resin (D) may further have a repeating unit different from the repeating unit described above.

The repeating unit containing a fluorine atom is preferably 10 to 100 mol % and more preferably 30 to 100 mol % with respect to the total repeating units included in the hydrophobic resin (D). The repeating unit including a silicon atom is preferably 10 to 100 mol % and more preferably 20 to 100 mol % with respect to the total repeating units included in the hydrophobic resin (D).

Meanwhile, particularly, in a case where the hydrophobic resin (D) includes a $CH_3$ partial structure in a side chain moiety, an aspect in which the hydrophobic resin (D) does not substantially contain a fluorine atom and a silicon atom is also preferable. Also, it is preferable that the hydrophobic resin (D) is substantially constituted only by repeating units constituted only by atoms selected from a carbon atom, an oxygen atom, a hydrogen atom, a nitrogen atom, and a sulfur atom.

The weight-average molecular weight of the hydrophobic resin (D) in terms of standard polystyrene is preferably in the range of 1,000 to 100,000 and more preferably in the range of 1,000 to 50,000.

The hydrophobic resin (D) may be used singly, or two or more types thereof may be used in combination.

The content of the hydrophobic resin (D) in the composition is preferably in the range of 0.01 to 10 mass % and more preferably in the range of 0.05 to 8 mass % with respect to the total solid content in the composition.

In the hydrophobic resin (D), the residual monomer or oligomer components are preferably in the range of 0.01 to 5 mass % and more preferably in the range of 0.01 to 3 mass %. The molecular weight distribution (Mw/Mn, also referred to as a "dispersion degree") is preferably in the range of 1 to 5 and more preferably in the range of 1 to 3.

As the hydrophobic resin (D), various kinds of commercially available products may be used, or the hydrophobic resin (D) may be synthesized by a usual method (for example, radical polymerization).

Acid Diffusion Control Agent

The resist composition preferably contains an acid diffusion control agent. The acid diffusion control agent functions as a quencher which traps an acid generated from an acid generating agent or the like at the time of exposure and suppresses the reaction of the acid-decomposable resin at an unexposed portion due to the excess generated acid. As the acid diffusion control agent, a basic compound, a low molecular weight compound that has a nitrogen atom and has a group that is released due to an action of an acid, a basic compound of which basicity decreases or disappears due to irradiation with an actinic ray or radiation, or an onium salt which becomes a weak acid relative to an acid generating agent may be used.

Preferable examples of the basic compound include compounds having structures indicated in Formulae (A) to (E).

(A)

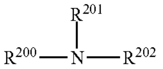

(B)

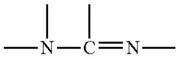

(C)

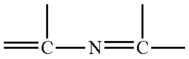

(D)

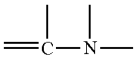

-continued (E)

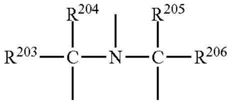

In Formulae (A) and (E), $R^{200}$, $R^{201}$, and $R^{202}$ may be identical to or different from each other, and represent hydrogen atoms, alkyl groups (preferably having 1 to 20 carbon atoms), cycloalkyl groups (preferably, having 3 to 20 carbon atoms), or aryl groups (having 6 to 20 carbon atoms). Here, $R^{201}$ and $R^{202}$ may be bonded to each other, so as to form a ring.

$R^{203}$, $R^{204}$, $R^{205}$, and $R^{206}$ may be identical to or different from each other, and each represents an alkyl group having 1 to 20 carbon atoms.

With respect to the alkyl group, the alkyl group having the substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in Formulae (A) and (E) are preferably unsubstituted.

Preferable examples of the compounds include guanidine, aminopyrrolidine, pyrazole, pyrazoline, piperazine, aminomorpholine, aminoalkylmorpholine, and piperidine. More preferable specific examples of the compound include compounds having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond.

Specific examples of the preferable compound include compounds disclosed in <0379> of US2012/0219913A1.

Preferable examples of the basic compound include an amine compound having a phenoxy group, an ammonium salt compound having a phenoxy group, an amine compound having a sulfonic acid ester group, and an ammonium salt compound having a sulfonic acid ester group.

These basic compounds may be used singly or two or more kinds thereof may be used in combination.

The resist composition may not contain the basic compound, but in a case where the resist composition contains the basic compound, the content proportion of the basic compound is generally 0.001 to 10 mass % and preferably 0.01 to 5 mass % with respect to the solid content of the resist composition.

The use ratio of the acid generating agent and the basic compound in the composition is preferably 2.5 to 300, more preferably 5.0 to 200, and even more preferably 7.0 to 150 as the acid generating agent/basic compound (molar ratio).

The low molecular weight compound that has a nitrogen atom and has a group that is released due to an action of an acid (hereinafter, referred to as a "compound (C)") is preferably an amine derivative having a group that is released due to an action of an acid on a nitrogen atom.

The group that is released due to an action of an acid is preferably an acetal group, a carbonate group, a carbamate group, a tertiary ester group, a tertiary hydroxyl group, and a hemiaminal ether group and particularly preferably a carbamate group and a hemiaminal ether group.

The molecular weight of the compound (C) is preferably 100 to 1,000, more preferably 100 to 700, and even more preferably 100 to 500.

The compound (C) may have a carbamate group having a protective group on a nitrogen atom. The protective group constituting the carbamate group can be represented by Formula (d-1).

(d-1)

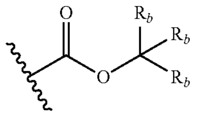

In Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, and the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. The same is applied to the alkoxyalkyl group represented by $R_b$.

$R_b$ is preferably a linear or branched alkyl group, a cycloalkyl group, or an aryl group. Rb is more preferably a linear or branched alkyl group or a cycloalkyl group.

Examples of the ring formed by linking two $R_b$'s to each other include an alicyclic hydrocarbon group, an aromatic hydrocarbon group, a heterocyclic hydrocarbon group, or a derivative thereof.

Examples of the specific structure of the group represented by Formula (d-1) include structures disclosed in <0466> of US2012/0135348A1, but the present invention is not limited thereto.

The compound (C) particularly preferably has a structure represented by Formula (6).

(6)

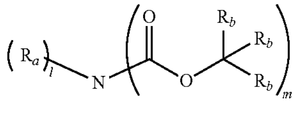

In Formula (6), $R_a$ represents a hydrogen atom, an alkyl group, a cycloalkyl group, an aryl group, or an aralkyl group. In a case where 1 is 2, the two $R_a$'s may be identical to or different from each other, and the two $R_a$'s may be linked to each other to form a heterocyclic ring together with a nitrogen atom in the formula. The heterocyclic ring may include a hetero atom in addition to the nitrogen atom in the formula.

$R_b$ has the same meaning as $R_b$ in Formula (d-1), and preferable examples thereof are also the same.

l represents an integer of 0 to 2, m represents an integer of 1 to 3, and $1+m=3$ is satisfied.

In Formula (6), the alkyl group, the cycloalkyl group, the aryl group, and the aralkyl group as $R_a$ may be substituted with the same groups as those described above as the groups that may be substituted with the alkyl group, the cycloalkyl group, the aryl group, and the aralkyl group as $R_b$.

Specific examples of the alkyl group, the cycloalkyl group, the aryl group, and the aralkyl group of $R_a$ (the alkyl group, the cycloalkyl group, the aryl group, and the aralkyl group may be substituted with the above groups) include the same groups described above as the specific examples for $R_b$.

Specific examples of the particularly preferable compound (C) include compounds disclosed in <0475> of US2012/0135348A1, but the present invention is not limited thereto.

The compound represented by Formula (6) can be synthesized based on JP2007-298569A and JP2009-199021A.

The low molecular weight compound (C) having a group that is released due to an action of an acid on a nitrogen atom can be used singly or two or more kinds thereof may be used in a mixture.

The content of the compound (C) in the composition is preferably 0.001 to 20 mass %, more preferably 0.001 to 10 mass %, and even more preferably 0.01 to 5 mass % based on the total solid content of the composition.

A basic compound (hereinafter sometimes referred to as a "compound (PA)") of which basicity decreases or disappears due to irradiation with an actinic ray or radiation is a compound which has a proton acceptor functional group and is decomposed due to irradiation with actinic rays or radiation and in which proton acceptor properties decrease or disappear or proton acceptor properties change to acidity.

The proton acceptor functional group is a group that can electrostatically interacting with a proton or a functional group having an electron and means, for example, a functional group having a macrocyclic structure such as cyclic polyether or a functional group having a nitrogen atom having an unshared electron pair that does not contribute to π conjugation. The nitrogen atom having an unshared electron pair that does not contribute to π conjugation is, for example, a nitrogen atom having a partial structure represented by the following formula.

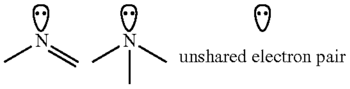

Examples of preferable partial structures of the proton acceptor functional group include crown ether, azacrown ether, primary to tertiary amine, pyridine, imidazole, and pyrazine structures.

The compound (PA) is decomposed due to the irradiation with an actinic ray or radiation to generate a compound in which proton acceptor properties decrease or disappear or proton acceptor properties change to acidity. Here, the decrease or disappearance of the proton acceptor properties or the change from proton acceptor properties to acidity is a change in the proton acceptor properties due to the addition of a proton to the proton acceptor functional group, and specifically means that, in a case where a proton adduct is generated from the compound (PA) having a proton acceptor functional group and a proton, an equilibrium constant in the chemical equilibrium thereof decreases.

The proton acceptor properties can be checked by performing pH measurement.

The acid dissociation constant pKa of the compound generated by decomposing the compound (PA) due to the irradiation with an actinic ray or radiation preferably satisfies $pKa<-1$, more preferably $-13<pKa<-1$, and even more preferably $-13<pKa<-3$.

In the present specification, the acid dissociation constant pKa represents an acid dissociation constant pKa in an aqueous solution and is described in, for example, Chemical Handbook (II) (revised 4th edition, 1993, edited by The Chemical Society of Japan, Maruzen Co., Ltd.), and the lower the value, the higher the acid strength is. Specifically, the acid dissociation constant pKa in an aqueous solution can be actually measured by measuring an acid dissociation constant at 25° C. by using an infinitely diluted aqueous solution, and the Hammett's substituent constant and the value based on the database of values in the well-known documents can also be obtained by calculation by using a software package 1 below. All of the pKa values described in the present specification refer to values obtained by calculation by using this software package.

Software package 1: Advanced Chemistry Development (ACD/Labs) Software V8.14 for Solaris (1994-2007 ACD/Labs).

The compound (PA) generates, for example, a compound represented by the Formula (PA-1) as the proton adduct generated by the decomposition due to the irradiation with an actinic ray or radiation. The compound represented by Formula (PA-1) is a compound that has an acidic group together with a proton acceptor functional group such that the proton acceptor properties decrease or disappear compared with the compound (PA) or proton acceptor properties change to acidity.

$$Q—A—(X)_n—B—R \quad (PA\text{-}1)$$

In Formula (PA-1),

Q represents $—SO_3H$, $—CO_2H$, or $—W_1NHW_2R_f$. Here, $R_f$ represents an alkyl group (preferably having 1 to 20 carbon atoms), a cycloalkyl group (preferably having 3 to 20 carbon atoms), or an aryl group (preferably having 6 to 30 carbon atoms), and $W_1$ and $W_2$ each independently represent $—SO_2—$ or $—CO—$.

A represents a single bond or a divalent linking group.

X represents $—SO_2—$ or $—CO—$.

n represents 0 or 1.

B represents a single bond, an oxygen atom, or $—N(R_x)R_y—$. Here, $R_x$ represents a hydrogen atom or a monovalent organic group, and $R_y$ represents a single bond or a divalent organic group. $R_x$ may be bonded to $R_y$ to form a ring, and may be bonded to R to form a ring.

R represents a monovalent organic group having a proton acceptor functional group.

Formula (PA-1) is more specifically described.

The divalent linking group in A is preferably an alkylene group having at least one fluorine atom and more preferably a perfluoroalkylene group such as a perfluoroethylene group, a perfluoropropylene group, and a perfluorobutylene group.

Examples of the monovalent organic group in $R_x$ include an alkyl group, a cycloalkyl group, an aryl group, an aralkyl group, and an alkenyl group, and these may further have a substituent.

The alkyl group in $R_x$ is preferably a linear and branched alkyl group having 1 to 20 carbon atoms and may have an oxygen atom, a sulfur atom, or a nitrogen atom in an alkyl chain.

The cycloalkyl group in $R_x$ is preferably a monocyclic or polycyclic cycloalkyl group having 3 to 20 carbon atoms and may have an oxygen atom, a sulfur atom, or a nitrogen atom in the ring.

The aryl group in $R_x$ is preferably an aryl group having 6 to 14 carbon atoms, and examples thereof include a phenyl group and a naphthyl group.

The aralkyl group in $R_x$ is preferably an aralkyl group having 7 to 20 carbon atoms, and examples thereof include a benzyl group and a phenethyl group.

The alkenyl group in $R_x$ is preferably 3 to 20 carbon atoms, and examples thereof include a vinyl group, an allyl group, and a styryl group.

Preferable examples of the divalent organic group in $R_y$ include an alkylene group.

Examples of the ring structure that may be formed by bonding $R_x$ and $R_y$ to each other include a 5-membered to 10-membered ring including a nitrogen atom.

The proton acceptor functional group in R is as described above.

The organic group having this structure is preferably an organic group having 4 to 30 carbon atoms, and examples thereof include an alkyl group, a cycloalkyl group, an aryl group, an aralkyl group, and an alkenyl group.

The alkyl group, the cycloalkyl group, the aryl group, the aralkyl group, and the alkyl group in the alkenyl group and the like including a proton acceptor functional group or an ammonium group in R are the same as the alkyl group and the like described above as $R_x$.

In a case where B is $—N(R_x)R_y—$, it is preferable that R and $R_x$ are bonded to each other to form a ring. The number of carbon atoms forming the ring is preferably 4 to 20, and the ring may be monocyclic or polycyclic and may contain an oxygen atom, a sulfur atom, or a nitrogen atom in the ring.

Examples of the monocyclic structure include a 4-membered to 8-membered ring including a nitrogen atom. Examples of the polycyclic structure include a structure completed by combining two or more monocyclic structures.

$R_f$ in $—W_1NHW_2R_f$ represented by Q is preferably a perfluoroalkyl group having 1 to 6 carbon atoms. At least one of $W_1$ or $W_2$ is preferably $—SO_2—$.

The compound (PA) is preferably an ionic compound. The proton acceptor functional group may be included in either an anion moiety or a cation moiety but is preferably included in an anion moiety.

Preferable examples of the compound (PA) include compounds represented by Formulae (4) to (6).

$$R_f—W_2—N^-—W_1—A—(X)_n—B—R[C]^+ \quad (4)$$

$$R—SO_3^-[C]^+ \quad (5)$$

$$R—CO_2^-[C]^+ \quad (6)$$

In Formulae (4) to (6), A, X, n, B, R, $R_f$, $W_1$, and $W_2$ are the same as those in Formula (PA-1).

$C^+$ indicates a counter cation.

The counter cation is preferably an onium cation. More specifically, preferable examples of the sulfonium cation described as $S^+(R_{201})(R_{202})(R_{203})$ in Formula (ZI) in the acid generating agent include an iodonium cation described as $I^+(R_{204})(R_{205})$ in Formula (ZII).

Specific examples of the compound (PA) include compounds exemplified in <0280> of US2011/0269072A1.

According to the present invention, the compound (PA) other than the compound that generates a compound represented by Formula (PA-1) can be appropriately selected. For example, a compound which is an ionic compound and has a proton acceptor moiety in the cation moiety may be used. More specifically, examples thereof include compounds represented by Formula (7).

(7)

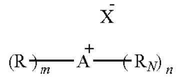

In the formula, A represents a sulfur atom or an iodine atom.

m represents 1 or 2, and n represents 1 or 2. Here, in a case where A is a sulfur atom, m+n=3, and in a case where A is an iodine atom, m+n=2.

R represents an aryl group.

$R_N$ represents an aryl group substituted with a proton acceptor functional group. $X^-$ represents a counter anion.

Specific examples of $X^-$ include those which are the same as the anions of the acid generating agent described above.

Specific examples of the preferable aryl group of R and $R_N$ include a phenyl group.

Specific examples of the proton acceptor functional group included in $R_N$ are the same as the proton acceptor functional groups described in Formula (PA-1).

Specific examples of the ionic compound having a proton acceptor moiety in a cation moiety include compounds exemplified in <0291> of US2011/0269072A1.

The compound can be synthesized with reference to methods described in JP2007-230913A and JP2009-122623A.

The compound (PA) may be used singly or two or more kinds thereof may be used in combination.

The content of the compound (PA) is preferably 0.1 to 10 mass % and more preferably 1 to 8 mass % based on the total solid content of the composition.

In the resist composition, an onium salt which becomes a weak acid relative to the acid generating agent can be used as an acid diffusion control agent.

In the case where an acid generating agent and an onium salt which generates an acid which is relatively weak acid compared with the acid generated from the acid generating agent are mixed to be used, in a case where an acid generated from the acid generating agent due to the irradiation with an actinic ray or radiation collides with an onium salt having an unreacted weak acid anion, a weak acid is released due to salt exchange to generate an onium salt having a strong acid anion. In this process, since a strong acid is exchanged with a weak acid having lower catalytic activity, so that the acid is apparently inactivated and the acid diffusion can be controlled.

The onium salt which becomes a relatively weak acid to the acid generating agent is preferably a compound represented by Formulae (d1-1) to (d1-3).

(d1-1)

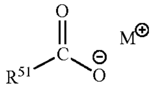

(d1-2)

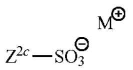

(d1-3)

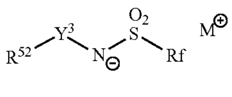

In the formula, $R^{51}$ is a hydrocarbon group which may have a substituent, $Z^{2c}$ is a hydrocarbon group having 1 to 30 carbon atoms which may have a substituent (it is assumed that a fluorine atom is not substituted for the carbon adjacent to S), $R^{52}$ is an organic group, $Y^3$ is a linear, branched, or cyclic alkylene group or arylene group, $R_f$ is a hydrocarbon group including a fluorine atom, and $M^+$ each independently represents a sulfonium or iodonium cation.

Preferable examples of the sulfonium cation or the iodonium cation represented by $M^+$ include sulfonium cations exemplified in Formula (ZI) and iodonium cations exemplified in Formula (ZII).

Preferable examples of the anion moiety of the compound represented by Formula (d1-1) include structures exemplified in paragraph [0198] of JP2012-242799A.

Preferable examples of the anion moiety of the compound represented by Formula (d1-2) include structures exemplified in paragraph [0201] of JP2012-242799A.

Preferable examples of the anion moiety of the compound represented by Formula (d1-3) include structures exemplified in paragraphs [0209] and [0210] of JP2012-242799A.

An onium salt which becomes a relatively weak acid compared with the acid generating agent may be a compound (C) (hereinafter, also referred to as a "compound (CA)") which has a cation moiety and an anion moiety in the same molecule and in which the cation moiety and the anion moiety are linked by a covalent bond.

The compound (CA) is preferably a compound represented by any one of Formulae (C-1) to (C-3).

(C-1)

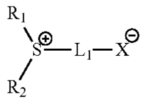

(C-2)

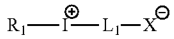

(C-3)

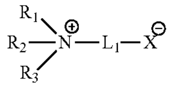

In Formulae (C-1) to (C-3), $R_1$, $R_2$, and $R_3$ each represent a substituent having one or more carbon atoms.

$L_1$ represents a divalent linking group linking the cation moiety and the anion moiety or a single bond.

$—X^-$ represent an anion moiety selected from —COO—, $—SO_3^-$, $—SO_2^-$, and $—N^-—R_4$. $R_4$ is a monovalent substituent having a carbonyl group: —C(═O)—, a sulfonyl group: $—S(═O)_2—$, and a sulfinyl group: —S(═O)— at a connecting site to an adjacent N atom.

$R_1$, $R_2$, $R_3$, $R_4$, and $L_1$ may be bonded to each other to form a ring structure. In(C-3), any two of $R_1$ to $R_3$ may be combined to each other to form a double bond with a N atom.

Examples of the substituent having one or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The substituent is preferably an alkyl group, a cycloalkyl group, and an aryl group.

Examples of $L_1$ as the divalent linking group include a linear or branched alkylene group, a cycloalkylene group, an arylene group, a carbonyl group, an ether bond, an ester bond, an amide bond, a urethane bond, a urea bond, and a group obtained by combining two or more of these groups. $L_1$ is more preferably an alkylene group, an arylene group, an ether bond, an ester bond, or a group formed by combining two or more of these groups.

Preferable examples of the compound represented by Formula (C-1) include compounds exemplified in paragraphs [0037] to [0039] of JP2013-6827A and paragraphs [0027] to [0029] of JP2013-8020A.

Preferable examples of the compound represented by Formula (C-2) include compounds exemplified in paragraphs [0012] to [0013] of JP2012-189977A.

Preferable examples of the compound represented by Formula (C-3) include compounds exemplified in paragraphs [0029] to [0031] of JP2012-252124A.

The content of the onium salt which becomes a relatively weak acid compared with the acid generating agent is preferably 0.5 to 10.0 mass %, more preferably 0.5 to 8.0 mass %, and even more preferably 1.0 to 8.0 mass % based on the solid content of the composition.

The resist composition may contain one or more kinds selected from the acid diffusion control agent described above.

Solvent

The resist composition may contain a solvent.

Examples of the solvent that can be used in preparing the composition include organic solvents such as alkylene glycol monoalkyl ether carboxylate, alkylene glycol monoalkyl ether, lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate, alkyl alkoxyacetate, and alkyl pyruvate.

Specific examples of these solvents include solvents disclosed in <0441> to <0455> of US2008/0187860A.

A mixed solvent obtained by mixing a solvent containing a hydroxyl group in a structure and a solvent not containing a hydroxyl group may be used as the organic solvent.

As the solvent containing a hydroxyl group in a structure and the solvent not containing a hydroxyl group, the example compounds described above can be appropriately selected, but the solvent containing a hydroxyl group is preferably alkylene glycol monoalkyl ether and alkyl lactate and more preferably propylene glycol monomethyl ether (PGME, also known as 1-methoxy-2-propanol), ethyl lactate, and methyl 2-hydroxyisobutyrate. As the solvent not containing a hydroxyl group, alkylene glycol monoalkyl ether acetate, alkyl alkoxy propionate, a monoketone compound that may contain a ring, cyclic lactone, and alkyl acetate are preferable. Among these, propylene glycol monomethyl ether acetate (PGMEA, also referred to as 1-methoxy-2-acetoxypropane), ethyl ethoxypropionate, 2-heptanone, γ-butyrolactone, cyclohexanone, and butyl acetate are particularly preferable, and propylene glycol monomethyl ether acetate, ethyl ethoxypropionate, and 2-heptanone are most preferable.

The mixing ratio (mass) of the solvent containing a hydroxyl group and the solvent not containing a hydroxyl group is preferably 1/99 to 99/1, more preferably 10/90 to 90/10, and even more preferably 20/80 to 60/40. A mixed solvent containing 50 mass % or more of the solvent not containing a hydroxyl group is particularly preferable in view of coating uniformity.

The solvent preferably includes propylene glycol monomethyl ether acetate and is preferably a single solvent of propylene glycol monomethyl ether acetate or a mixed solvent of two or more kinds containing propylene glycol monomethyl ether acetate.

Surfactant

The resist composition may not further contain a surfactant, but in a case where the resist composition contains a surfactant, any one of fluorine-based and/or a silicon-based surfactant (fluorine-based surfactant, silicon-based surfactant, and surfactant having both of fluorine atom and silicon atom) or two or more types thereof are preferably contained.

In a case where the resist composition contains a surfactant, in a case where an exposure light source having 250 nm or lower, particularly 220 nm or lower is used, a resist pattern having adhesive properties and fewer developing defects can be applied at favorable sensitivity and resolutions.

Examples of the fluorine-based and/or silicon-based surfactants include surfactants disclosed in paragraph <0276> of US2008/0248425A.

Surfactants other than fluorine-based and/or silicon-based surfactants disclosed in paragraph <0280> of US2008/0248425A can be used.

These surfactants may be used singly, or several types thereof may be used in combination.

In a case where the resist composition contains a surfactant, the used amount of the surfactant is preferably 0.0001 to 2 mass % and more preferably in the range of 0.0005 to 1 mass % with respect to the total solid content of the composition.

Meanwhile, in a case where the addition amount of the surfactant is 10 ppm or lower with respect to the total amount (except for the solvent) of the resist composition, the uneven distribution properties of the surface of the hydrophobic resin increase, and accordingly, the resist film surface can become more hydrophobic such that it is possible to improve water followability at the time of immersion exposure.

Other Additives

The resist composition may or may not contain a carboxylic acid onium salt.

Examples of the carboxylic acid onium salt include a product disclosed in paragraphs <0605> to <0606> of US2008/0187860A.

These carboxylic acid onium salts can be synthesized by reacting sulfonium hydroxide, iodonium hydroxide, ammonium hydroxide, and carboxylic acid with silver oxide in an appropriate solvent.

In a case where the resist composition contains a carboxylic acid onium salt, the content thereof is generally 0.1 to 20 mass %, preferably 0.5 to 10 mass %, and more preferably 1 to 7 mass % with respect to the total solid content of the composition.

In the resist composition, if necessary, an acid proliferation agent, a dye, a plasticizer, a photosensitizer, a light absorber, an alkali-soluble resin, a dissolution inhibitor, a compound (for example, a phenol compound having a molecular weight of 1,000 or lower, alicyclic or aliphatic compound having a carboxyl group) that promotes solubility in the developer, and the like can be further contained.

The phenol compound having a molecular weight of 1,000 or less can be easily synthesized by those skilled in the art, for example, with reference to methods disclosed in JP1992-122938A (JP-H4-122938A), JP1990-28531A (JP-H2-28531A), US4,916,210A, and EP219294B.

Specific examples of alicyclic or aliphatic compounds having a carboxyl group include a carboxylic acid derivative that has a steroid structure such as cholic acid, deoxycholic acid, and lithocholic acid, an adamantanecarboxylic acid derivative, adamantanedicarboxylic acid, cyclohexanecarboxylic acid, and cyclohexane dicarboxylic acid, but the present invention is not limited thereto.

The concentration of the solid content of the resist composition is generally 1.0 to 10 mass %, preferably 2.0 to 5.7 mass %, and more preferably 2.0 to 5.3 mass %. By causing the concentration of the solid content to be in the above range, the resist solution can be uniformly coated on the substrate, and further, it is possible to form a resist pattern excellent in line width roughness. Although the reason is unclear, it is considered that, by setting the concentration of the solid content to 10 mass % or less and preferably 5.7 mass % or less, the aggregation of the material, particularly, the photoacid generator in the resist solution is suppressed, and as a result, a uniform resist film can be formed.

The concentration of the solid content is a weight percentage of a weight of the other resist components excluding the solvent with respect to the total weight of the composition.

The method of preparing the resist composition is not particularly limited, but it is preferable to dissolve each of the components described above in a predetermined organic solvent and preferably in the above mixed solvent and to perform filter filtration. The pore size of the filter used in the filter filtration is 0.1 μm or lower, more preferably 0.05 μm or lower, and even more preferably 0.03 μm or lower, and preferably made of polytetrafluoroethylene, polyethylene, or nylon. In the filter filtration, for example, as disclosed in JP2002-62667A, cyclical filtration may be performed, or filtration may be performed by connecting plural kinds of filters in series or in parallel. In addition, the composition may be filtrated a plurality of times. Before or after the filter filtration, a deaeration treatment or the like may be performed on the composition.

The resist composition relates to an actinic ray-sensitive or radiation-sensitive resin composition of which properties change in reaction to the irradiation with an actinic ray or radiation. More specifically, the present invention relates to an actinic ray-sensitive or radiation-sensitive resin composition used in a process of manufacturing a semiconductor such as an IC, the manufacturing of a circuit substrate such as a liquid crystal and a thermal head, the manufacturing of a mold structure for imprinting, a photofabrication process, a lithographic printing plate, and an acid curable composition.

[Step (1): Film Forming Step]

An order of the step (1) is not particularly limited, but examples thereof include a method (coating method) of coating a substrate with an actinic ray-sensitive or radiation-sensitive resin composition and performing a curing treatment, if necessary, and a method of forming a resist film on a temporary support and transferring the resist film to a substrate. Among these, in view of excellent productivity, the coating method is preferable.

In the step of forming the film, a pre-wet solvent may be discharged onto a substrate, and the substrate is coated with the actinic ray-sensitive or radiation-sensitive resin composition in a state where the pre-wet solvent remains on the substrate. The method of coating the substrate with the pre-wet solvent is not particularly limited. For example, a substrate may be sucked and fixed on a spinner chuck, a pre-wet solvent is discharged to the substrate at a position in the center of a wafer, and then a liquid film of the pre-wet solvent may be formed by rotating the substrate on the spinner, or a liquid film of the solvent may be formed by coating the substrate with the pre-wet solvent while the substrate is rotated. The formed liquid film may be discontinuous.

[Actinic Ray-Sensitive or Radiation-Sensitive Film (Resist Film)]

The thickness of the resist film is not particularly limited but is preferably 1 to 500 nm and more preferably 1 to 100 nm, since a fine pattern with higher precision can be formed. In a case where coatability and film forming properties are improved by setting the concentration of the solid content in the composition to an appropriate range such that the composition has an appropriate viscosity, the film thickness can be obtained.

[Step (2): Exposing Step]

The step (2) is a step of exposing the actinic ray-sensitive or radiation-sensitive film (resist film) formed in the step (1).

The light used in the exposure is not particularly limited, and examples thereof include an infrared ray, a visible ray, an ultraviolet ray, a far ultraviolet ray, an extreme ultraviolet ray, an X ray, and an electron beam. Examples of the light include a far ultraviolet ray having a wavelength of preferably 250 nm or lower, more preferably 220 nm or lower, and even more preferably 1 to 200 nm.

Specific examples include KrF excimer laser (248 nm), ArF excimer laser (193 nm), F2 excimer laser (157 nm), an X ray, EUV (13 nm), and an electron beam. Among these, KrF excimer laser, ArF excimer laser, EUV, or an electron beam is preferable, and ArF excimer laser is more preferable.

In the exposing step, an immersion exposure method can be applied. The immersion exposure method can be combined with super-resolution techniques such as a phase shift method and a deformed illumination method. The immersion exposure can be performed, for example, by a method described in paragraphs <0594> to <0601> of JP2013-242397A.

In the immersion exposure method, an exposure head scans a wafer at a high speed, forms an exposure pattern, and immersion fluid is required to move on the wafer along the movement of the formation of the exposure pattern. Therefore, the contact angle of the immersion fluid to the resist film in a dynamic state becomes important, and thus the resist requires a performance that follows to the high speed scanning of the exposure head without remaining the liquid droplet.

In a case where the receding contact angle of the resist film formed by using the resist composition is too small, the resist composition cannot be suitably used in the case where exposure is performed through an immersion medium, and the effect of reducing water residue (watermark) defects cannot be sufficiently exhibited. In order to realize a preferable receding contact angle, it is preferable to cause the hydrophobic resin (D) to be included in the composition. Otherwise, an immersion fluid hardly soluble film (hereinafter also referred to as a "top coat") formed by the hydrophobic resin (D) may be provided on the resist film. A top coat may be provided on the resist film including the hydrophobic resin (D). Functions necessary for the top coat are coating suitability to an upper layer portion of the resist film and hardly soluble properties in the immersion fluid. It is preferable that the top coat is not be mixed with the composition film and can be uniformly applied to the upper layer of the composition film.

The top coat is not particularly limited, and a top coat well-known in the related art can be formed by the well-known method in the related art. For example, the top coat can be formed based on the disclosure of paragraphs <0072> to <0082> of JP2014-059543A.

It is also preferable to form a top coat containing a basic compound disclosed in JP2013-61648A on the resist film.

The top coat composition generally includes the hydrophobic resin and the solvent described above.

The solvent that can be used is not particularly limited as long as the solvent dissolves the resin and does not dissolve the resist film. Suitable examples thereof include an alcohol-based solvent, an ether-based solvent, an ester-based solvent, a fluorine-based solvent, and a hydrocarbon-based solvent, and it is more preferable to use a non-fluorine-based alcohol-based solvent. Thereby, the non-solubility in the resist film is further improved, and in a case where the resist film is coated with the top coat composition, the top coat can be formed more uniformly without dissolving the resist film. The viscosity of the solvent is preferably 5 cP (centipoise) or less, more preferably 3 cP or less, even more preferably 2 cP or less, and particularly preferably 1 cP or less. Conversion from centipoise to Pascal second can be performed by the following formula. 1,000 cP=1 Pa·s These solvents may be used singly or two or more kinds thereof may be used in a mixture.

Even in a case where the exposure is performed by a method other than the immersion exposure method, a top coat may be formed on the resist film.

[Step (3): Heat Treatment Step]

In the pattern forming method, after the step (2) and before the step (4) described below, it is preferable that (3) a heat treatment (PEB: Post Exposure Bake) is performed on the actinic ray-sensitive or radiation-sensitive film (resist film) exposed in the step (2). The reaction of an exposure portion is promoted by the present step. A heat treatment (PEB) may be performed a plurality of times.

The temperature of the heat treatment is preferably 70° C. to 130° C. and more preferably 80° C. to 120° C.

The temperature of the heat treatment is preferably 30 to 300 seconds, more preferably 30 to 180 seconds, and more preferably 30 to 90 seconds.

The heat treatment can be performed by means included in general exposing and developing machines and may be performed by using a hot plate or the like.

[Step (4): Developing Step]

A step (4) is a step of developing the exposed actinic ray-sensitive or radiation-sensitive film by using a developer.

Here, the present invention also relates to a pattern forming method including (1) a step of forming an actinic ray-sensitive or radiation-sensitive film with an actinic ray-sensitive or radiation-sensitive resin composition containing a solvent, (2) a step of exposing the actinic ray-sensitive or radiation-sensitive film, and (4) a step of developing the exposed actinic ray-sensitive or radiation-sensitive film by using a developer, and at least one of the actinic ray-sensitive or radiation-sensitive resin composition of the step (1) or the developer of the step (4) is the chemical fluid for manufacturing an electronic material obtained by the method of manufacturing a chemical fluid for manufacturing an electronic material of the present invention.

The developer may be an alkali developer or a developer including an organic solvent.

As an alkali developer, generally, a quaternary ammonium salt represented by tetramethylammonium hydroxide is used, but in addition to this, an alkali aqueous solution of inorganic alkali, primary to tertiary amine, alcohol amine, cyclic amine, or the like can be also used.

Specifically, as the alkali developer, for example, alkali aqueous solutions of inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyl diethylamine; alcohol amines such as dimethylethanolamine and triethanol amine; quaternary ammonium salts such as tetramethylammonium hydroxide and tetraethylammonium hydroxide; cyclic amines such as pyrrole and piperidine; and the like can be used. Among these, an aqueous solution of tetraethylammonium hydroxide is preferably used.

Further, alcohols and a surfactant may be added in an appropriate amount to the alkali developer. The alkali concentration of the alkali developer is generally 0.1 to 20 mass %. pH of the alkali developer is generally 10 to 15.

The time for performing the development by using an alkali developer is generally 10 to 300 seconds.

The alkali concentration (and pH) and the developing time of the alkali developer can be appropriately adjusted according to a pattern to be formed.

As a developer (hereinafter also referred to as an organic developer) including an organic solvent, a polar solvent such as a ketone-based solvent, an ester-based solvent, an alcohol-based solvent, an amide-based solvent, and an ether-based solvent and a hydrocarbon-based solvent can be used. Specifically, in addition to those described in paragraphs <0461> to <0463> of JP2014-048500A, examples thereof include methyl 2-hydroxyisobutyrate, butyl butyrate, isobutyl isobutyrate, butyl propionate, butyl butenate, and isoamyl acetate.

The aliphatic hydrocarbon-based solvent which is a hydrocarbon-based solvent may be a mixture of compounds having the same number of carbon atoms and different structures. For example, in a case where decane is used as the aliphatic hydrocarbon-based solvent, 2-methylnonane, 2,2-dimethyloctane, 4-ethyloctane, isooctane and, the like which are compounds having the same number of carbon atoms and different structures may be included in the aliphatic hydrocarbon-based solvent. The compounds having the same number of carbon atoms and different structures may be included singly, or a plurality of kinds thereof may be included as described above.

The plurality of kinds of the solvents may be mixed or may be mixed with a solvent other than the above or water. The moisture content of the developer as a whole is preferably less than 10 mass %, and it is more preferable that substantially no moisture is contained.

That is, the usage amount of the organic solvent with respect to the organic developer is preferably 90 mass % to 100 mass %, more preferably 95 mass % to 100 mass % with respect to the total amount of the developer.

Particularly, the organic developer is preferably a developer containing at least one kind of organic solvent selected from the group consisting of a ketone-based solvent, an ester-based solvent, an alcohol-based solvent, an amide-based solvent, and an ether-based solvent.

The vapor pressure of the organic developer is preferably 5 kPa or lower, more preferably 3 kPa or lower, and even more preferably 2 kPa or lower at 20° C. In a case where the vapor pressure of the organic developer is 5 kPa or lower, the evaporation of the developer on the substrate or in a development cup is suppressed, and thus the temperature uniformity in the wafer surface increases, and as a result, the dimension uniformity in the wafer surface improves.

An appropriate amount of a surfactant can be added to the organic developer, if necessary.

The surfactant is not particularly limited but, for example, ionic or nonionic fluorine-based and/or silicon-based surfactants and the like can be used. Examples of the fluorine and/or silicon-based surfactants include surfactants disclosed in JP1987-36663A (JP-562-36663A), JP1986-226746A (JP-561-226746A), JP1986-226745A (JP-561-226745A), JP1987-170950A (JP-562-170950A), JP1988-34540A (JP-563-34540A), JP1995-230165A (JP-H07-230165A), JP1996-62834A (JP-H08-62834A), JP1997-54432A (JP-H09-54432A), JP1997-5988A (JP-H09-5988A), US5405720A, US5360692A, US5529881A, US5296330A, US5436098A, US5576143A, US5294511A, and US5824451A. The surfactant is preferably a nonionic surfactant. The nonionic surfactant is not particularly limited, but it is more preferable to use a fluorine-based surfactant or a silicon-based surfactant.

The usage amount of the surfactant is generally 0.001 to 5 mass %, preferably 0.005 to 2 mass %, and more preferably 0.01 to 0.5 mass % with respect to the total amount of the developer.

The organic developer may include a basic compound. Specific examples and preferable examples of the basic compound that can be included in the organic developer used in the present invention are the same as those of the basic compound that can be included in the composition which are described above as the acid diffusion control agent.

As the developing method, for example, a method of immersing a substrate in a tank filled with a developer for a certain period of time (dipping method), a developing method by raising the developer by surface tension on the surface of a substrate for a certain period of time (puddle method), a method of spraying a developer to the surface of a substrate (spraying method), and a method of continuously discharging a developer while scanning a developer discharging nozzle at a constant speed on a substrate rotating at a constant speed (dynamic dispensing method) can be applied. The suitable range of the discharge pressure of the discharged developer and the method of adjusting the discharge pressure of the developer are not particularly limited. For example, ranges and methods disclosed in paragraphs <0631> to <0636> of JP2013-242397A can be used in the present invention.

[Step (5): Washing Step]

The pattern forming method may include, after the step (4), a step (5) of washing the developed actinic ray-sensitive or radiation-sensitive film by using a rinsing solution.

Here, the present invention relates to a pattern forming method including (1) a step of forming an actinic ray-sensitive or radiation-sensitive film with an actinic ray-sensitive or radiation-sensitive resin composition containing a solvent, (2) a step of exposing the actinic ray-sensitive or radiation-sensitive film, (4) a step of developing the exposed actinic ray-sensitive or radiation-sensitive film by using a developer, and (5) a step of washing the developed actinic ray-sensitive or radiation-sensitive film by using a rinsing solution, and at least one of the actinic ray-sensitive or radiation-sensitive resin composition of the step (1), the developer of the step (4), or the rinsing solution of the step (5) is a chemical fluid for manufacturing an electronic material obtained by the method of manufacturing a chemical fluid for manufacturing an electronic material of the present invention.

In a case where the developer in the step (4) is an alkali developer, suitable examples of the rinsing solution in the step (5) include pure water. An appropriate amount of a surfactant may be added to pure water to be used.

After the step (4) or the step (5), a treatment of removing the developer or the rinsing solution deposited to the pattern by a supercritical fluid can be performed.

After a rinsing treatment or a treatment by a supercritical fluid, a heat treatment can be performed in order to remove moisture remaining in the pattern.

In a case where the developer in step (4) is a developer including an organic solvent, the rinsing solution in step (5) is not particularly limited as long as the rinsing solution does not dissolve the resist pattern, and a solution containing a general organic solvent can be used. The rinsing solution preferably contains at least one kind of organic solvent selected from the group consisting of a hydrocarbon-based solvent, a ketone-based solvent, an ester-based solvent, an alcohol-based solvent, an amide-based solvent and an ether-based solvent.

Specific examples of the hydrocarbon-based solvent, the ketone-based solvent, the ester-based solvent, the alcohol-based solvent, the amide-based solvent, and the ether-based solvent include the same solvents as described for the developer including an organic solvent.

It is more preferable to perform a washing step by using a rinsing solution containing at least one organic solvent selected from the group consisting of a ketone-based solvent, an ester-based solvent, an alcohol-based solvent, an amide-based solvent, and a hydrocarbon-based solvent after the developing step by using a developer including an organic solvent, it is even more preferable to perform a washing step by using a rinsing solution containing an alcohol-based solvent or an ester-based solvent, it is particularly preferable to perform a washing step by using a rinsing solution containing monohydric alcohol, and it is most preferable to perform a washing step by using a rinsing solution containing monohydric alcohol having 5 or more carbon atoms.

The rinsing solution containing a hydrocarbon-based solvent is preferably a hydrocarbon compound having 6 to 30 carbon atoms, more preferably a hydrocarbon compound having 8 to 30 carbon atoms, and even more preferably a hydrocarbon compound having 10 to 30 carbon atoms. Among them, by using a rinsing solution including decane and/or undecane, pattern collapse is suppressed.

In a case where an ester-based solvent is used as an organic solvent, (one or more kinds of) a glycol ether-based solvent may be used in addition to the ester-based solvent. Specific examples of this case include using an ester-based solvent (preferably butyl acetate) as a main component and a glycol ether-based solvent (preferably propylene glycol monomethyl ether (PGME)) as an auxiliary component. As a result, residual defects are further suppressed. According to an aspect, a mixed solvent of three kinds of butyl acetate, propylene glycol monomethyl ether, and propylene glycol monomethyl ether acetate is also preferable as the rinsing solution.

Examples of the monohydric alcohol used in the rinsing step include linear, branched, and cyclic monohydric alcohol. Specific examples include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol. As particularly preferable monohydric alcohols having 5 or more carbon atoms, 1-hexanol, 2-hexanol, 4-methyl-2-pentanol, 1-pentanol, and 3-methyl-1-butanol and the like can be used.

A plurality of components may be mixed or may be mixed with an organic solvent other than the above to be used.

The moisture content in the rinsing solution is preferably 10 mass % or less, more preferably 5 mass % or less, and even more preferably 3 mass % or less. In a case where the moisture content is caused to be 10 mass % or less, satisfactory developing characteristics can be obtained.

The vapor pressure of the rinsing solution used in the developing step using a developer including an organic solvent at 20° C. is preferably 0.05 kPa to 5 kPa, more preferably 0.1 kPa to 5 kPa, and even more preferably 0.12 kPa to 3 kPa. By setting the vapor pressure of the rinsing solution to 0.05 kPa to 5 kPa, temperature uniformity in the wafer surface is improved, swelling due to permeation of the rinsing solution is suppressed, dimensional uniformity in the wafer surface becomes satisfactory.

In the pattern forming method, rinsing may be performed between the step (3) and the step (4). As the rinsing solution, a rinsing solution containing at least one kind of organic solvent selected from the group consisting of a hydrocarbon-based solvent, a ketone-based solvent, an ester-based solvent, an alcohol-based solvent, an amide-based solvent, and an ether-based solvent, as described above and an aqueous rinsing solution can be used. Examples of the rinsing solution used for rinsing performed between the post-exposure baking (PEB) step and the developing step include a mixture of a hydrophobic solvent and propylene glycol monomethyl ether acetate disclosed in JP2016-1334A.

An appropriate amount of a surfactant may be added to the rinsing solution to be used.

In the rinsing step, the wafer that has been developed by using a developer including an organic solvent is subjected to a washing treatment by using the above rinsing solution including an organic solvent. The method of washing treatment is not particularly limited, and for example, a method of continuously discharging the rinsing solution to the substrate rotating at a constant speed (spin coating method), a method of immersing a substrate in a tank filled with the rinsing solution for a certain period of time (dipping method), a method of spraying a rinsing solution to the surface of a substrate (spraying method), and the like can be applied. Among these, it is preferable that a washing treatment is performed by a spin coating method, and after washing, the substrate is rotated at the rotation speed of 2,000 rpm to 4,000 rpm, so as to remove the rinsing solution from the substrate. It is also preferable to include a heating step (post bake) after the rinsing step. The developer and the rinsing solution remaining between the patterns and inside the pattern are removed by baking. The heating step after the rinsing step is performed generally at 40° C. to 160° C. and preferably 70° C. to 95° C., and generally for 10 seconds to 3 minutes and preferably 30 seconds to 90 seconds.

In the pattern forming method, a development step (organic solvent developing step) by using a developer including an organic solvent and a development step (alkali development step) by using an alkali aqueous solution may be used in combination. Accordingly, a finer pattern can be formed.

The alkali developer is not particularly limited, but examples thereof include alkali developers disclosed in paragraph <0460> of JP2014-048500A.

A portion of weak exposure intensity is removed by the organic solvent developing step, but by further performing the alkali developing step, a portion with high exposure intensity is also removed. Since the pattern formation can be performed without dissolving only an area of the intermediate exposure intensity by the multiple development process in which the development is performed a plurality of times in this manner, it is possible to form a pattern finer than usual (the same mechanism as in <0077> of JP2008-292975A).

In the pattern forming method, the order of the alkali developing step and the organic solvent developing step is not particularly limited, but it is more preferable that the alkali development is performed before the organic solvent developing step.

A method of improving the surface roughness of the pattern may be applied to the pattern formed by the above method. Examples of a method for improving the surface roughness of the pattern include a method of treating a resist pattern by a plasma of gas containing hydrogen disclosed in WO2014/002808A1. In addition, well-known methods as disclosed in JP2004-235468A, US2010/0020297A, JP2008-83384A, and Proc. of SPIE Vol. 8328 83280N-1 "EUV Resist Curing Technique for LWR Reduction and Etch Selectivity Enhancement" may be applied.

The pattern forming method can be used in a guide pattern formation (for example, see ACS Nano Vol. 4 No. 8 Pages 4815 to 4823) in Directed Self-Assembly (DSA).

The resist pattern formed, for example, by the above method can be used as a core of a spacer process disclosed in JP1991-270227A (JP-H3-270227A) and JP2013-164509A.

The present invention also relates to the method for manufacturing the semiconductor device including the above pattern forming method and a semiconductor device manufactured by the manufacturing method.

The semiconductor device according to the present invention can be appropriately mounted on electric or electronic apparatuses (household electric devices, office automation (OA), or media-related apparatuses, optical apparatuses, telecommunication apparatuses, and the like).

EXAMPLES

Hereinafter, the present invention will be described in more detail with reference to examples, but the present invention is not limited thereto.

Examples 1 to 5 and Comparative Examples 1 to 3 (Examples in which Butyl Acetate was Used as Chemical Fluid)

(Analysis)

(1) SP ICP-MS Analyzer

As the SP ICP-MS analyzer, NexION 350S manufactured by PerkinElmer Inc. was used (as the analysis software as the SP ICP-MS analyzer, a Syngistix nano application module dedicated to nanoparticle analysis "SP-ICP-MS" was used and Syngistix for ICP-MS software was used as analysis software as an ICP-MS analyzer).

(2) Preparation of Standard Substance Solution

Ultrapure water was weighed and introduced into a clean glass container, and gold particles with a median diameter of 50 nm were added so as to have a concentration of 10,000 particles/ml, and the dispersion treated by an ultrasonic washer for 30 minutes was prepared and was used as a standard substance solution for measuring transport efficiency. To prepare a calibration curve for each metal atom, CONOSTAN S-21 Oil mixed standard solution was used.

(3) Preparation of Analysis Standard Solution

As a commercially available chemical fluid, butyl acetate (special grade reagent) manufactured by Wako Pure Chemical Industries, Ltd. was used. In order to adjust the amount of metal impurities, to this commercially available chemical fluid, iron oxide (special grade reagent) manufactured by Wako Pure Chemical Industries, Ltd., copper oxide (special grade reagent) manufactured by Wako Pure Chemical Industries, Ltd., and zinc oxide (special grade reagent) manufactured by Wako Pure Chemical Industries, Ltd. were added respectively in small amounts, at least one of filtration by a filter and distillation was repeated, so as to prepare an analysis standard solution in which the concentration of the particulate metal including an iron atom, the concentration of the particulate metal including a copper atom, and the concentration of the particulate metal including a zinc atom are respectively set as 10 ppb.

(4) Treatment of Reducing Particulate Metal Including Metal Atom

A treatment of reducing particulate metal including a metal atom was performed on the analysis standard solution based on the method presented in Table 1 below to obtain a measurement target solution.

In the treatment of reducing particulate metal, the distillation was performed in a test room of a class 1,000 by using an evaporator.

In the case where the distillation was performed a plurality of times, the chemical fluid after the distillation purification was collected, and further distillation was performed on the collected chemical fluid.

(5) Measurement

In the SP ICP-MS analysis, the measurement target solution was aspirated at 0.2 mL/min by using a coaxial type nebulizer made of tetrafluoroethylene/perfluoroalkyl vinyl ether copolymer (PFA), a quartz cyclone type spray chamber, and a quartz torch injector and that has an inner diameter of 1 mm. The oxygen addition amount was set as 0.1 L/min, the plasma output was set as 1,600 W, the analysis cell was purged with ammonia gas, and the commercially available chemical fluid and the measurement target solution were measured. Analysis was performed at a time resolution of 50 μs. Based on the measurement result of the standard substance solution for measuring transport efficiency, the transport efficiency determined by the analysis, and the measurement result of the ICP standard solution and the calibration curve at each metal atom determined by the analysis, the concentration ($Mp_{Fe}$) of particulate metal including an iron atom, the concentration ($Mp_{cu}$) of particulate metal including a copper atom, and the concentration ($Mp_{zn}$) of particulate metal including a zinc atom of the measurement target solution were measured by using the analysis software.

In the ICP-MS analysis (which is not SP ICP-MS analysis but means a general ICP-MS analysis), except that the analysis software was changed to analysis software as the ICP-MS analyzer, by the same method as in the SP ICP-MS analysis, the concentration ($Mt_{Fe}$) of a component including an iron atom, the concentration ($Mt_{cu}$) of a component including an copper atom, and the concentration ($Mt_{zn}$) including a zinc atom of the measurement target solution were measured.

The measuring results are provided in Table 1.

(6) Evaluation

The number and the addresses of foreign substances having a diameter of 32 nm or more which is present on the surface of a silicon substrate having a diameter of 300 mm were measured in advance by a wafer top surface inspection device SP-5 manufactured by KLA-Tencor Corporation, and then the wafer was set to a spin rotation wafer processing device manufactured by EKC Technology, Inc. The measurement target solution was discharged onto the wafer surface at a flow rate of 1.5 L/min for one minute, and ultrapure water was discharged at a flow rate of 1.5 L/min for 30 seconds for rinsing. The spin drying was performed, the number and the addresses of the foreign substances were again measured with the inspection device SP-5, EDX element analysis was performed on the newly increased foreign substances with a defect analyzing device SEM VISION G6 manufactured by APPLIED MATERIALS, Inc., and foreign substances including metal elements were counted as defects.

The measuring results are provided in Table 1.

TABLE 1

| | Treatment of reducing particulate metal | Fe | | | Cu | | |
|---|---|---|---|---|---|---|---|
| | | Concentration ($Mt_{Fe}$) ppt | Concentration of ionic metal ($Mi_{Fe}$) ppt | Concentration of particulate metal ($Mp_{Fe}$) ppt | Concentration ($Mt_{Cu}$) ppt | Concentration of ionic metal ($Mi_{Cu}$) ppt | Concentration of particulate metal ($Mp_{Cu}$) ppt |
| Example 1 | Analysis standard solution was distilled, then filtrated with PTFE filter having pore size of 10 nm and further filtrated with nylon filter having pore size of 5 nm (so-called multistage filtration method) | 23.0 | 22.2 | 0.79 | 14.4 | 14.3 | 0.13 |
| Example 2 | Analysis standard solution was distilled, and then filtrated with nylon filter having pore size of 5 nm | 20.5 | 19.6 | 0.88 | 12.0 | 11.9 | 0.07 |
| Example 3 | Analysis standard solution was distilled and then filtrated with nylon filter having pore size of 10 nm | 24.0 | 22.0 | 2.00 | 15.9 | 15.6 | 0.33 |
| Example 4 | Analysis standard solution was distilled and then filtrated with PTFE filter having pore size of 10 nm | 23.1 | 21.0 | 2.10 | 15.8 | 15.4 | 0.39 |

TABLE 1-continued

| | | | | | | | |
|---|---|---|---|---|---|---|---|
| Example 5 | Analysis standard solution was distilled three times and then filtrated with polyethylene filter having pore size of 50 nm | 32.6 | 28.0 | 4.60 | 17.7 | 17.6 | 0.10 |
| Example 6 | Commercially available chemical fluid was filtrated with PTFE filter having pore size of 50 nm and further filtrated with nylon filter having pore size of 5 nm, and filtrated with PTFE filter having pore size of 10 nm | 136.9 | 133.8 | 3.10 | 91.3 | 90.1 | 1.20 |
| Comparative Example 1 | Analysis standard solution was filtrated with polyethylene filter having pore size of 20 nm | 411.8 | 358 | 53.8 | 280.9 | 246 | 34.9 |
| Comparative Example 2 | Analysis standard solution was filtrated with polyethylene filter having pore size of 50 nm | 689.3 | 568 | 121.3 | 357.4 | 278 | 79.4 |
| Comparative Example 3 | Commercially available chemical fluid was filtrated with polyethylene filter having pore size of 50 nm | 179.3 | 128.1 | 51.2 | 86.9 | 63.3 | 23.6 |

| | Zn | | | Sum of concen-trations of | Sum of concen-trations of | |
|---|---|---|---|---|---|---|
| | Concen-tration ($Mt_{Zn}$) ppt | Concen-tration of ionic metal ($Mi_{Zn}$) ppt | Concen-tration of particulate metal ($Mp_{Zn}$) ppt | ionic metal of Fe, Cu, and Zn (ΣMi) ppt | particulate metal of Fe, Cu, and Zn (ΣMp) ppt | Number of defects defects/Wafer |
| Example 1 | 2.0 | 1.9 | 0.091 | 38.4 | 1.011 | 0 |
| Example 2 | 1.4 | 1.3 | 0.130 | 32.8 | 1.080 | 2 |
| Example 3 | 1.8 | 1.7 | 0.140 | 39.3 | 2.470 | 14 |
| Example 4 | 4.5 | 3.5 | 0.950 | 39.9 | 3.440 | 23 |
| Example 5 | 4.2 | 4 | 0.180 | 49.6 | 4.880 | 3 |
| Example 6 | 144.9 | 143.6 | 1.300 | 367.5 | 5.600 | 19 |
| Comparative Example 1 | 142.1 | 129 | 13.1 | 733.0 | 101.8 | 159 |
| Comparative Example 2 | 197.3 | 179 | 18.3 | 1025.0 | 219 | 538 |
| Comparative Example 3 | 138.2 | 98.8 | 39.4 | 290.2 | 114.2 | 476 |

From Table 1, in the examples, the sum of the concentration of particulate metal including an iron atom, the concentration of particulate metal including a copper atom, and the concentration of particulate metal including a zinc atom was low (specifically, 100 ppt or less), and excellent results were able to be obtained with respect to the defect number evaluation compared with the comparative examples.

Examples 7 to 14 and Comparative Examples 4 to 5 (Examples in which Alkali Developer was Used as Chemical Fluid)

(1) The SP ICP-MS analyzer and (2) standard substance solutions were prepared by the method of Example 1.

(3) Preparation of Analysis Standard Solution and Adjustment of Amount of Metal impurities An aqueous alkali developer FHD-5 manufactured by Fujifilm Electronics Materials Co., Ltd. was used as an analysis standard solution. In the example of adjusting the amount of metal impurities, a minute amount of the metals standard mixed solution V (Cd, Cr, Se, Pb, As, B, Zn, Al, Cu, and Mn) manufactured by Kanto Chemical Co., Ltd. was added to this analysis standard solution.

(4) Treatment of Reducing Particulate Metal Including Metal Atom

A treatment of reducing particulate metal including a metal atom was performed on the analysis standard solution based on the filtration method by the filter presented in Table 2 to obtain a measurement target solution.

(5) Measurement

The analysis standard solution and the measurement target solution were measured in the same manner as in Example 1.

(6) Evaluation

Evaluation was performed by the same method as in Example 1.

TABLE 2

| | Treatment of reducing particulate metal | Fe: Concentration ($Mt_{Fe}$) ppt | Fe: Concentration of ionic metal ($Mi_{Fe}$) ppt | Fe: Concentration of particulate metal ($Mp_{Fe}$) ppt | Cu: Concentration ($Mt_{Cu}$) ppt | Cu: Concentration of ionic metal ($Mi_{Cu}$) ppt | Cu: Concentration of particulate metal ($Mp_{Cu}$) ppt |
|---|---|---|---|---|---|---|---|
| Example 7 | Analysis standard solution was filtrated with PTFE filter having pore size of 20 nm | 221 | 192 | 29 | 211 | 180 | 31 |
| Example 8 | Analysis standard solution was filtrated with HDPE filter having pore size of 20 nm | 219 | 198 | 21 | 212 | 183 | 29 |
| Example 9 | Analysis standard solution was filtrated with HDPE filter having pore size of 10 nm | 211 | 194 | 17 | 209 | 188 | 21 |
| Example 10 | Analysis standard solution was filtrated with polysulfone filter having pore size of 20 nm | 213 | 195 | 18 | 197 | 175 | 22 |
| Example 11 | Analysis standard solution was filtrated with PTFE filter having pore size of 20 nm and then filtrated with PTFE filter having pore size of 10 nm (so-called mutistage filtration) | 209 | 192 | 17 | 195 | 176 | 19 |
| Example 12 | Analysis standard solution was filtrated with PTFE filter having pore size of 20 nm and then filtrated with HDPE filter having pore size of 10 nm | 193 | 182 | 11 | 189 | 172 | 17 |
| Example 13 | Analysis standard solution was filtrated with PTFE filter having pore size of 20 nm, then filtrated with HDPA filter having pore size of 10 nm, and further filtrated with HDPE filter having pore size of 5 nm | 178 | 171 | 7 | 176 | 167 | 9 |
| Example 14 | Analysis standard solution was contaminated with metals standard mixed solution and then filtrated with PTFE filter having pore size of 20 nm | 403 | 370 | 33 | 332 | 293 | 39 |
| Comparative Example 4 | Analysis standard solution was filtrated with PTFE filter having pore size of 5 μm | 229 | 193 | 36 | 223 | 187 | 36 |
| Comparative Example 5 | Analysis standard solution | 338 | 203 | 135 | 316 | 179 | 137 |

| | Zn: Concentration ($Mt_{Zn}$) ppt | Zn: Concentration of ionic metal ($Mi_{Zn}$) ppt | Zn: Concentration of particulate metal ($Mp_{Zn}$) ppt | Sum of concentrations of ionic metal of Fe, Cu, and Zn (ΣMi) ppt | Sum of concentrations of particulate metal of Fe, Cu, and Zn (ΣMp) ppt | Number of defects defects/Wafer |
|---|---|---|---|---|---|---|
| Example 7 | 211 | 187 | 24 | 559 | 84 | 84 |
| Example 8 | 208 | 185 | 23 | 566 | 73 | 66 |
| Example 9 | 201 | 182 | 19 | 564 | 57 | 49 |
| Example 10 | 206 | 185 | 21 | 555 | 61 | 58 |
| Example 11 | 198 | 180 | 18 | 548 | 54 | 37 |
| Example 12 | 192 | 177 | 15 | 531 | 43 | 29 |
| Example 13 | 188 | 177 | 11 | 515 | 27 | 18 |
| Example 14 | 322 | 296 | 26 | 959 | 98 | 97 |
| Comparative Example 4 | 211 | 180 | 31 | 560 | 103 | 238 |
| Comparative Example 5 | 317 | 191 | 126 | 573 | 398 | 3079 |

* With respect to Examples 12 and 13, each filter was used after being sufficiently washed with the liquid of Example 11.

Examples 15 to 17 and Comparative Examples 6 to 8 (Examples in which PGMEA, Cyclohexanone, and γ-Butyrolactone were Used as Chemical Fluid)

(1) The SP ICP-MS analyzer and (2) standard substance solutions were prepared by the method of Example 1.

(3) Preparation of Analysis Standard Solution and Adjustment of Amount of Metal impurities By using propylene glycol monomethyl ether acetate (PGMEA) (special grade reagent) manufactured by Wako Pure Chemical Industries, Ltd., cyclohexanone (special grade reagent) manufactured by Wako Pure Chemical Industries, Ltd., and γ-butyrolactone (special grade reagent) manufactured by Wako Pure Chemical Industries, Ltd. as analysis standard solution, the analysis standard solution was distilled, and a minute amount of the metals standard mixed solution V (Cd, Cr, Se, Pb, As, B, Zn, Al, Cu, and Mn) manufactured by Kanto Chemical Co., Ltd. was added to this analysis standard solution, so as to adjust the amount of metal impurities.

(4) Treatment of Reducing Particulate Metal Including Metal Atom

A treatment of reducing particulate metal including a metal atom was performed on the analysis standard solution based on the filtration method by the filter presented in Table 3 to obtain a measurement target solution.

(5) Measurement

The measurement target solution was measured by the same method as in Example 1.

(6) Evaluation

Evaluation was performed by the same method as in Example 1.

TABLE 3

| | Types of chemical fluid | Treatment of reducing particulate metal | Fe: Concentration ($Mt_{Fe}$) ppt | Fe: Concentration of ionic metal ($Mi_{Fe}$) ppt | Fe: Concentration of particulate metal ($Mp_{Fe}$) ppt | Cu: Concentration ($Mt_{Cu}$) ppt | Cu: Concentration of ionic metal ($Mi_{Cu}$) ppt | Cu: Concentration of particulate metal ($Mp_{Cu}$) ppt |
|---|---|---|---|---|---|---|---|---|
| Example 15 | PGMEA | Analysis standard solution was distilled, then metals standard mixed solution was added, filtration was performed with PTFE filter having pore size of 20 nm, and then filtration was performed with HDPE filter having pore size of 10 nm | 191 | 178 | 13 | 178 | 166 | 12 |
| Example 16 | Cyclo-hexanone | Analysis standard solution was distilled, then metals standard mixed solution was added, filtration was performed with PTFE filter having pore size of 20 nm, and then filtration was performed with HDPE filter having pore size of 10 nm | 180 | 172 | 8 | 179 | 169 | 10 |
| Example 17 | γ-buty-rolactone | Analysis standard solution was distilled, then metals standard mixed solution was added, filtration was performed with PTFE filter having pore size of 20 nm, and then filtration was performed with HDPE filter having pore size of 10 nm | 201 | 187 | 14 | 198 | 183 | 15 |
| Comparative Example 6 | PGMEA | Analysis standard solution was distilled, then metals standard mixed solution was added, and filtration was performed with PTFE filter having pore size of 50 nm | 238 | 195 | 43 | 211 | 172 | 39 |

TABLE 3-continued

| | | | | | | | | |
|---|---|---|---|---|---|---|---|---|
| Comparative Example 7 | Cyclo-hexanone | Analysis standard solution was distilled, then metals standard mixed solution was added, and filtration was performed with PTFE filter having pore size of 50 nm | 218 | 170 | 48 | 192 | 154 | 38 |
| Comparative Example 8 | γ-buty-rolactone | Analysis standard solution was distilled, then metals standard mixed solution was added, and filtration was performed with PTFE filter having pore size of 50 nm | 211 | 177 | 34 | 247 | 203 | 44 |

| | Zn | | | Sum of concentrations of | Sum of concentrations of | |
|---|---|---|---|---|---|---|
| | Concentration ($Mt_{Zn}$) ppt | Concentration of ionic metal ($Mi_{Zn}$) ppt | Concentration of particulate metal ($Mp_{Zn}$) ppt | ionic metal of Fe, Cu, and Zn (ΣMi) ppt | particulate metal of Fe, Cu, and Zn (ΣMp) ppt | Number of defects defects/Wafer |
| Example 15 | 188 | 173 | 15 | 517 | 40 | 22 |
| Example 16 | 181 | 170 | 11 | 511 | 29 | 19 |
| Example 17 | 195 | 179 | 16 | 549 | 45 | 26 |
| Comparative Example 6 | 217 | 184 | 33 | 551 | 115 | 243 |
| Comparative Example 7 | 191 | 154 | 37 | 478 | 123 | 312 |
| Comparative Example 8 | 238 | 199 | 39 | 579 | 117 | 287 |

From Tables 2 and 3, in the examples, the sum of the concentration of particulate metal including an iron atom, the concentration of particulate metal including a copper atom, and the concentration of particulate metal including a zinc atom was low (specifically, 100 ppt or less), and excellent results were able to be obtained with respect to the defect number evaluation compared with the comparative examples. In the examples, the reduction effect of the particulate metal varied depending on the material or the pore size of the filter, and the combination of the filters in multiple stages.

[Preparation of Actinic Ray-Sensitive or Radiation-Sensitive Resin Composition]

<Preparation of Actinic Ray-Sensitive or Radiation-Sensitive Resin Composition>

The following were used as the actinic ray-sensitive or radiation-sensitive resin composition. The actinic ray-sensitive or radiation-sensitive resin composition was prepared by mixing the respective components and filtrating the respective components with a polyethylene filter having a pore size of 0.03 μm.

Hereinafter, the actinic ray-sensitive or radiation-sensitive resin composition is indicated.

(Actinic Ray-Sensitive or Radiation-Sensitive Resin Composition 1)

An acid-decomposable resin synthesized according to the following synthesis method: 0.77 g Synthesis of Acid-Decomposable Resin According to the following synthesis scheme, 11.9 g of a monomer (1), 8.0 g of a monomer (1-2), 15.1 g of a monomer (1-3), and 1.12 g of polymerization initiator V-601 (manufactured by Wako Pure Chemical Industries, Ltd.) were dissolved in 129.0 g of cyclohexanone to obtain a mixed solution. 69.5 g of cyclohexanone was introduced into a reaction vessel, and the above mixed solution was added dropwise to cyclohexanone in the reaction vessel maintained at 85° C. in a nitrogen gas atmosphere over four hours to obtain a reaction solution. After the reaction solution was stirred while heating for two hours, the reaction solution was allowed to cool to room temperature. 49.6 g of methanol and 4.9 g of triethylamine were added to the reaction solution, the mixture was heated and stirred at 50° C. for 18 hours, and then the reaction solution was allowed to cool to room temperature. 200 g of ethyl acetate and 200 g of water were added to the reaction solution, and a liquid separation operation was performed to collect an organic phase. After the organic phase was washed with water three times, the solvent was distilled off under reduced pressure. The remaining solid was dissolved in 200 g of PGMEA (propylene glycol monomethyl ether acetate), azeotropical dehydration was performed by distilling off the solvent under reduced pressure, and 198.5 g of cyclohexanone was added to obtain a solution. The solution was added dropwise to 2,336 g of a mixed solution of n-heptane and ethyl acetate (n-heptane/ethyl acetate=9/1 (mass ratio)) to precipitate and filtrate the solid. The filtrated solid was washed with 701 g of a mixed solution of n-heptane and ethyl acetate (n-heptane/ethyl acetate=9/1 (mass ratio)). Thereafter, the washed solid was dried under reduced pressure to obtain 23.8 g of a resin (A-1). From $^1$H-NMR and $^{13}$C-NMR, the compositional ratio in the resin was calculated by a repeating unit (a)/a repeating unit (c)/a repeating unit (b)=30/20/50 (molar ratio). In the scheme, the synthesis method of the resin is expressed in a simplified manner.

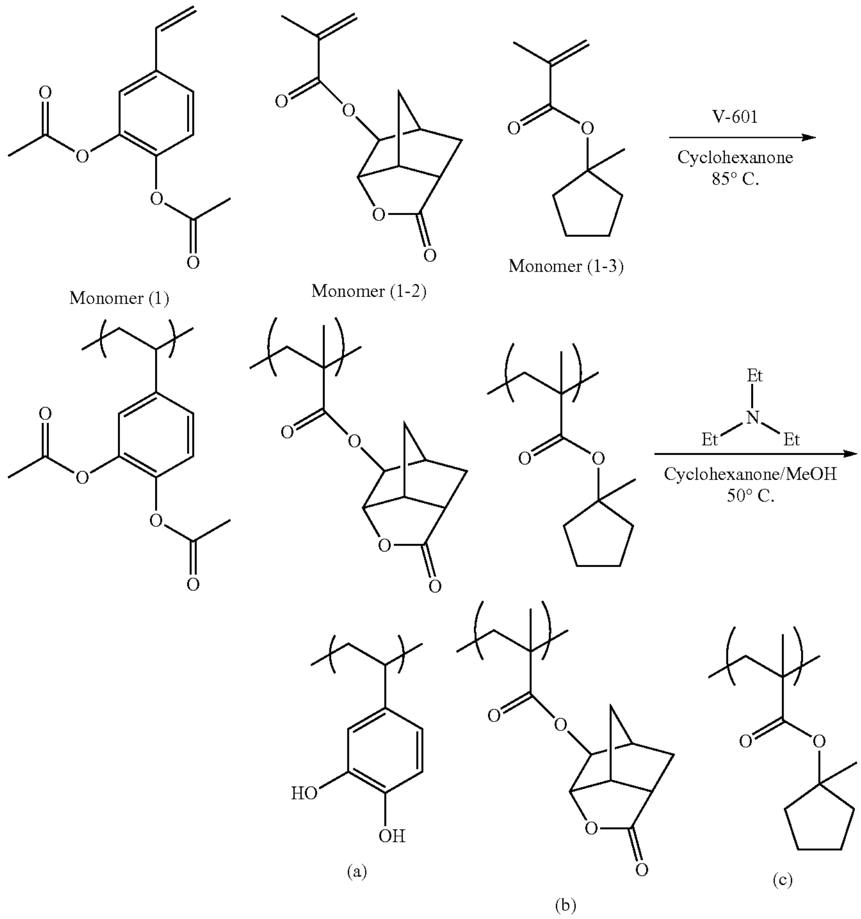

Monomer (1)
Monomer (1-2)
Monomer (1-3)
(a)
(b)
(c)

Acid generating agent as below: 0.23 g

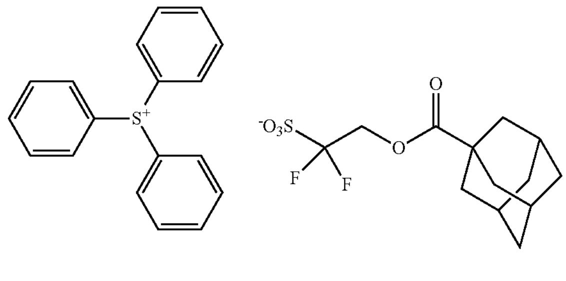

Acid diffusion control agent as below: 0.03 g

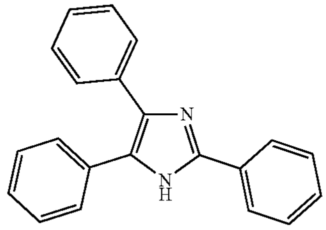 [SMILES: c1ccc(-c2nc(-c3ccccc3)c(-c3ccccc3)[nH]2)cc1]

Solvent:

Propylene glycol monomethyl ether acetate (PGMEA): 60 g

Propylene glycol monomethyl ether (PGME): 15 g

[Evaluation]

[Formation of Resist Pattern (Line and Space Pattern)/EUV Exposure (Solvent Development)]

A silicon wafer was coated with an organic antireflection film forming composition ARC 29 SR (manufactured by Brewer Science, Inc.), was baked at 205° C. for 60 seconds, an antireflection film having a thickness of 86 nm was formed on a silicon wafer, a pre-wet liquid presented in Table 4 below was applied, an actinic ray-sensitive or radiation-sensitive resin composition 1 was applied and baked at 120° C. for 60 seconds, and a resist film having a thickness of 40 nm was formed on a silicon wafer.

Using an EUV exposure device (manufactured by Exitech Ltd., Micro Exposure Tool, NA 0.3, Quadrupole, outer sigma 0.68, inner sigma 0.36), and a silicon wafer having a resist film was subjected to pattern exposure by using an exposure mask (a mask having a space width (width of light transmission part) having line/space=1/1 of 10 nm). After pattern exposure, a silicon wafer having a resist film after exposure was placed on a heated hot plate with the silicon wafer face down and baked at a temperature of 90° for 60 seconds. The resist film after baking was puddle developed with the developer presented in Table 4 below for 30 seconds and then the resist film was rinsed with a rinsing solution in an example in which the content of the rinsing solution was described in the column of a "rinsing solution"

in Table 4 below. The wafer was rotated at a rotation speed of 2,000 rpm for 30 seconds, and then a 1:1 line and space pattern was obtained.

Evaluation was performed for each pattern obtained above. The evaluation method is as follows.

«Evaluation»

After pattern formation, a line pattern upper surface and a space portion were observed by using a length-scanning electron microscope (S9380II manufactured by Hitachi, Ltd.), and it was checked whether a pattern having a line width of 10 nm was formed.

TABLE 4

| | Pre-wet liquid | Developer | Rinsing solution | Evaluation Formation of pattern having line width of 10 nm |
|---|---|---|---|---|
| Example A | Cyclohexanone of Example 16 | Butyl acetate of Example 1 | — | Possible |
| Example B | Unpurified cyclohexanone | Butyl acetate of Example 1 | — | Possible |
| Example D | Cyclohexanone of Example 16 | Butyl acetate of Example 1 | PGMEA of Example 15 | Possible |
| Example E | Cyclohexanone of Example 16 | Butyl acetate of Example 1 | Unpurified PGMEA | Partially possible |
| Example F | Cyclohexanone of Example 16 | Butyl acetate of Comparative Example 3 | PGMEA of Example 15 | Partially possible |
| Example G | Unpurified cyclohexanone | Butyl acetate of Example 1 | PGMEA of Example 15 | Possible |
| Example H | Cyclohexanone of Example 16 | Butyl acetate of Comparative Example 3 | — | Partially possible |
| Comparative Example A | Unpurified cyclohexanone | Butyl acetate of Comparative Example 3 | — | Impossible |
| Comparative Example B | Unpurified cyclohexanone | Butyl acetate of Comparative Example 3 | Unpurified PGMEA | Impossible |

In Table 4, unpurified cyclohexane and unpurified PGMEA were respectively cyclohexanone (special grade reagent) manufactured by Wako Pure Chemical Industries, Ltd. and PGMEA (special grade reagent) manufactured by Wako Pure Chemical Industries, Ltd.

As a result of Table 4, in an example in which the chemical fluid of the example was used as a "pre-wet liquid", a "developer", and a "rinsing solution", defects and the like were decreased, and as a result, there was a tendency in that a pattern having a line width of 10 nm was able to be formed. Meanwhile, in the comparative example in which the chemical fluid of the example was not used, a pattern having a line width of 10 nm was not able to be formed.

What is claimed is:

1. A chemical fluid for manufacturing an electronic material which is stored in a container for storing a chemical fluid for manufacturing an electronic material, wherein after an inspection solution comprising the chemical fluid is charged into the container and stored at 25° C. for 30 days, a sum of a concentration of particulate metal including an iron atom, a concentration of particulate metal including a copper atom, and a concentration of particulate metal including a zinc atom which are measured by a Single Particle ICP-MASS method in the inspection solution is 100 ppt or less.

2. The chemical fluid for manufacturing an electronic material which is stored in the container according to claim 1, wherein, the sum of the concentration of particulate metal including an iron atom, the concentration of particulate metal including a copper atom, and the concentration of particulate metal including a zinc atom which are measured by a Single Particle ICP-MASS method is set as ΣMp, and a concentration of a component including a metal atom of the inspection solution is further measured by an ICP-MASS method, a sum of a concentration of ionic metal including an iron atom, a concentration of ionic metal including a copper atom, and a concentration of ionic metal including a zinc atom which are measured by the Single Particle ICP-MASS method and the ICP-MASS method is set as ΣMi, and ΣMp and ΣMi satisfy the following expression:

$$\Sigma Mp \leq \Sigma Mi \leq 100 \text{ ppt.}$$

3. The chemical fluid for manufacturing an electronic material which is stored in the container according to claim 1, wherein the chemical fluid for manufacturing an electronic material is an actinic ray-sensitive or radiation-sensitive resin composition containing a solvent, a solvent for an actinic ray-sensitive or radiation-sensitive resin composition, a developer, a rinsing solution, a pre-wet liquid, a washing solution, an etching solution, a peeling solution, or a top coat solvent.

4. The chemical fluid for manufacturing an electronic material which is stored in the container according to claim 1, wherein the chemical fluid comprises a developer including an organic solvent, a content of the organic solvent with respect to the developer is 90 mass % to 100 mass %, and a vapor pressure of the developer is 3 kPa or lower at 20° C.

5. The chemical fluid for manufacturing an electronic material which is stored in the container according to claim 1, wherein the chemical fluid comprises at least one organic solvent selected from the group consisting of a ketone-based solvent, an ester-based solvent, an alcohol-based solvent, an amide-based solvent, an ether-based solvent, and a hydrocarbon-based solvent, and the chemical fluid does not comprise an isopropyl alcohol.

6. The chemical fluid for manufacturing an electronic material according to claim 5, wherein the chemical fluid is an organic developer.

7. The chemical fluid for manufacturing an electronic material which is stored in the container according to claim 1, wherein the chemical fluid comprises at least one organic solvent selected from the group consisting of a ketone-based solvent, an ester-based solvent, an amide-based solvent, an ether-based solvent, and a hydrocarbon-based solvent.

8. The chemical fluid for manufacturing an electronic material according to claim 7, wherein the chemical fluid is an organic developer.

9. The chemical fluid for manufacturing an electronic material which is stored in the container according to claim 1, wherein the chemical fluid comprises an alkali aqueous solution including at least one selected from the group consisting of inorganic alkali, primary amine, secondary amine, tertiary amine, alcohol amine, and cyclic amine, and the chemical fluid does not comprise tetramethylammonium hydroxide.

10. The chemical fluid for manufacturing an electronic material according to claim 9, wherein the inorganic alkali is at least one selected from the group consisting of sodium hydroxide, potassium hydroxide, sodium carbonate, sodium silicate, sodium metasilicate, and ammonia water, the primary amine is at least one selected from the group consisting of ethylamine and n-propylamine, the secondary amine is at least one selected from the group consisting of diethylamine and di-n-butylamine, the tertiary amine is at least one selected from the group consisting of triethylamine and methyl diethylamine, the alcohol amine is at least one selected from the group consisting of dimethylethanolamine and triethanol amine, and the cyclic amine is at least one selected from the group consisting of pyrrole and piperidine.

11. The chemical fluid for manufacturing an electronic material according to claim 9, wherein the chemical fluid is an alkali developer.

12. The chemical fluid for manufacturing an electronic material which is stored in the container according to claim 1, wherein the chemical fluid is obtained by a method of manufacturing the chemical fluid for manufacturing an electronic material, the method of manufacturing the chemical fluid for manufacturing an electronic material includes:

selecting a method of reducing particulate metal in the chemical fluid according to a concentration of particulate metal including an iron atom, a concentration of particulate metal including a copper atom, and a concentration of particulate metal including a zinc atom which are measured by a Single Particle ICP-MASS method in the chemical fluid; and reducing at least one of the concentration of particulate metal including an iron atom, the concentration of particulate metal including a copper atom, or the concentration of particulate metal including a zinc atom by using the selected reducing method.

* * * * *